United States Patent
Li et al.

(10) Patent No.: US 11,133,826 B2
(45) Date of Patent: Sep. 28, 2021

(54) QUASI-CYCLIC LDPC CODING AND DECODING METHOD AND APPARATUS, AND LDPC CODER AND DECODER

(71) Applicant: ZTE CORPORATION, Shenzhen (CN)

(72) Inventors: Liguang Li, Shenzhen (CN); Jun Xu, Shenzhen (CN); Jin Xu, Shenzhen (CN)

(73) Assignee: ZTE Corporation, Shenzhen (CN)

( * ) Notice: Subject to any disclaimer, the term of this patent is extended or adjusted under 35 U.S.C. 154(b) by 45 days.

(21) Appl. No.: 16/338,333

(22) PCT Filed: Sep. 30, 2017

(86) PCT No.: PCT/CN2017/104913
§ 371 (c)(1),
(2) Date: Jun. 28, 2019

(87) PCT Pub. No.: WO2018/059588
PCT Pub. Date: Apr. 5, 2018

(65) Prior Publication Data
US 2020/0028523 A1  Jan. 23, 2020

(30) Foreign Application Priority Data
Sep. 30, 2016  (CN) .......................... 201610877960.5

(51) Int. Cl.
*H03M 13/00* (2006.01)
*H03M 13/11* (2006.01)
(Continued)

(52) U.S. Cl.
CPC ..... *H03M 13/1168* (2013.01); *H03M 13/036* (2013.01); *H03M 13/618* (2013.01); *H03M 13/6516* (2013.01); *H04L 1/0003* (2013.01)

(58) Field of Classification Search
None
See application file for complete search history.

(56) References Cited

U.S. PATENT DOCUMENTS

| 8,433,972 B2 | 4/2013 | Yue et al. |
| 2007/0136635 A1 | 6/2007 | Niu et al. |

(Continued)

FOREIGN PATENT DOCUMENTS

| CN | 102064835 A | 5/2011 |
| CN | 102386932 A | 3/2012 |
| CN | 102412842 A | 4/2012 |

OTHER PUBLICATIONS

International Search Report for International Application No. PCT/CN2017/104913; Date of Completion: Nov. 6, 2017; dated Dec. 28, 2017; 2 Pages.
Europeant Patent Office, Extended European Search Report dated Aug. 9, 2019; Corresponding to EP Application No. 17855038.0.
(Continued)

*Primary Examiner* — Guerrier Merant
(74) *Attorney, Agent, or Firm* — Perkins Coie LLP

(57) ABSTRACT

A quasi-cyclic LDPC coding and decoding method and apparatus, and an LDPC coder and decoder. The method includes: determining from a mother basis matrix set a basis matrix used for low density parity check (LDPC) coding (S202), wherein the basis matrix used for LDPC coding includes a first-type element and a second-type element, the first-type element corresponds to an all-zero square matrix, the second-type element corresponds to a matrix obtained by means of a cyclic shift of a unit matrix according to a value of the second-type element, and dimensions of the all-zero square matrix and the unit matrix are equal; and performing LDPC coding on an information sequence to be coded according to the basis matrix used for LDPC coding, and/or performing LDPC decoding on a data sequence to be decoded according to the basis matrix used for LDPC coding (S204).

20 Claims, 8 Drawing Sheets

(51) Int. Cl.
*H03M 13/03* (2006.01)
*H04L 1/00* (2006.01)

(56) References Cited

U.S. PATENT DOCUMENTS

| | | | |
|---|---|---|---|
| 2009/0106625 A1 | 4/2009 | Jun et al. | |
| 2010/0153819 A1* | 6/2010 | Ueng | H03M 13/116 |
| | | | 714/763 |
| 2010/0318872 A1 | 12/2010 | Wang | |
| 2011/0289375 A1 | 11/2011 | Jiang et al. | |
| 2016/0211941 A1* | 7/2016 | Shen | H03M 13/618 |
| 2018/0269900 A1* | 9/2018 | Fan | H04L 1/00 |
| 2019/0181882 A1* | 6/2019 | Blankenship | H03M 13/616 |

OTHER PUBLICATIONS

ZTE Corp et al:"Discussion on LDPC codes for NR", 3GPP Draft, Aug. 13, 2016, HTTP://www.3gpp.org/ftp/tsg_ran/WGI_RL1/TSGR1_86/Docs.

Nokia et al:"LDPC design for eMBB", 3GPP Draft, Aug. 12, 2016, HTTP://www.3gpp.org/ftp/tsg ran/WGI RL1/fSGR1_86/Docs.

Ming Jiang et al:"An improved variable length coding scheme using structured LDPC codes", IEEE International Conference on Wireless Communications and Signal Processing, WCSP 2010, dated Oct. 21, 2010.

Mehdi Karimi et al: Counting Short Cycles of Quasi Cyclic Protograph LDPC Codes, IEEE Comunications Letters, IEEE Service Center, NJ, US, vol. 16, No. 3, dated Mar. 1, 2012.

ZTE:"Consideration on channel coding for NR", 3GPP Draft; R1-167901, Mobile Competence Centre; dated Aug. 21, 2016, http://www.3gpp.org/ftp/Meeting_3GPP_SYNC/RAN1/Docs/.

* cited by examiner

FIG. 6
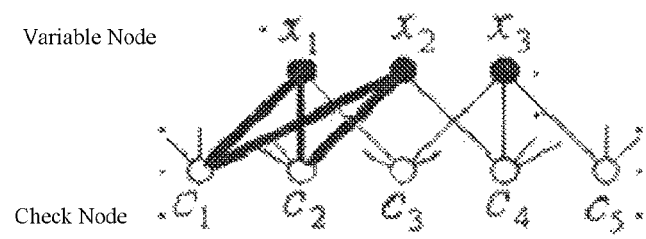
FIG. 7
FIG. 8

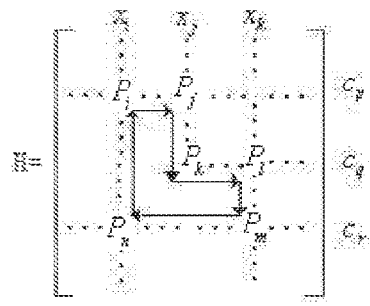
FIG.12
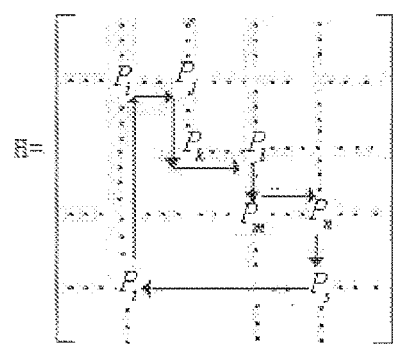
FIG.13
FIG.14

FIG.15

$$H = \begin{bmatrix} 1 & 0 & 0 & 0 & 0 & 1 & 0 & 0 & 1 & 0 & 0 & 0 & 0 & 0 & 0 & 0 \\ 0 & 1 & 0 & 0 & 0 & 0 & 1 & 0 & 0 & 1 & 0 & 0 & 0 & 0 & 0 & 0 \\ 0 & 0 & 1 & 0 & 0 & 0 & 0 & 1 & 0 & 0 & 1 & 0 & 0 & 0 & 0 & 0 \\ 0 & 0 & 0 & 1 & 1 & 0 & 0 & 0 & 0 & 0 & 0 & 1 & 0 & 0 & 0 & 0 \\ 0 & 0 & 1 & 0 & 0 & 1 & 0 & 0 & 0 & 0 & 1 & 0 & 0 & 1 & 0 & 0 \\ 0 & 0 & 0 & 1 & 0 & 0 & 1 & 0 & 0 & 0 & 0 & 1 & 0 & 0 & 1 & 0 \\ 1 & 0 & 0 & 0 & 0 & 0 & 0 & 1 & 1 & 0 & 0 & 0 & 0 & 0 & 0 & 1 \\ 0 & 1 & 0 & 0 & 1 & 0 & 0 & 0 & 0 & 1 & 0 & 0 & 1 & 0 & 0 & 0 \end{bmatrix}$$

FIG. 16

QUASI-CYCLIC LDPC CODING AND DECODING METHOD AND APPARATUS, AND LDPC CODER AND DECODER

CROSS REFERENCE

The present application is a continuing application of International Application No. PCT/CN2017/104913, filed on Sep. 30, 2017, which is based upon and claims priority to Chinese Patent Application No. 201610877960.5, filed on Sep. 30, 2016, and the entire contents thereof are incorporated herein by reference.

TECHNICAL FIELD

The present disclosure relates to the field of communications, and in particular, to a quasi-cyclic LDPC coding and decoding method and apparatus, and a LDPC coder and decoder.

BACKGROUND

FIG. 1 is a structural block diagram of a digital communication system in the related art. As shown in FIG. 1, the digital communication system generally includes three parts: a transmitting end, a channel and a receiving end. The transmitting end may perform channel coding on the information sequence to obtain coding codewords, interleave the coding codewords, map the interleaved bits into modulation symbols, and then process and transmit the modulation symbols according to the communication channel information. In the channel, many factors such as multipath, movement, etc. leads to the specific channel response, which may cause the data transmission distorted, while the data transmission would further be deteriorated due to noise and interference. The receiving end receives the modulation symbol data passing through the channel, which modulation symbol data has been distorted at this time and requires specific processing to recover the original information sequence.

According to a coding method of the transmitting end on the information sequence, the receiving end may correspondingly process on the received data to reliably restore the original information sequence. The coding method must enable that both receiving and transmitting ends are visible. Generally, the coding processing method is based on Forward Error Correction (FEC) coding, wherein FEC coding adds some redundant informations into the information sequence. The receiving end may reliably restore the original information sequence by using the redundant information.

At the transmitting end, it is necessary for the transport block to be transmitted to perform code block segmentation so as to obtain a plurality of small transport blocks, and then to perform FEC coding on the respective small transport block. The length of the transport block to be transmitted is called TBS (Transport Block Size). The code rate of FEC coding is generally defined as a ratio of the number of bits entering the coder to the actual transmitted bits. In the LTE system, a very flexible transport block size may support various packet size requirements of the LTE system, and Modulation and Coding Scheme (MCS) index is used to indicate different modulation orders and code rates R and also determine the TBS index, and then determine different transport block sizes according to the number of resource blocks NRB and the transport block size (TBS) index. The resource block size presents a resource in which a continuous size is 12 subcarriers on 1 time slot with removing the resource remaining by some control signals and reference signals. The channel type may includes a data channel and a control channel, wherein the data channel generally carries a user equipment data, and the control channel carries a contril information including controlling informations such as a MCS index number and a channel information. The bandwidth size generally refers to a bandwidth size allocated by the system for data transmission. The LTE system is divided into 20M, 10M, 5M and other bandwidths. The data transmission direction an uplink data and a downlink data, wherein the uplink data generally refers to a user transmitting data to a base station, and the downlink data refers to a base station transmitting data to a user.

Some conventional FEC codes include convolutional code, Turbo code and Low Density Parity Check (LDPC) code. In the FEC coding process, FEC coding is performed on the information sequence in which the number of bits is k so as to obtain an n-bit FEC coding codeword (in which the number of the redundancy bits is n-k), and FEC coding code rate is k/n. LDPC code is a linear block code defined by a very sparse parity check matrix or bipartite graph, which utilizes sparsity of its check matrix to realize coding and decoding with low complexity, thereby making LDPC to be practical. It could be found from various practices and theoretical proofs that LDPC code is channel code having the most excellent performance under the Additive White Gaussian Noise (AWGN) channel, which performance is very close to the Shannon Limit.

LDPC code has been widely used in IEEE802.11ac, IEEE802.11ad, IEEE802.11aj, IEEE802.16e, IEEE802.11n, microwave communication, optical fiber communication, etc. In the parity check matrix of the LDPC code, each row represents a parity check code. If an element value of a certain index position is equal to 1 in each row, the bit participates in the parity check code, while if it is equal to 0, the position bit does not participate in the parity check code. However, the parity check matrix H of the structured LDPC code is a matrix with M×Z rows and N×Z columns, which is composed of M×N sub-matrices. Each of the sub-matrices is a different power of a basic permutation matrix with a size of Z×Z, which may also be considered as a sub-matrix obtained by cyclically shifting a Z×Z unit matrix for the number of values. At this time, a structured LDPC code may be determined as long as the cyclically shift value and the size of the sub-matrix are known. The structured LDPC code may also be referred to as a quasi-cyclic LDPC code, and the quasi-cyclic LDPC code and the structured LDPC code described herein belong to the same type. All of the shift values constitute an M×N matrix, which may be referred to as a basic check matrix or a basic matrix or a base protograph. The size of the sub-matrix may be an extension factor or a lift size, which is mainly described as an extension factor described herein, which has a consistent meaning. The parity check matrix of the structured LDPC code has the following form:

$$H = \begin{bmatrix} p^{hb}_{11} & p^{hb}_{12} & p^{hb}_{13} & \ldots & p^{hb}_{1N} \\ p^{hb}_{21} & p^{hb}_{22} & p^{hb}_{23} & \ldots & p^{hb}_{2N} \\ \ldots & \ldots & \ldots & & \ldots \\ p^{hb}_{M1} & p^{hb}_{M2} & p^{hb}_{M3} & \ldots & p^{hb}_{MN} \end{bmatrix} = P^{Hb}$$

If $hb_{ij}=-1$, $p^{hb_{ij}}$ is an all-zero matrix with a size of Z×Z; in order to mathematically describe the cyclic shift of the unit matrix more easily, in the above-described structured LDPC code basic check matrix, a basic permutation matrix P with a size of Z×Z is defined herein, so that the cyclic shift of the unit matrix is a corresponding power of the basic permutation matrix P, which basic permutation matrix P is as follows:

$$P = \begin{bmatrix} 0 & 1 & 0 & \ldots & 0 \\ 0 & 0 & 1 & \ldots & 0 \\ \ldots & \ldots & \ldots & \ldots & \ldots \\ 0 & 0 & 0 & \ldots & 1 \\ 1 & 0 & 0 & \ldots & 0 \end{bmatrix}$$

With such a power $hb_{ij}$, each block matrix may be uniquely identified. If a certain block matrix is an all-zero matrix, the matrix is generally represented by −1 or a null value; and if the cyclic shift s of the unit array is obtained, it is equal to s, so that all $hb_{ij}$ may constitute a basic check matrix Hb, and then the basic matrix (or basic check matrix) Hb of the LDPC code may be expressed as follows:

$$Hb = \begin{bmatrix} hb_{11} & hb_{12} & hb_{13} & \ldots & hb_{1N} \\ hb_{21} & hb_{22} & hb_{23} & \ldots & hb_{2N} \\ \ldots & \ldots & \ldots & & \ldots \\ hb_{M1} & hb_{M2} & hb_{M3} & \ldots & hb_{MN} \end{bmatrix}$$

Therefore, the structured LDPC code may be uniquely determined by the basic matrix Hb and the extension factor Z. The basic check matrix includes a plurality of parameters: MB, NB, and KB, where MB is the number of rows of the basic matrix (which may be said as the number of check columns of the basic matrix), NB is the total number of columns of the NB basic matrix, and KB=NB−MB is the number of system columns of the basic matrix.

For example, the base check matrix Hb (2 rows and 4 columns) is as follows and the extension factor z is equal to 4:

$$Hb = \begin{bmatrix} 0 & 1 & 0 & -1 \\ 2 & 1 & 2 & 1 \end{bmatrix}$$

and the parity check matrix is shown in FIG. 16.

The elements in the parity check matrix have only two element values 0 and 1, so that the matrix may be described as a binary matrix; transforming from the basic matrix into the parity check matrix (binary matrix) may be described as: variably extending the basic matrix into the parity check matrix, or variably lifting the basic matrix into the parity check matrix. From the above-mentioned LDPC code parity check matrix, it can be known that the element index in which the first row of the parity check matrix is equal to 1 is [1 6 9], indicating that in the structured LDPC code, the first bit, the sixth bit and the ninth bit constitute a parity check code; similarly, the index equal to 1 in the second row is [2 7 10], and the second bit, the seventh bit, and the tenth bit constitute a parity check code; and so on. It can be known that the LDPC code is actually a codeword piled up by a plurality of parity check codes. The advantage of the structured LDPC code is that only the basic parity check matrix Hb and the extension factor Z are required to be stored, so that the storage is very simple, and the coding/decoding algorithm can utilize its block characteristics, which may simplify the algorithm, such as using hierarchical decoding. However, the bit node positions in each row do not conflict, and pipeline operations may be used, which can reduce decoding delay and decoding complexity and is very simple to implement.

There are many LDPC decoding methods, such as probability domain BP decoding algorithm, log domain BP decoding algorithm and hierarchical minimum and decoding algorithm. The probability domain BP decoding algorithm has the best performance, but its disadvantage is that the amount of computation is very large due to a large number of multiplications involved, so that the required hardware cost is very high, and the dynamic range of the value is not well stable. Therefore, it is generally not used in practical applications. Compared to the probability domain BP decoding algorithm, the log domain BP decoding algorithm reduces many computational units, but still requires a lot of multiplications and the required hardware cost is also quite high. The hierarchical minimum and decoding algorithm transforms the key computation (log operation and multiplication) units of the log domain BP decoding algorithm into minimum and minor minimum values, which greatly reduces the required hardware resources and slightly damage the performance, but may reduce many hardware resources. Therefore, the hierarchical minimum and decoding algorithm is more used in the practical applications. No matter which decoding method is used, iterative decoding is required, wherein the decoding module is mainly divided into two parts: check node update module and variable node update module.

In the LDPC encoding and decoding, in order to ensure excellent performances such as high throughput, high flexibility and low complexity, they are closely related to the designed LDPC code parity check matrix. On the contrary, if the LDPC parity check matrix is not well designed, it may degrade its performance and may also affect complexity and flexibility. Therefore, a concept of short circle girth is introduced in the process of LDPC code design. In order to better understand the concept of girth, the case where the LDPC code basic matrix has a short 4-circle and a short 6-circle to form a girth is introduced herein. In general, the basic matrix needs to be extended into a parity check matrix or a binary matrix. In the parity check matrix, for any two different row indices i and l, and any two different column indices j and k, if among four elements commonly indicated by the row indices i and l and the column indices j and k, the four elements are all equal to 1, then it may be considered that there is a short circle with its length of 4 in the parity check matrix; similarly, in the parity check matrix, for any three different row indices i, l and a, and any three different column indices j, k and b, if among six elements commonly indicated by the row indices i, l and a, and the column indices j, k and b, these 6 elements are equal to 1, it may be considered that there is a short circle with its length of 6 in the parity check matrix; similarly, in the parity check matrix, for any three different row indices i, l, a and c, and any four different column indices i, l, a, and c, if among eight elements commonly indicated by the row indices i, l, a and c and the column indices i, l, a and c, these eight elements are all equal to 1, it may be considered that there is a short circle with its length of 8 in the parity check matrix. There is also a short circle with a girth of 4 as shown in the above-mentioned example, shown as 601 and 602 in FIG. 6. In the basic matrix, it can be considered that the necessary and sufficient condition in which the short 4-circle presents girth=4 in the corresponding parity check matrix is: in the basic matrix, any four elements $[h_{ai}, h_{bi}, h_{bj}, h_{aj}]$ that may constitute 4-circle satisfy:

$$(h_{ai}-h_{bi}+h_{bj}-h_{aj})\%zf==0$$

If zf is an extension factor, the elements at the four positions may lead to appearance of girth=4. In this way, the information is only exchanged between the 4 nodes (2 variable nodes+2 check nodes), and the external information is less as most of the exchanged information comes from its own feedback after multiple iterations, so that the final codeword performance would be worse.

In the corresponding parity check matrix, the necessary and sufficient condition in which the short 6-circle presents girth=6 is: in the basic matrix, any six elements $[h_{ai}, h_{bi}, h_{bj}, h_{cj}, h_{ck}, h_{ak}]$ that may constitute 6-circle satisfy:

$$(h_{ab}-h_{cd}+h_{ef}-h_{ai}+h_{nm}-h_{qw})\% zf=0$$

If zf is an extension factor, the elements at six positions may lead to appearance of girth=6. In this way, most of the information is exchanged between the 6 nodes (3 variable nodes+3 check nodes), and for the same reason as the situation of girth=4, the exchanged external information is less, so that the final codeword performance may be slightly lower. In order to further understand the parity check matrix (also called binary matrix) corresponding to the basic matrix of the LDPC code, a LDPC coding method may be uniquely determined by the basic matrix and the extension factor, and may be extended (or lifted) into the parity check matrix (or binary matrix) by combining the basic matrix and the extension factor. In order to better describe the performance of the girth, there is a one-to-one correspondence between the bipartite graph and the check matrix in the LDPC code. An M*N parity check matrix H defines a constraint that each N-bit codeword satisfies M check parity sets. A bipartite graph includes N variable nodes, each node of which corresponds to one bit in the parity check matrix H; and further includes M parity check nodes, each node of which corresponds to a parity check in H. The check node will be connected to the variable node to be checked; specifically, when the $m^{th}$ check involves the $n^{th}$ bit, i.e. Hm, n=1, there will be a line connected between the check node m and the bit node n. The origin of the name of the bipartite graph is that it includes two types of nodes, i.e., a variable node and a check node. There is no connection between any nodes of the same type. In addition, the total number of edges in the bipartite graph is equal to the number of non-zero elements in the check matrix.

According to the binary image of a certain check matrix shown in FIG. 7, the solid line with black emphasized shows that information bits $x_1$, $x_2$ and check bits $c_1$, $c_2$ constitute a circle with a length of 4. After analyzing FIG. 7, check constraints $c_1$ and $c_2$ cannot be distinguished with respect to the case that $(x_1, x_2)$ is (0, 0) or (1, 1). According to the binary image of a certain check matrix shown in FIG. 8, the solid line with black emphasized shows that information bits $x_1$, $x_2$, $x_3$ and check bits $c_1$, $c_2$, $c_4$ constitute a circle with a length of 6. After analyzing FIG. 8, check constraints $c_1$, $c_2$ and $c_4$ cannot be distinguished with respect to the case that $(x_1, x_2, x_3)$ is (0, 0, 0) or (1, 1, 1). Therefore, the short circle is capable of reducing normal error detection and correction for check constraints.

FIG. 7 illustrates that $x_1$, $x_2$ are correlated by the circle with a length of 4, and FIG. 8 illustrates that $x_1$, $x_2$, $x_3$ are correlated by the circle with a length of 6. The message passing decoding algorithm of the LDPC code assumes that the variable nodes are independent of each other, while the existence of the short circle inevitably destroys the assumption of independence, resulting in a significant degradation on decoding performance. In fact, the short circle such as 4-circle and 6-circle enables variable nodes frequently transmit positive feedback information to themselves during the iterative decoding process. The turbo code is also iteratively decoded, and uses an interleaver to reduce this positive feedback effect. With regard to a Tanner graph with cycle free, the message passing algorithm may lead to optimal decoding, while the existence of the circle makes the message passing algorithm as a sub-optimality iterative decoding algorithm. In fact, the longer the shortest length of circle, the closer the message passing algorithm is to the optimal algorithm.

The short circle is analyzed by the check matrix in the following. FIG. 9 shows a general form of the short circle with a length of 4 presented in the LDPC code check matrix, and the solid line with an arrow clearly shows that variable nodes $x_i$, $x_j$, and check nodes $c_p$, $c_q$ constitute a short circle with a length of 4. In FIG. 9 and FIG. 6, if $x_i=x_1$, $x_j=x_2$, $c_p=c_1$ and $c_q=c_2$, the short circle in the bipartite graph of FIG. 7 may correspond to the short circle in the check matrix one by one. FIG. 9 shows a general form of the short circle with a length of 6 in the LDPC code check matrix, and the solid line with an arrow clearly shows that variable nodes $x_i$, $x_j$, $x_k$ and check nodes $c_p$, $c_q$, $c_r$ constitute a short circle with a length of 6. In FIG. 9 and FIG. 8, if $x_i=x_1$, $x_j=x_2$, $x_k=x_3$, $c_p=c_1$, $c_q=c_2$ and $c_r=c_4$, the short circle in the bipartite graph of FIG. 8 may correspond to the short circle in the check matrix one by one.

In the check matrix, the non-zero element represents an edge interconnecting the check node with a corresponding row number and the variable node with a corresponding column number. The edge connecting two non-zero elements in the check matrix diagram represents one type of connection, and this connection can only be horizontal or vertical, wherein the horizontal edge represents that two variable nodes are connected via a check node. As shown in FIG. 9, variable nodes $x_i$ and $x_j$ are connected via the check node $c_p$. After analyzing, If a distance between two variable nodes is 2, these two variable nodes form a horizontal edge in the check matrix diagram. Similarly, the vertical edge represents that two check nodes are connected via a variable node. It can be seen that if the distance between two check nodes is 2, there is a vertical edge at the corresponding position in the check matrix diagram. In the check matrix diagram, some edges are connected in such a way that a horizontal edge is connected to a vertical edge, and is then connected to another horizontal edgem and then to another vertical edge. If it goes on like this to form a closed path, all horizontal edges are in different rows, and all vertical edges are in different columns, a short circle may be formed in the check matrix, and the length of the formed short circle is determined by the number of non-zero elements contained in the circle. As it is known that the non-zero element corresponds to the true edge in the bipartite graph, and according to characteristics of the check matrix diagram, the number of non-zero elements is exactly equal to the number of edges in the short circle, the length of the short circle is exactly equal to the total number of edges contained in the short circle of the matrix diagram. The circle in FIG. 9 has four non-zero elements, so that the circle has a length of 4 and has 4 edges; in FIG. 10, the circle has six non-zero elements, the circle has a length of 6 and has 6 edges. According to the above description, the circle in the bipartite graph may completely correspond to the circle of the check matrix one by one, so that the circle presented in the bipartite graph may be determined by judging the circle in the check matrix.

In FIG. 9, due to variable nodes $x_i$, $x_j$, 1 (overlap) between two columns in the corresponding check matrix is at least 2. If the overlap of two columns in the check matrix is 0, it means that these two columns are orthogonal to each other with minimal correlation. The larger the overlap is, the greater the correlation between these tow columns is. Therefore, if it appears more frequently that the overlap between two columns of the check matrix is equal to 2, the correlation between columns of the check matrix is necessarily enhanced and thus the rank of the check matrix is reduced, thereby reducing the free distance of the block code determined by the check matrix. In FIG. 10, the short circle with a length of 6 enhances the correlation between three columns, and if the short circle appears more frequently, it could also affect the rank of the check matrix, thereby reducing the free distance and degrading the code performance. In summary, compared with the case without the short circle, the existence of the short circle in the check matrix will enhance the correlation of columns of the check matrix, thereby reducing the rank of the check matrix, reducing the free distance of the code, and reducing the code performance. In fact, the check matrix with a high girth code is more likely to be full rank, wherein the high girth code refers to the LDPC code corresponding to the shortest circle of the bipartite graph with a longer length.

The girth of the bipartite graph, the girth of the node, and the girth of the edge will be explained in the following. In order to quantitatively describe the short circle in the bipartite graph, the related concept of girth is introduced. The girth of the bipartite graph refers to the circle length of the shortest circle in a graph. For example, if a bipartite graph has a circle with a length of 6, 8, 10, 12 and a longer length, the girth of the bipartite graph is 6. In the bipartite graph, the girth of a node u (the girth at node u) refers to the circle length of the shortest circle passing through the node u. For example, there is a circle with a length of 8, 10, 12 and a longer length passing through the node u, the girth of the node u is 8. In the bipartite graph, the girth of an edge e (the girth at node u) is the circle length of the shortest circle passing through the edge e. For example, there is a circle with a length of 8, 10, 12 and a longer length passing through the edge e, the girth of this node u is 8.

The girth of a variable node refers to the length of the shortest path, which is equivalent to the minimum number of iterations for information coming out of this node and back to the node itself. The information associated with this node may be optimally transferred to the remainder of the bipartite graph before the actual number of iterations reaches this minimum number of iterations. The larger the girth of a variable node is, the smaller the positive feedback information that the information sent by the variable node is transferred to itself is, and the better the decoding performance is. Therefore, it is advantageous to make the girth of the variable node as large as possible to improve the code performance. Thus, the principle of constructing a high LDPC code is as follows: firstly, the length (girth) of the shortest circle of the selected code should be as large as possible; secondly, for a code having the same size of girth, the number of shortest circles of the selected code should be as small as possible.

In practical applications, the basic matrix is extended to a parity check matrix, which may also be referred to as an extension matrix or a binary matrix. After analyzing the topology of the check matrix, it can be known that the z×z block matrix in the extension matrix uniquely corresponds to the element of the basic matrix. If some elements in the basic matrix do not constitute a short circle, the block matrix corresponding to these elements could also not constitute a short circle in the extension matrix. Therefore, in order to study the short circle of the extension matrix, it is only necessary to study the extension matrix when a short circle appears in the basic matrix.

As shown in FIG. 11, after analyzing the topology of the check matrix and the bipartite graph, when a short circle with a length of 4 appears in the basic matrix $H_b$, a short circle with a length of 4 or more may appear in the extension matrix H of the $H_b$, which is described as follows: power elements i, j, k, l corresponding to four z×z block matrices $P_i$, $P_j$, $P_k$, $P_l$ constitutes a short circle with a length of 4 in $H_b$, if mod(i−j+k−l, z)=0, $P_i$, $P_j$, $P_k$, $P_l$ constitute a short circle with a length of 4 in H; if mod(i−j+kl, z)=z/2, $P_i$, $P_j$, $P_k$, $P_l$ constitute a short circle with a length of 8 in H. In other cases, $P_i$, $P_j$, $P_k$, $P_l$ constitute a short circle with a length of 12 in H or do not constitute any short circle.

As shown in FIG. 12, after analyzing the topology of the check matrix and the bipartite graph, when a short circle with a length of 6 appears in the basic matrix Hb, a short circle with a length of 6 or more may appear in the extension matrix H of $H_b$, which is described as follows: power elements i, j, k, l, m, n corresponding to six z×z block matrices $P_i$, $P_j$, $P_k$, $P_l$, $P_m$, $P_n$ constitute a short circle with a length of 6 in $H_b$, if mod(i−j+k−l+m−n, z)=0, $P_i$, $P_j$, $P_k$, $P_l$, $P_m$, $P_n$ constitute a short circle with a length of 6 in H; if mod(i−j+k−l+m−n, z)=z/2, $P_i$, $P_j$, $P_k$, $P_l$, $P_m$, $P_n$ constitute a short circle with a length of 10 in H. In other cases, $P_i$, $P_j$, $P_k$, $P_l$, $P_m$, $P_n$ constitute a short circle with a length equal to or larger than 12 in H or do not constitute any short circle.

As shown in FIG. 13, after analyzing the topology of the check matrix and the bipartite graph, when a short circle with a length of 8 appears in the basic matrix $H_b$, a short circle with a length of 8 or more may appear in the extension matrix H of $H_b$, which is described as follows: power elements i, j, k, l, m, n, s, t corresponding to eight z×z block matrices $P_i$, $P_j$, $P_k$, $P_l$, $P_m$, $P_n$, $P_s$, $P_t$ constitute a short circle with a length of 8 in $H_b$; if mod(i−j+k−l+m−n+s−t, z)=0, $P_i$, $P_j$, $P_k$, $P_l$, $P_m$, $P_n$, $P_s$, $P_t$ constitute a short circle with a length of 8 in H; in other cases, $P_i$, $P_j$, $P_k$, $P_l$, $P_m$, $P_n$, $P_s$, $P_t$ constitute a short circle with a length of 12 in H or do not constitute any short circle.

As shown in FIG. 14, the extension matrix, which is a 2×2 basic matrix with Z=4, has a short circle with a length of 4 and a short circle with a length of 8.

Although the structured LDPC code has been applied in a variety of communication standards, it has been found through analysis that code rates and code lengths of various standards are relatively limited, i.e., their flexibilities are relatively poor. For example, in the IEEE 802.11 ad standard, there are only one code length (672) and four code rates (½, ⅝, ¾, 13/16); in the IEEE 802.11n standard, there are only three code length (648, 1296, 1944) and 4 code rates (½, ⅔, ¾, ⅚). It can be found that since the structured LDPC is defined by a partial basic matrix, the disadvantage of these structured LDPC codes in use is that their flexibilities are insufficient, and the flexibility refers to the flexible change of the code rate and the code length. Also, the support of transport blocks may also be flexible. In the new RAT (new Radio Access Technology) system, the channel coding scheme is required to support the flexible code rate and code length, i.e., the variation interval of the code length is at least 8 bits, and the code rate may be flexibly changed.

In view of the lack of flexibility in the LDPC encoding and decoding process in the related art, there is no effective solution currently.

SUMMARY

An embodiment of the present disclosure provides a quasi-cyclic LDPC coding and decoding method and apparatus, and a LDPC coder and decoder, so as to at least solve the problem in the related art that LDPC coding and decoding processes lack flexibility.

According to an embodiment of the present disclosure, a LDPC coding and decoding method is provided, including: determining a basic matrix used for low density parity check LDPC coding from a mother basic matrix set, wherein the basic matrix used for LDPC coding comprises a first-type element corresponding to an all-zero square matrix and a second-type element corresponding to a matrix obtained by means of a cyclic shift of a unit matrix according to a value of the second-type element, and wherein dimensions of the all-zero square matrix and the unit matrix are equal; performing LDPC coding on an information sequence to be coded according to the basis matrix used for LDPC coding, and/or performing LDPC decoding on a data sequence to be decoded according to the basis matrix used for LDPC coding.

Alternatively, determining the basic matrix used for LDPC coding from the mother basic matrix set includes: determining the basic matrix used for LDPC coding according to a preset parameter, wherein the preset parameter comprises at least one of the followings: a transport block size TBS, an application scenario, a user UE type, a frequency band, a code rate R, a combination of the transport block size TBS and the code rate R, a channel type, a data transmission direction, a combination of a TBS index number and the number of resource units NRB, a combination of a modulation and coding scheme MCS index number and the number of resource units NRB, a combination of the code rate R and the number of resource units NRB, a bandwidth size; wherein the transport block size TBS is an integer that is greater than 0; wherein the application scenario includes an enhanced mobile broadband eMBB, an ultra-high reliability and low latency communication URLLC and a massive machine type communication mMTC; wherein the frequency band comprises a system-configured frequency range; wherein the code rate R is a real number which is greater than 0 and less than 1; wherein the channel type comprises a control channel and a data channel; wherein the data transmission direction comprises an uplink data and a downlink data; wherein the TBS index number is used to indicate a corresponding transport block size TBS in combination with the number of resource units, and the TBS index number is an integer that is greater than or equal to 0; wherein the MCS index number is used to indicate an MCS scheme or a combination of a modulation order and a TBS index, and the MCS index number is an integer that is greater than or equal to 0; wherein the number of resource units NRB is the number of system-configured resource blocks; and wherein the bandwidth size is a real number which is greater than 0.

Alternatively, the transport block size TBS is an element in a TBS set TBSSet, wherein the TBS set comprises A1 TBS subsets TBSsubset$_i$, while the mother basic matrix set comprises A1 basic matrix subsets Hb$_i$, each of TBS subsets corresponding to one basic matrix subset; wherein A1 is an integer that is greater than 1, there is no intersection between each two subsets of the A1 TBS subsets, and all of A1 TBS subsets constitute a complete TBS set, where i is an integer between 0 and A1−1; wherein determining the basic matrix used for LDPC coding from the mother basic matrix set comprises: determining the TBS subset TBSsubset$_i$ to which the transport block size TBS belongs, and then determining a basic matrix subset Hb$_i$ corresponding to the TBS subset TBSsubset$_i$.

Alternatively, the method further includes selecting a corresponding basic matrix from the basic matrix subset Hb$_i$ corresponding to the TBS subset TBS subset$_i$ according to the actual code rate or a combination of the transport block size TBS and a LDPC codeword size.

Alternatively, the code rate R is an element in all of code rate set CoderateSet, which comprises A2 code rates Coderate$_i$, where i is an integer between 0 and A2−1, while the mother basic matrix set comprises A2 basic matrix subsets Hb$_i$, each code rate corresponding to one basic matrix subset; wherein all of A2 code rates constitute the whole code rate set CoderateSet, where A2 is an integer that is greater than 1; wherein determining the basic matrix used for LDPC coding from the mother basic matrix set comprises: determining the code rate Coderate$_i$ which is equal to the code rate R, and then determining the basic matrix subset Hb$_i$ corresponding to the code rate Coderate$_i$.

Alternatively, the frequency band is an element in all of frequency band set FBSet which comprises A3 frequency bands, while the mother basic matrix set comprises A3 basic matrix subsets Hb$_i$, each frequency band corresponding to one basic matrix subset; wherein there is no intersection between each two of A3 frequency bands, and all of A3 frequency bands constitute the whole frequency band set FBSet, where A3 is an integer that is greater than 1 and i is an integer between 0 and A3−1; determining the basic matrix used for LDPC coding from the mother basic matrix set comprising: determining an index which belongs to the frequency band set FBSet with frequency bands, and then determining the basic matrix subset Hb$_i$ corresponding to the frequency band.

Alternatively, the mother basic matrix set comprises a basic matrix subset used for data coding and a basic matrix subset used for signaling coding, and wherein determining the basic matrix used for LDPC coding from the mother basic matrix set comprises: determining the channel type, and then determining the basic matrix subset corresponding to the channel type.

Alternatively, the mother basic matrix set comprises a basic matrix subset used for uplink data transmission and a basic matrix subset used for downlink data transmission, and wherein determining the basic matrix used for LDPC coding from the mother basic matrix set comprises: determining the data transmission direction, and then determining the basic matrix subset corresponding to the data transmission direction.

Alternatively, for A2 code rates supported by the mother basic matrix set, each code rate corresponds to one basic matrix subset, and the code rate comprises: R0, R1, . . . , R(A2−1) corresponding to the basic matrix subset Hb0, Hb 1, . . . , Hb (A2−1), respectively, where 0<R0<R1< . . . <R(A2−1)<1; and wherein determining the basic matrix used for LDPC coding comprises: selecting, from [R0, . . . , R(A2−1)], the basic matrix subset corresponding to a code rate greater than or equal to R' and having the smallest difference from R', where R' is the actual code rate and is a real number greater than 0 and less than 1, and A2 is an integer greater than 1.

Alternatively, for A2 code rates supported by the mother basic matrix set, each code rate corresponds to one basic matrix subset, and the code rate comprises: R0, R1, ..., R(A2−1) corresponding to the basic matrix subset Hb0, Hb1, ..., Hb (A2−1), respectively, where 0<R0<R1< ... <R(A2−1)<1; and wherein determining the basic matrix used for LDPC coding comprises: selecting, from [R0, ..., R(A2−1)], the basic matrix subset corresponding to a code rate less than or equal to R' and having the smallest difference from R', where R' is the actual code rate and is a real number greater than 0 and less than 1, and A2 is an integer greater than 1.

Alternatively, the mother basic matrix set comprises A4 basic matrix subsets, and a dimension of the $i^{th}$ basic matrix subset of the A4 basic matrix subsets respectively presents a matrix column number of NBi, a matrix row number of MBi, and a matrix system column number of KBi, where i=0, 1, ..., (A4−1), and wherein MBi is an integer greater than 0, NBi is an integer greater than MBi, where KBi=NBi−MBi, and A4 is an integer greater than 1.

Alternatively, matrix column numbers NBi of A4 basic matrix subsets are equal; and/or matrix row numbers MBi of A4 basic matrix subsets are equal; and/or matrix system column numbers KBi of A4 basic matrix subsets are equal; where i=0, 1, ..., (A4−1).

Alternatively, a column index set Colset composed of all column indices in all the basic matrix subsets comprises a first column index set ColsetX and a second column index set ColsetY between which there is no intersection, and two subsets are not empty, wherein both the first column index set and the second column index set are subsets of Colset, wherein, when a column index j belongs to the first column index set, the second-type element in the $j^{th}$ column of each basic matrix subset belongs to the same set EleSetj, in which the number of second-type elements of EleSetj is less than or equal to a maximum value of a column weight of the $j^{th}$ column of all basic matrix subsets; and when the column index j belongs to the second column index set, the number of second-type elements in an intersection of the $j^{th}$ column of the first basic matrix subset and the $j^{th}$ column of the second basic matrix subset in any two basic matrix subsets is less than or equal to 2, and the number of second-type elements of the $j^{th}$ columns of the first basic matrix subset and the second basic matrix subset is greater than or equal to 3, in which the column weight is the number of second-type elements in the column.

Alternatively, as A4=1, a row index set Rowset composed of all row indices of the basic matrix subset comprises a first row index set RowsetX and a second row index set RowsetY, where j and k are any two elements in the first row index set, and the $j^{th}$ row and the $k^{th}$ row of the basic matrix subset are orthogonal; wherein there is no intersection between the first row index set RowsetX and the second row index set RowsetY, two subsets are not empty, and both the first row index set RowsetX and the second row index set RowsetY are subsets of Rowset; and wherein the $j^{th}$ row and the $k^{th}$ row are orthogonal, so that there is at most one second-type element in any two elements on any column index in the $j^{th}$ row and the $k^{th}$ row.

Alternatively, the mother basic matrix set comprises A4 basic matrix subsets, an extension factor set supported by each basic matrix subset is Zseti, where i=0, 1, ..., (A4−1), and numbers of elements supported by at least 2 extension factor sets are different in the A4 extension factor sets.

Alternatively, in the extension factor set Zseti, the Zseti is a subset of Zset (i+1), where i=0, 1, ..., (A4−2).

Alternatively, in any one of basic matrix subsets of the A4 basic matrices, the number of matrix columns having a column weight greater than 1 is a positive integer that is greater than $2^5−10$ and less than $2^5$.

Alternatively, all of second-type element values in any check column of any one of basic matrix subsets of the mother basic matrix set are equal to 0.

Alternatively, any continuous L1 lines from a $L0^{th}$ row to the last line in any one of basic matrix subsets of the mother basic matrix set are orthogonal, orthogonality of the L1 lines is that there is at most one second-type element value in L1 element values of any column index in L1 lines, where L0 is an integer that is greater than or equal to 0 and less than 5, and L1 is an integer that is greater than 0 and less than 5.

Alternatively, the bipartite graph corresponding to the parity check matrix of any one of basic matrix subsets in the mother basic matrix set at least has a short circle with a girth of 4; a code length corresponding to $i^{th}$ basic matrix of the basic matrix subset is Ni, the number of variable nodes with a girth of 4 corresponding to the code length of Ni is Bi, and the number of variable nodes with a girth of 6 corresponding to the code length of Ni is Ci, where i=0, 1, ..., (s−1), wherein the code length has the following relationship of N0<=N1<= ... <=N(s−1), then B0>=B1>= ... >=B(s−1) and C0<=C1<= ... <=C(s−1); wherein B0, B1, ..., B(s−1), C0, C1, ..., C(s−1) and N0, N1, ..., N(s−1) are integers that are greater than 1, and s is an integer that is greater than or equal to 3.

Alternatively, in any one of basic matrix subset of the mother basic matrix set, a column weight of the basic matrix subset corresponding to the variable node with a girth of 6 is less than or equal to a column weight of the basic matrix subset corresponding to the variable node with a girth of 4.

Alternatively, the number of variable nodes of different code length with a girth of 6 are C0=K0*Z0, C1=K1*Z1, ..., C(s−1)=K(s−1)*Z(s−1), respectively, wherein there is a relationship of Z0<=Z1<= ... <=Z(s−1), then K0<=K1<= ... <=K(s−1); wherein Z0, Z1, ..., and Z(s−1) respectively correspond to extension factors of LDPC codes with code lengths of N0, N1, ..., and N(s−1), and K0, K1 ..., and K(s−1) is an integer that is greater than or equal to 1.

Alternatively, the bipartite graph of the parity check matrix of any one of basic matrix subsets in the mother basic matrix set has at least a short circle with a girth of 6 and does not have a short circle with a girth of 4, a code length corresponding to $i^{th}$ basic matrix of the basic matrix subset is N1, the number of variable nodes with a girth of 6 corresponding to the code length of Ni is Ci, and the number of variable nodes with a girth of 8 corresponding to the code length of Ni is Di, where i=0, 1, ..., (s−1), wherein there is a relationship of N0<=N1<= ... <=N(s−1), then C0>=C1>= ... >=C(s−1), and D0<=D1<= ... <=D(s−1), and wherein C0, C1, ..., C(s−1), D0, D1, ..., D(s−1) and N0, N1, ..., N(s−1) are integers that are greater than 1, and s is an integer that is greater than or equal to 3.

Alternatively, in any one of basic matrix subset of the mother basic matrix set, a column weight of the basic matrix subset corresponding to the variable node with a girth of 8 is less than or equal to a column weight of the basic matrix subset corresponding to the variable node with a girth of 6.

Alternatively, the number of variable nodes of different code length with a girth of 8 are D1=K0*Z0, D1=K1*Z1, ..., D(s−1)=K(s−1)*Z(s−1), respectively, wherein there is a relationship of Z0<=Z1<= ... <=Z(s−1), then K1<=K2<= ... <=Ks; wherein Z0, Z1, ..., and Z(s−1) respectively correspond to extension factors of LDPC codes with code lengths of N0, N1, ..., N(s−1), and K0, K1 ... K(s−1) is an integer that is greater than or equal to 1.

Alternatively, positions of second-type elements of all of the base matrices in any one of the basic matrix subsets of the mother basic matrix set are the same.

Alternatively, code rates supported by all basic matrices in any one of basic matrix subset of the mother basic matrix set are the same.

Alternatively, all basic matrices in any one of basic matrix subset of the mother basic matrix set support different code lengths, the second-type elements in the basic matrices supporting different code lengths are obtained by calculating according to an extension factor and a determined extension factor.

Alternatively, the determined extension factor is an extension factor corresponding to a maximum code length supported by all of the base matrices in any one of the basic matrix subsets of the mother basic matrix set.

Alternatively, any one of the basic matrix subsets of the mother basic matrix set supports various code rates, each of which corresponds to one basic matrix, and two basic matrices corresponding to any two of code rates comprises x first-type elements with different positions; or, any one of the basic matrix subsets of the mother basic matrix set supports various code lengths, each of which corresponds to one basic matrix, and two basic matrices corresponding to any two of code lengths comprises x first-type elements with different positions, where x is an integer that is greater than 0 or less than 10.

Alternatively, the mother basic matrix set comprises a plurality of basic matrix subsets, any one of basic matrix subsets {Hbi} comprises s basic matrices, and all column indices of any one of basic matrices Hbi constitutes a column index set ColSet, wherein the column index set is divided into two subsets Colsubset1 and Colsubset2 which are complementary to each other, Colsubset1 comprises Ci elements, Colsubset2 comprises Di elements, where i is used to indicate one basic matrix Hbi corresponding to one specific code length, and an extension factor corresponding to Hbi is Zi, where i=0, 1, . . . , (s−1), s is an integer that is greater than or equal to 2, and Ci and Di are integers that are greater than or equal to 1.

Alternatively, a basic sub-matrix jointly indicated by all row indices of any one of the basic matrices Hbi and all column indices of Colsubset1 is Hbi(:,Colsubset1), a parity check matrix HL1i is obtained by matrix-extending in combination with the basic sub-matrix Hbi(:,Colsubset1) and an extension factor Zi, which parity check matrix HL1i has a girth of g; a basic sub-matrix jointly indicated by all row indices of the basic matrix Hbi and all column indices of Colsubset2 is Hbi(:,Colsubset2), a parity check matrix HL2i is obtained by matrix-extending in combination with the Hbi(:,Colsubset2) and a lift size Zi, which parity check matrix HL2i has a girth of g−2, all extension factors supported by the basic matrix subset present a relationship of Z1<=Z2<= . . . <=Zs, then D1>=D2>= . . . >=Ds, and C1<=C2<= . . . <=Cs; where g is equal to 6 or 8.

Alternatively, the column index set ColSet may also be divided into a third subset Colsubset3 and a fourth subset Colsubset4 which are complementary to each other, in which the Colsubset1 contains the Colsubset3, the Colsubset4 contains the Colsubset2, the Colsubset3 has Ei elements, and the Colsubset4 has Fi elements, where Ei and Fi are integers than are greater than or equal to 1, wherein any element k of the Colsubset2 and the Colsubset3 constitute a set Colsubset5, wherein a basic sub-matrix jointly indicated by all row indices and all column indices of Colsubset5 is Hbi(:,Colsubset5), a parity check matrix HL3i is obtained by matrix-extending in combination with Hbi(:,Colsubset5) and the extension factor Zi, which parity check matrix HL3i has a girth of 6, where i=0, 1, . . . , (s−1), and wherein all extension factors supported by the basic matrix subset present a relationship of Z1<=Z2<= . . . <=Zs, then F1>=F2>= . . . >=Fs, and E1<=E2<= . . . <=Es.

According to another aspect of the present disclosure, a quasi-cyclic LDPC coding and decoding apparatus is also provided, including: a determination module configured for determining a basic matrix used for low density parity check LDPC coding from a mother basic matrix set, wherein the basic matrix used for LDPC coding comprises a first-type element corresponding to an all-zero square matrix and a second-type element corresponding to a matrix obtained by means of a cyclic shift of a unit matrix according to a value of the second-type element, and wherein dimensions of the all-zero square matrix and the unit matrix are equal; a coding and decoding module configured for performing LDPC coding on an information sequence to be coded according to the basis matrix used for LDPC coding, and/or performing LDPC decoding on a data sequence to be decoded according to the basis matrix used for LDPC coding.

Alternatively, the determination module is configured for: determining the basic matrix used for LDPC coding according to a preset parameter, wherein the preset parameter comprises at least one of the followings: a transport block size TBS, an application scenario, a user UE type, a frequency band, a code rate R, a combination of the transport block size TBS and the code rate R, a channel type, a data transmission direction, a combination of a TBS index number and the number of resource units NRB, a combination of a modulation and coding scheme MCS index number and the number of resource units NRB, a combination of the code rate R and the number of resource units NRB, a bandwidth size; wherein the transport block size TBS is an integer that is greater than 0; wherein the application scenario comprises an enhanced mobile broadband eMBB, an ultra-high reliability and low latency communication URLLC and a massive machine type communication mMTC; wherein the frequency band comprises a system-configured frequency range; wherein the code rate R is a real number which is greater than 0 and less than 1; wherein the channel type comprises a control channel and a data channel; wherein the data transmission direction comprises an uplink data and a downlink data; wherein the TBS index number is used to indicate a corresponding transport block size TBS in combination with the number of resource units, and the TBS index number is an integer that is greater than or equal to 0; wherein the MCS index number is used to indicate an MCS scheme or a combination of a modulation order and a TBS index, and the MCS index number is an integer that is greater than or equal to 0; wherein the number of resource units NRB is the number of system-configured resource blocks; and wherein the bandwidth size is a real number which is greater than 0.

Alternatively, the transport block size TBS is an element in a TBS set TBSSet, wherein the TBS set comprises A1 TBS subsets TBSsubset$_i$, while the mother basic matrix set comprises A1 basic matrix subsets Hb$_i$, each of TBS subsets corresponding to one basic matrix subset; wherein A1 is an integer that is greater than 1, there is no intersection between each two subsets of the A1 TBS subsets, and all of A1 TBS subsets constitute a complete TBS set, where i is an integer between 0 and A1−1; the determination module is configured for: determining the TBS subset TBSsubset$_i$ to which the transport block size TBS belongs, and then determining a basic matrix subset Hb$_i$ corresponding to the TBS subset TBSsubset$_i$.

Alternatively, according to the actual code rate or a combination of the transport block size TBS and a LDPC codeword size, a corresponding basic matrix is selected from the basic matrix subset $Hb_i$ corresponding to the TBS subset $TBS subset_i$.

Alternatively, the code rate R is an element in a code rate set CoderateSet, which comprises A2 code rates $Coderate_i$, where i is an integer between 0 and A2-1, while the mother basic matrix set comprises A2 basic matrix subsets $Hb_i$, each code rate corresponding to one basic matrix subset; wherein all of A2 code rates constitute the whole code rate set CoderateSet, where A2 is an integer that is greater than 1; wherein determining the basic matrix used for LDPC coding from the mother basic matrix set comprises: determining the code rate $Coderate_i$ which is equal to the code rate R, and then determining the basic matrix subset $Hb_i$ corresponding to the code rate $Coderate_i$.

Alternatively, the frequency band is an element in a frequency band set FBSet which comprises A3 frequency bands, while the mother basic matrix set comprises A3 basic matrix subsets $Hb_i$, each frequency band corresponding to one basic matrix subset; wherein there is no intersection between each two of A3 frequency bands, and all of A3 frequency bands constitute the whole frequency band set FBSet, where A3 is an integer that is greater than 1 and i is an integer between 0 and A3-1; determining the basic matrix used for LDPC coding from the mother basic matrix set comprising: determining an index which belongs to the frequency band set FBSet with frequency bands, and then determining the basic matrix subset $Hb_i$ corresponding to the frequency band.

Alternatively, the mother basic matrix set comprises a basic matrix subset used for data coding and a basic matrix subset used for signaling coding, and wherein determining the basic matrix used for LDPC coding from the mother basic matrix set comprises: determining the channel type, and then determining the basic matrix subset corresponding to the channel type.

Alternatively, the mother basic matrix set comprises a basic matrix subset used for uplink data transmission and a basic matrix subset used for downlink data transmission, and wherein determining the basic matrix used for LDPC coding from the mother basic matrix set comprises: determining the data transmission direction, and then determining the basic matrix subset corresponding to the data transmission direction.

Alternatively, for A2 code rates supported by the mother basic matrix set, each code rate corresponds to one basic matrix subset, and the code rate comprises: R0, R1, ..., R(A2-1) corresponding to the basic matrix subset Hb0, Hb 1, ..., Hb (A2-1), respectively, where $0<R0<R1<...<R(A2-1)<1$; and wherein determining the basic matrix used for LDPC coding comprises: selecting, from [R0, ..., R(A2-1)], the basic matrix subset corresponding to a code rate greater than or equal to R' and having the smallest difference from R', where R' is the actual code rate and is a real number greater than 0 and less than 1, and A2 is an integer greater than 1.

Alternatively, for A2 code rates supported by the mother basic matrix set, each code rate corresponds to one basic matrix subset, and the code rate comprises: R0, R1, ..., R(A2-1) corresponding to the basic matrix subset Hb0, Hb 1, ..., Hb (A2-1), respectively, where $0<R0<R1<...<R(A2-1)<1$; and wherein determining the basic matrix used for LDPC coding comprises: selecting, from [ R0, ..., R(A2-1)], the basic matrix subset corresponding to a code rate less than or equal to R' and having the smallest difference from R', where R' is the actual code rate and is a real number greater than 0 and less than 1, and A2 is an integer greater than 1.

Alternatively, the mother basic matrix set comprises A4 basic matrix subsets, and a dimension of the $i^{th}$ basic matrix subset of the A4 basic matrix subsets respectively presents a matrix column number of NBi, a matrix row number of MBi, and a matrix system column number of KBi, where i=0, 1, ..., (A4-1), and wherein MBi is an integer greater than 0, NBi is an integer greater than MBi, where KBi=NBi−MBi, and A4 is an integer greater than 1.

Alternatively, matrix column numbers NBi of A4 basic matrix subsets are equal; and/or matrix row numbers MBi of A4 basic matrix subsets are equal; and/or matrix system column numbers KBi of A4 basic matrix subsets are equal; where i=0, 1, ..., (A4-1).

Alternatively, a column index set Colset composed of all column indices in all the basic matrix subsets comprises a first column index set ColsetX and a second column index set ColsetY between which there is no intersection, and two subsets are not empty, wherein both the first column index set and the second column index set are subsets of Colset, wherein, when a column index j belongs to the first column index set, the second-type element in the $j^{th}$ column of each basic matrix subset belongs to the same set EleSetj, in which the number of second-type elements of EleSetj is less than or equal to a maximum value of a column weight of the $j^{th}$ column of all basic matrix subsets; and when the column index j belongs to the second column index set, the number of second-type elements in an intersection of the $j^{th}$ column of the first basic matrix subset and the $j^{th}$ column of the second basic matrix subset in any two basic matrix subsets is less than or equal to 2, and the number of second-type elements of the $j^{th}$ columns of the first basic matrix subset and the second basic matrix subset is greater than or equal to 3, in which the column weight is the number of second-type elements in the column.

Alternatively, as A4=1, a row index set Rowset composed of all row indices of the basic matrix subset comprises a first row index set RowsetX and a second row index set RowsetY, where j and k are any two elements in the first row index set, and the $j^{th}$ row and the $k^{th}$ row of the basic matrix subset are orthogonal; wherein there is no intersection between the first row index set RowsetX and the second row index set RowsetY, two subsets are not empty, and both the first row index set RowsetX and the second row index set RowsetY are subsets of Rowset; and wherein the $j^{th}$ row and the $k^{th}$ row are orthogonal, so that there is at most one second-type element in any two elements on any column index in the $j^{th}$ row and the $k^{th}$ row.

Alternatively, the mother basic matrix set comprises A4 basic matrix subsets, an extension factor set supported by each basic matrix subset is Zseti, where i=0, 1, ..., (A4-1), and numbers of elements supported by at least 2 extension factor sets are different in the A4 extension factor sets.

Alternatively, in the extension factor set Zseti, the Zseti is a subset of Zset (i+1), where i=0, 1, ..., (A4-2).

Alternatively, in any one of basic matrix subsets of the A4 basic matrices, the number of matrix columns having a column weight greater than 1 is a positive integer that is greater than $2^5-10$ and less than $2^5$.

Alternatively, all of second-type element values in any check column of any one of basic matrix subsets of the mother basic matrix set are equal to 0.

Alternatively, any continuous L1 lines from a $L0^{th}$ row to the last line in any one of basic matrix subsets of the mother basic matrix set are orthogonal, orthogonality of the L1 lines is that there is at most one second-type element value in L1 element values of any column index in L1 lines, where L0 is an integer that is greater than or equal to 0 and less than 5, and L1 is an integer that is greater than 0 and less than 5.

Alternatively, the bipartite graph corresponding to the parity check matrix of any one of basic matrix subsets in the mother basic matrix set at least has a short circle with a girth of 4; a code length corresponding to $i^{th}$ basic matrix of the basic matrix subset is N1, the number of variable nodes with a girth of 4 corresponding to the code length of Ni is Bi, and the number of variable nodes with a girth of 6 corresponding to the code length of Ni is Ci, where i=0, 1, . . . , (s−1), wherein the code length has the following relationship of $N0 \leq N1 \leq \ldots \leq N(s-1)$, then $B0 \geq B1 \geq \ldots \geq B(s-1)$ and $C0 \leq C1 \leq \ldots \leq C(s-1)$; wherein B0, B1, . . . , B(s−1), C0, C1, . . . , C(s−1) and N0, N1, . . . , N(s−1) are integers that are greater than 1, and s is an integer that is greater than or equal to 3.

Alternatively, in any one of basic matrix subset of the mother basic matrix set, a column weight of the basic matrix subset corresponding to the variable node with a girth of 6 is less than or equal to a column weight of the basic matrix subset corresponding to the variable node with a girth of 4.

Alternatively, the number of variable nodes of different code length with a girth of 6 are C0=K0*Z0, C1=K1*Z1, . . . , C(s−1)=K(s−1)*Z(s−1), respectively, wherein there is a relationship of $Z0 \leq Z1 \leq \ldots \leq Z(s-1)$, then $K0 \leq K1 \leq \ldots \leq K(s-1)$; wherein Z0, Z1, . . . , and Z(s−1) respectively correspond to extension factors of LDPC codes with code lengths of N0, N1, . . . , and N(s−1), and K0, K1 . . . , and K(s−1) is an integer that is greater than or equal to 1.

Alternatively, the bipartite graph of the parity check matrix of any one of basic matrix subsets in the mother basic matrix set has at least a short circle with a girth of 6 and does not have a short circle with a girth of 4, a code length corresponding to $i^{th}$ basic matrix of the basic matrix subset is N1, the number of variable nodes with a girth of 6 corresponding to the code length of Ni is Ci, and the number of variable nodes with a girth of 8 corresponding to the code length of Ni is Di, where i=0, 1, . . . , (s−1), wherein there is a relationship of $N0 \leq N1 \leq \ldots \leq N(s-1)$, then $C0 \geq C1 \geq \ldots \geq C(s-1)$, and $D0 \leq D1 \leq \ldots \leq D(s-1)$, and wherein C0, C1, . . . , C(s−1), D0, D1, . . . , D(s−1) and N0, N1, . . . , N(s−1) are integers that are greater than 1, and s is an integer that is greater than or equal to 3.

Alternatively, in any one of basic matrix subset of the mother basic matrix set, a column weight of the basic matrix subset corresponding to the variable node with a girth of 8 is less than or equal to a column weight of the basic matrix subset corresponding to the variable node with a girth of 6.

Alternatively, the number of variable nodes of different code length with a girth of 8 are D1=K0*Z0, D1=K1*Z1, . . . , D(s−1)=K(s−1)*Z(s−1), respectively, wherein there is a relationship of $Z0 \leq Z1 \leq \ldots \leq Z(s-1)$, then $K1 \leq K2 \leq \ldots \leq Ks$; wherein Z0, Z1, . . . , and Z(s−1) respectively correspond to extension factors of LDPC codes with code lengths of N0, N1, . . . , N(s−1), and K0, K1 . . . K(s−1) is an integer that is greater than or equal to 1.

Alternatively, positions of second-type elements of all of the base matrices in any one of the basic matrix subsets of the mother basic matrix set are the same.

Alternatively, code rates supported by all basic matrices in any one of basic matrix subset of the mother basic matrix set are the same.

Alternatively, all basic matrices in any one of basic matrix subset of the mother basic matrix set support different code lengths, the second-type elements in the basic matrices supporting different code lengths are obtained by calculating according to an extension factor and a determined extension factor.

Alternatively, the determined extension factor is an extension factor corresponding to a maximum code length supported by all of the base matrices in any one of the basic matrix subsets of the mother basic matrix set.

Alternatively, any one of the basic matrix subsets of the mother basic matrix set supports various code rates, each of which corresponds to one basic matrix, and two basic matrices corresponding to any two of code rates comprises x first-type elements with different positions; or, any one of the basic matrix subsets of the mother basic matrix set supports various code lengths, each of which corresponds to one basic matrix, and two basic matrices corresponding to any two of code lengths comprises x first-type elements with different positions, where x is an integer that is greater than 0 or less than 10.

Alternatively, the mother basic matrix set comprises a plurality of basic matrix subsets, any one of basic matrix subsets {Hbi} comprises s basic matrices, and all column indices of any one of basic matrices Hbi constitutes a column index set ColSet, wherein the column index set is divided into two subsets Colsubset1 and Colsubset2 which are complementary to each other, Colsubset1 comprises Ci elements, Colsubset2 comprises Di elements, where i is used to indicate one basic matrix Hbi corresponding to one specific code length, and an extension factor corresponding to Hbi is Zi, where i=0, 1, . . . , (s−1), s is an integer that is greater than or equal to 2, and Ci and Di are integers that are greater than or equal to 1.

Alternatively, a basic sub-matrix jointly indicated by all row indices of any one of the basic matrices Hbi and all column indices of Colsubset1 is Hbi(:,Colsubset1), a parity check matrix HL1i is obtained by matrix-extending in combination with the basic sub-matrix Hbi(:,Colsubset1) and an extension factor Zi, which parity check matrix HL1i has a girth of g; a basic sub-matrix jointly indicated by all row indices of the basic matrix Hbi and all column indices of Colsubset2 is Hbi(:,Colsubset2), a parity check matrix HL2i is obtained by matrix-extending in combination with the Hbi(:,Colsubset2) and a lift size Zi, which parity check matrix HL2i has a girth of g−2, all extension factors supported by the basic matrix subset present a relationship of $Z1 \leq Z2 \leq \ldots \leq Zs$, then $D1 \geq D2 \geq \ldots \geq Ds$, and $C1 \leq C2 \leq \ldots \leq Cs$; where g is equal to 6 or 8.

Alternatively, the column index set ColSet may also be divided into a third subset Colsubset3 and a fourth subset Colsubset4 which are complementary to each other, in which the Colsubset1 contains the Colsubset3, the Colsubset4 contains the Colsubset2, the Colsubset3 has Ei elements, and the Colsubset4 has Fi elements, where Ei and Fi are integers than are greater than or equal to 1, wherein any element k of the Colsubset2 and the Colsubset3 constitute a set Colsubset5, wherein a basic sub-matrix jointly indicated by all row indices and all column indices of Colsubset5 is Hbi(:,Colsubset5), a parity check matrix HL3i is obtained by matrix-extending in combination with Hbi(:,Colsubset5) and the extension factor Zi, which parity check matrix HL3i has a girth of 6, where i=0, 1, . . . , (s−1), and wherein all extension factors supported by the basic matrix subset present a relationship of $Z1 \leq Z2 \leq \ldots \leq Zs$, then $F1 \geq F2 \geq \ldots \geq Fs$, and $E1 \leq E2 \leq \ldots \leq Es$.

According to another aspect of the present disclosure, a quasi-cyclic LDPC coder and decoder is also provided, including: a processing chip for determining a basic matrix used for low density parity check LDPC coding from a mother basic matrix set, wherein the basic matrix used for LDPC coding comprises a first-type element corresponding to an all-zero square matrix and a second-type element corresponding to a matrix obtained by means of a cyclic shift of a unit matrix according to a value of the second-type element, and wherein dimensions of the all-zero square matrix and the unit matrix are equal, the mother basic matrix set at least comprises one basic matrix; a coder for performing LDPC coding on an information sequence to be coded according to the basis matrix used for LDPC coding; and/or a decoder for performing LDPC decoding on a data sequence to be decoded according to the basis matrix used for LDPC coding.

Alternatively, the processing chip is configured for: determining the basic matrix used for LDPC coding according to a preset parameter, wherein the preset parameter comprises at least one of the followings: a transport block size TBS, an application scenario, a user UE type, a frequency band, a code rate R, a combination of the transport block size TBS and the code rate R, a channel type, a data transmission direction, a combination of a TBS index number and the number of resource units NRB, a combination of a modulation and coding scheme MCS index number and the number of resource units NRB, a combination of the code rate R and the number of resource units NRB, a bandwidth size; wherein the transport block size TBS is an integer that is greater than 0; wherein the application scenario comprises an enhanced mobile broadband eMBB, an ultra-high reliability and low latency communication URLLC and a massive machine type communication mMTC; wherein the frequency band comprises a system-configured frequency range; wherein the code rate R is a real number which is greater than 0 and less than 1; wherein the channel type comprises a control channel and a data channel; wherein the data transmission direction comprises an uplink data and a downlink data; wherein the TBS index number is used to indicate a corresponding transport block size TBS in combination with the number of resource units, and the TBS index number is an integer that is greater than or equal to 0; wherein the MCS index number is used to indicate an MCS scheme or a combination of a modulation order and a TBS index, and the MCS index number is an integer that is greater than or equal to 0; wherein the number of resource units NRB is the number of system-configured resource blocks; and wherein the bandwidth size is a real number which is greater than 0.

According to a further aspect of the present disclosure, a storage medium is also provided. The storage medium may store an execution instruction, which is used to perform the quasi-cyclic LDPC coding and decoding method in the above embodiments.

By the present disclosure: determining a basic matrix used for LDPC coding from a mother basic matrix set, wherein the basic matrix used for LDPC coding includes a first-type element corresponding to an all-zero square matrix and a second-type element corresponding to a matrix obtained by means of a cyclic shift of a unit matrix according to a value of the second-type element, and wherein dimensions of the all-zero square matrix and the unit matrix are equal; performing LDPC coding on an information sequence to be coded according to the basis matrix used for LDPC coding, and/or performing LDPC decoding on a data sequence to be decoded according to the basis matrix used for LDPC coding, it can be seen that the basic matrix used for LDPC coding is determined from the mother basic matrix set by using the above scheme, wherein an element of the basic matrix used for LDPC coding is divided into a first-type element and a second-type element, and the first-type element and the second-type element respectively has a corresponding matrix. Then, the coding and decoding is performed according to the basic matrix used for LDPC coding, so that LDPC coding and decoding may support a flexible code length and code rate to improve the flexibility of the LDPC coding and decoding process, thereby solving the problem in the related art that LDPC coding and decoding processes lack flexibility.

BRIEF DESCRIPTION OF THE DRAWINGS

The drawings described herein are used to provide a further understanding of the present disclosure and constitute part of the present application. Exemplary embodiments of the present disclosure and their descriptions are intended to interpret the present disclosure and do not constitute limitation of the present disclosure. In the drawing:

FIG. 6 is a schematic diagram of a parity check matrix with a girth of 4 corresponding to a basic matrix according to the related art;

FIG. 7 is a first schematic diagram of a segment of a bipartite graph of a check matrix according to an alternative embodiment of the present disclosure;

FIG. 8 is a second schematic diagram of a segment of a bipartite graph of a check matrix according to an alternative embodiment of the present disclosure;

FIG. 12 is a schematic diagram of a cyclic shift matrix having six unit matrices to constitute a short circle with a length of 6 in H according to an alternative embodiment of the present disclosure;

FIG. 13 is a schematic diagram of a cyclic shift matrix having eight unit matrices to constitute a short circle with a length of 8 in H according to an alternative embodiment of the present disclosure;

FIG. 14 is a schematic diagram of an extension matrix of a 2×2 basic matrix with z=4, having a short circle with a length of 4 and a short circle with a length of 8, according to an alternative embodiment of the present disclosure;

FIG. 15 is a schematic diagram of an extension factor set for girths of respective variables according to an alternative embodiment of the present disclosure.

FIG. 16 is an example of a parity check matrix.

DETAILED DESCRIPTION

The present disclosure will be described in detail below with reference to the accompanying drawings in combination with embodiments. It should be noted that the embodiments in the present application and the features in the embodiments may be combined with each other without conflict.

It should be understood that the terms "first", "second", and the like in the description and claims of the present disclosure are used to distinguish similar objects, and are not necessarily used to describe a particular order or a precedence order.

First Embodiment

Figure 1:
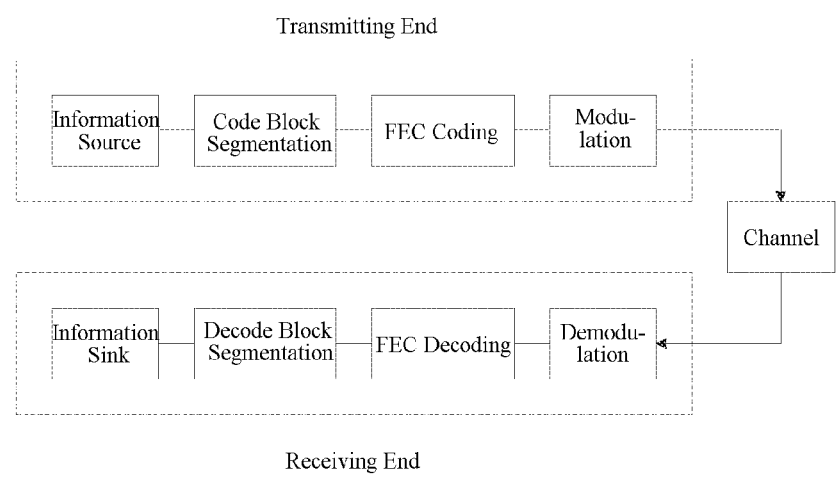
FIG. 1 is a structural block diagram showing a digital communication system according to the related art.
Figure 2:
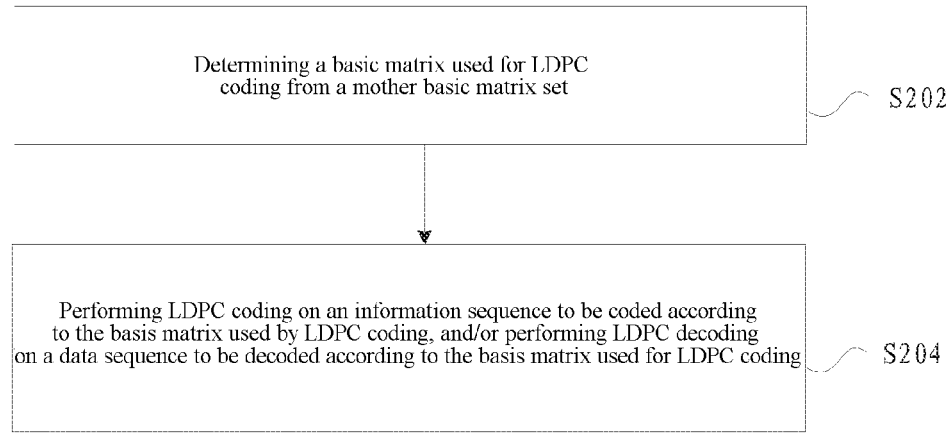
FIG. 2 is a flow chart of a LDPC coding and decoding method according to an embodiment of the present disclosure.

The present embodiment provides a quasi-cyclic LDPC coding and decoding method, and FIG. 2 is a flow chart of a LDPC coding and decoding method according to an embodiment of the present disclosure. As shown in FIG. 2, the flow includes the following steps:

Step S202: determining a basic matrix used for low density parity check (LDPC) coding from a mother basic matrix set, wherein the basic matrix used for LDPC coding comprises a first-type element corresponding to an all-zero square matrix and a second-type element corresponding to a matrix obtained by means of a cyclic shift of a unit matrix according to a value of the second-type element, and wherein dimensions of the all-zero square matrix and the unit matrix are equal;

Step S204, performing LDPC coding on an information sequence to be coded according to the basis matrix used for LDPC coding, and/or performing LDPC decoding on a data sequence to be decoded according to the basis matrix used for LDPC coding.

By the above steps: determining a basic matrix used for LDPC coding from a mother basic matrix set, wherein the basic matrix used for LDPC coding includes a first-type element corresponding to an all-zero square matrix and a second-type element corresponding to a matrix obtained by means of a cyclic shift of a unit matrix according to a value of the second-type element, and wherein dimensions of the all-zero square matrix and the unit matrix are equal; performing LDPC coding on an information sequence to be coded according to the basis matrix used for LDPC coding, and/or performing LDPC decoding on a data sequence to be decoded according to the basis matrix used for LDPC coding, it can be seen that the basic matrix used for LDPC coding is determined from the mother basic matrix set by using the above scheme, wherein an element of the basic matrix used for LDPC coding is divided into a first-type element and a second-type element, and the first-type element and the second-type element respectively has a corresponding matrix. Then, the coding and decoding is performed according to the basic matrix used for LDPC coding, so that LDPC coding and decoding may support a flexible code length and code rate to improve the flexibility of the LDPC coding and decoding process, thereby solving the problem in the related art that LDPC coding and decoding processes lack flexibility.

Alternatively, in the step S202, the basic matrix used for LDPC coding maybe determined according to a preset parameter, which will not be limited thereto. The preset parameter includes at least one of the followings: a transport block size TBS, an application scenario, a user UE type, a frequency band, a code rate R, a combination of the transport block size TBS and the code rate R, channel type, a data transmission direction, a combination of a TBS index number and the number of resource units NRB, a combination of a modulation and coding scheme MCS index number and the number of resource units NRB, a combination of the code rate R and the number of resource units NRB, a bandwidth size.

In the present embodiment, the transport block size TBS is an integer that is greater than 0. The application scenario includes an enhanced mobile broadband eMBB, a ultra-high reliability and low latency communication URLLC and a massive machine type communication mMTC. The frequency band includes a system-configured frequency range. The code rate R is a real number which is greater than 0 and less than 1. The channel type includes a control channel and a data channel. The data transmission direction includes an uplink data and a downlink data. The TBS index number is used to indicate a corresponding transport block size TBS in combination with the number of resource units, and the TBS index number is an integer that is greater than or equal to 0. The MCS index number is used to indicate an MCS scheme or a combination of a modulation order and a TBS index, and the MCS index number is an integer that is greater than or equal to 0. The number of resource units NRB is the number of system-configured resource blocks. The bandwidth size is a real number which is greater than 0.

Alternatively, the transport block size TBS is an element in a TBS set TBSSet. The TBS set includes A1 TBS subsets TBSsubset$_i$, while the mother basic matrix set includes A1 basic matrix subsets Hb$_i$. Each of TBS subsets corresponds to one basic matrix subset, and A1 is an integer that is greater than 1. There is no intersection between each two subsets of the A1 TBS subsets, and all of A1 TBS subsets constitute a complete TBS set, where i is an integer between 0 and A1−1. In the above step S202, the TBS subset TBSsubset$_i$ to which the transport block size TBS belongs is determined, and then a basic matrix subset Hb$_i$ corresponding to the TBS subset TBSsubset$_i$ is determined.

Alternatively, a corresponding basic matrix is selected from the basic matrix subset Hb$_i$ corresponding to the TBS subset TBSsubset$_i$ according to the actual code rate or a combination of the transport block size TBS and a LDPC codeword size.

Alternatively, the code rate R is an element in a code rate set CoderateSet, which includes A2 code rates Coderate$_i$, where i is an integer between 0 and A2−1. Also, the mother basic matrix set includes A2 basic matrix subsets Hb$_i$, and each code rate corresponds to one basic matrix subset. All of A2 code rates constitute the whole code rate set CoderateSet, where A2 is an integer that is greater than 1. In the above step S202, the code rate Coderate$_i$ is determined which is equal to the code rate R, and then the basic matrix subset Hb$_i$ corresponding to the code rate Coderate$_i$ is determined.

Alternatively, the frequency band is an element in a frequency band set FBSet which includes A3 frequency bands. Also, the mother basic matrix set includes A3 basic matrix subsets Hb$_i$, and each frequency band corresponds to one basic matrix subset. There is no intersection between each two of A3 frequency bands, and all of A3 frequency bands constitute the whole frequency band set FBSet, where A3 is an integer that is greater than 1 and i is an integer between 0 and A3−1. In the above step S202, an index which belongs to the frequency band set FBSet with frequency bands is determined, and then the basic matrix subset $Hb_i$ corresponding to the frequency band is determined.

Alternatively, the mother basic matrix set includes a basic matrix subset used for data coding and a basic matrix subset used for signaling coding. Determining the basic matrix used for LDPC coding from the mother basic matrix set includes: determining the channel type, and then determining the basic matrix subset corresponding to the channel type.

Alternatively, the mother basic matrix set includes: a basic matrix subset used for uplink data transmission and a basic matrix subset used for downlink data transmission. In the above step S202, the data transmission direction is determined, and then the basic matrix subset corresponding to the data transmission direction is determined.

Alternatively, for A2 code rates supported by the mother basic matrix set, each code rate corresponds to one basic matrix subset, and the code rate includes: R0, R1, ..., R(A2−1) corresponding to the basic matrix subset Hb0, Hb 1, ..., Hb (A2−1), respectively, where 0<R0<R1< ... <R(A2−1)<1. Determining the basic matrix used for LDPC coding includes: selecting, from [R0, ..., R(A2−1)], the basic matrix subset corresponding to a code rate greater than or equal to R' and having the smallest difference from R', where R' is the actual code rate and is a real number greater than 0 and less than 1, and A2 is an integer greater than 1. The basic matrix subset is used to perform shortening coding, i.e., part of dummy bits are added in the information sequence to be encoded before coding, and the dummy codeword bits are not transmitted, so as to ensure that the coding rate is constant (i.e., equal to the actual code rate).

Or, alternatively, for A2 code rates supported by the mother basic matrix set, each code rate corresponds to one basic matrix subset, and the code rate includes: R0, R1, ..., R(A2−1) corresponding to the basic matrix subset Hb0, Hb 1, ..., Hb (A2−1), respectively, where 0<R0 <R1< ... <R(A2−1)<1. Determining the basic matrix used for LDPC coding includes: selecting, from [R0, ..., R(A2−1)], the basic matrix subset corresponding to a code rate less than or equal to R' and having the smallest difference from R', where R' is the actual code rate and is a real number greater than 0 and less than 1, and A2 is an integer greater than 1. After using the basic matrix subset to code, the punch coding is performed, i.e., some of codeword bits are not transmitted after the LDPC coding, so as to ensure that the code rate is constant (i.e., equal to the actual code rate).

Alternatively, the mother basic matrix set includes A4 basic matrix subsets, and a dimension of the $i^{th}$ basic matrix subset of the A4 basic matrix subsets respectively presents a matrix column number of NBi, a matrix row number of MBi, and a matrix system column number of KBi, where i=0, 1, ..., (A4−1), and wherein MBi is an integer greater than 0, NBi is an integer greater than MBi, where KBi=NBi−MBi, and A4 is an integer greater than 1.

Alternatively, matrix column numbers NBi of A4 basic matrix subsets are equal; and/or matrix row numbers MBi of A4 basic matrix subsets are equal; and/or matrix system column numbers KBi of A4 basic matrix subsets are equal, where i=0, 1, ..., (A4−1).

Alternatively, a column index set Colset composed of all column indices in all the basic matrix subsets includes a first column index set ColsetX and a second column index set ColsetY between which there is no intersection, and two subsets are not empty, wherein both the first column index set and the second column index set are subsets of Colset. When a column index j belongs to the first column index set, the second-type element in the $j^{th}$ column of each basic matrix subset belongs to the same set EleSetj, in which the number of second-type elements of EleSetj is less than or equal to a maximum value of a column weight of the $j^{th}$ column of all basic matrix subsets. When the column index j belongs to the second column index set, the number of second-type elements in an intersection of the $j^{th}$ column of the first basic matrix subset and the $j^{th}$ column of the second basic matrix subset in any two basic matrix subsets is less than or equal to 2, and the number of second-type elements of the $j^{th}$ columns of the first basic matrix subset and the second basic matrix subset is greater than or equal to 3, in which the column weight is the number of second-type elements in the column.

Alternatively, as A4=1, a row index set Rowset composed of all row indices of the basic matrix subset includes a first row index set RowsetX and a second row index set RowsetY, where j and k are any two elements in the first row index set, and the $j^{th}$ row and the $k^{th}$ row of the basic matrix subset are orthogonal. There is no intersection between the first row index set RowsetX and the second row index set RowsetY, two subsets are not empty, and both the first row index set RowsetX and the second row index set RowsetY are subsets of Rowset; and the $j^{th}$ row and the $k^{th}$ row are orthogonal, so that there is at most one second-type element in any two elements on any column index in the $j^{th}$ row and the $k^{th}$ row.

Alternatively, the mother basic matrix set comprises A4 basic matrix subsets, an extension factor set supported by each basic matrix subset is Zseti, where i=0, 1, ..., (A4−1), and numbers of elements supported by at least 2 extension factor sets are different in the A4 extension factor sets.

Alternatively, in the extension factor set Zseti, the Zseti is a subset of Zset (i+1), where i=0, 1, ..., (A4−2).

Alternatively, in any one of basic matrix subsets of the A4 basic matrices, the number of matrix columns having a column weight greater than 1 is a positive integer that is greater than $2^5-10$ and less than $2^5$.

Alternatively, all of second-type element values in any check column of any one of basic matrix subsets of the mother basic matrix set are equal to 0.

Alternatively, any continuous L1 lines from a $L0^{th}$ row to the last line in any one of basic matrix subsets of the mother basic matrix set are orthogonal, orthogonality of the L1 lines is that there is at most one second-type element value in L1 element values of any column index in L1 lines, where L0 is an integer that is greater than or equal to 0 and less than 5, and L1 is an integer that is greater than 0 and less than 5.

Alternatively, the bipartite graph corresponding to the parity check matrix of any one of basic matrix subsets in the mother basic matrix set at least has a short circle with a girth of 4. A code length corresponding to $i^{th}$ basic matrix of the basic matrix subset is N1, the number of variable nodes with a girth of 4 corresponding to the code length of Ni is Bi, and the number of variable nodes with a girth of 6 corresponding to the code length of Ni is Ci, where i=0, 1, ..., (s−1). The code length has the following relationship of N0<= N1<= ... <=N(s−1), then B0>=B1>= ... >=B(s−1) and C0<=C1<= ... <=C(s−1). B0, B1, ..., B(s−1), C0, C1, ..., C(s−1) and N0, N1, ..., N(s−1) are integers that are greater than 1, and s is an integer that is greater than or equal to 3.

Alternatively, in any one of basic matrix subset of the mother basic matrix set, a column weight of the basic matrix subset corresponding to the variable node with a girth of 6 is less than or equal to a column weight of the basic matrix subset corresponding to the variable node with a girth of 4.

Alternatively, the number of variable nodes of different code length with a girth of 6 are $C0=K0*Z0$, $C1=K1*Z1, \ldots, C(s-1)=K(s-1)*Z(s-1)$, respectively, wherein there is a relationship of $Z0<=Z1<= \ldots <=Z(s-1)$, then $K0<=K1<= \ldots <=K(s-1)$. $Z0, Z1, \ldots,$ and $Z(s-1)$ respectively correspond to extension factors of LDPC codes with code lengths of $N0, N1, \ldots,$ and $N(s-1)$, and $K0, K1 \ldots,$ and $K(s-1)$ is an integer that is greater than or equal to 1.

Alternatively, the bipartite graph of the parity check matrix of any one of basic matrix subsets in the mother basic matrix set has at least a short circle with a girth of 6 and does not have a short circle with a girth of 4. A code length corresponding to $i^{th}$ basic matrix of the basic matrix subset is NI, the number of variable nodes with a girth of 6 corresponding to the code length of Ni is Ci, and the number of variable nodes with a girth of 8 corresponding to the code length of Ni is Di, where $i=0, 1, \ldots, (s-1)$. There is a relationship of $N0<=N1<= \ldots <=N(s-1)$, then $C0>=C1>= \ldots >=C(s-1)$, and $D0<=D1<= \ldots <=D(s-1)$. $C0, C1, \ldots, C(s-1), D0, D1, \ldots, D(s-1)$ and $N0, N1, \ldots, N(s-1)$ are integers that are greater than 1, and s is an integer that is greater than or equal to 3.

Alternatively, in any one of basic matrix subset of the mother basic matrix set, a column weight of the basic matrix subset corresponding to the variable node with a girth of 8 is less than or equal to a column weight of the basic matrix subset corresponding to the variable node with a girth of 6.

Alternatively, the number of variable nodes of different code length with a girth of 8 are $D1=K0*Z0$, $D1=K1*Z1, \ldots, D(s-1)=K(s-1)*Z(s-1)$, respectively. There is a relationship of $Z0<=Z1<= \ldots <=Z(s-1)$, then $K1<=K2<= \ldots <=Ks$. $Z0, Z1, \ldots,$ and $Z(s-1)$ respectively correspond to extension factors of LDPC codes with code lengths of $N0, N1, \ldots, N(s-1)$, and $K0, K1 \ldots K(s-1)$ is an integer that is greater than or equal to 1.

Alternatively, positions of second-type elements of all of the base matrices in any one of the basic matrix subsets of the mother basic matrix set are the same.

Alternatively, code rates supported by all basic matrices in any one of basic matrix subset of the mother basic matrix set are the same.

Alternatively, all basic matrices in any one of basic matrix subset of the mother basic matrix set support different code lengths, the second-type elements in the basic matrices supporting different code lengths are obtained by calculating according to an extension factor and a determined extension factor.

Alternatively, the determined extension factor is an extension factor corresponding to a maximum code length supported by all of the base matrices in any one of the basic matrix subsets of the mother basic matrix set.

Alternatively, any one of the basic matrix subsets of the mother basic matrix set supports various code rates, each of which corresponds to one basic matrix, and two basic matrices corresponding to any two of code rates comprises x first-type elements with different positions. Or, any one of the basic matrix subsets of the mother basic matrix set supports various code lengths, each of which corresponds to one basic matrix, and two basic matrices corresponding to any two of code lengths comprises x first-type elements with different positions, where x is an integer that is greater than 0 or less than 10.

Alternatively, the mother basic matrix set comprises a plurality of basic matrix subsets. Any one of basic matrix subsets {Hbi} comprises s basic matrices. All column indices of any one of basic matrices Hbi constitutes a column index set ColSet. The column index set is divided into two subsets Colsubset1 and Colsubset2 which are complementary to each other, wherein Colsubset1 comprises Ci elements, and Colsubset2 comprises Di elements, where i is used to indicate one basic matrix Hbi corresponding to one specific code length. An extension factor corresponding to Hbi is Zi, where $i=0, 1, \ldots, (s-1)$, s is an integer that is greater than or equal to 2, and Ci and Di are integers that are greater than or equal to 1.

Alternatively, a basic sub-matrix jointly indicated by all row indices of any one of the basic matrices Hbi and all column indices of Colsubset1 is Hbi(:,Colsubset1). A parity check matrix HL1i is obtained by matrix-extending in combination with the basic sub-matrix Hbi(:,Colsubset1) and an extension factor Zi, which parity check matrix HL1i has a girth of g; a basic sub-matrix jointly indicated by all row indices of the basic matrix Hbi and all column indices of Colsubset2 is Hbi(:,Colsubset2), a parity check matrix HL2i is obtained by matrix-extending in combination with the Hbi(:,Colsubset2) and a lift size Zi, which parity check matrix HL2i has a girth of g−2, all extension factors supported by the basic matrix subset present a relationship of $Z1<=Z2<= \ldots <=Zs$, then $D1>=D2>= \ldots >=Ds$, and $C1<=C2<= \ldots <=Cs$; where g is equal to 6 or 8.

Alternatively, the column index set ColSet may also be divided into a third subset Colsubset3 and a fourth subset Colsubset4 which are complementary to each other. The Colsubset1 contains the Colsubset3, the Colsubset4 contains the Colsubset2, the Colsubset3 has Ei elements, and the Colsubset4 has Fi elements, where Ei and Fi are integers than are greater than or equal to 1. Any element k of the Colsubset2 and the Colsubset3 constitute a set Colsubset5. A basic sub-matrix jointly indicated by all row indices and all column indices of Colsubset5 is Hbi(:,Colsubset5), a parity check matrix HL3i is obtained by matrix-extending in combination with Hbi(:,Colsubset5) and the extension factor Zi, which parity check matrix HL3i has a girth of 6, where $i=0, 1, \ldots, (s-1)$. All extension factors supported by the basic matrix subset present a relationship of $Z1<=Z2<= \ldots <=Zs$, then $F1>=F2>= \ldots >=Fs$, and $E1<=E2<= \ldots <=Es$.

Second Embodiment

In this embodiment, a quasi-cyclic LDPC coding and decoding apparatus is also provided, which is used to implement the foregoing embodiments and alternative implementations and has been described, so that it will not be described again. As used below, the term "module" may implement a combination of software and/or hardware of a predetermined function. Although the apparatuses described in the following embodiments are preferably implemented in software, hardware, or a combination of software and hardware is also possible and contemplated.

Figure 3:
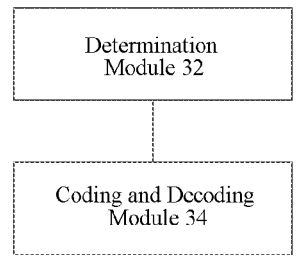
FIG. 3 is a first structural block diagram of a LDPC coding and decoding apparatus according to an embodiment of the present disclosure.

FIG. 3 is a structural block diagram 1 of a LDPC coding and decoding apparatus according to an embodiment of the present disclosure. As shown in FIG. 3, the apparatus includes:

a determination module 32 configured for determining a basic matrix used for low density parity check LDPC coding from a mother basic matrix set, wherein the basic matrix used for LDPC coding comprises a first-type element corresponding to an all-zero square matrix and a second-type element corresponding to a matrix obtained by means of a cyclic shift of a unit matrix according to a value of the second-type element, and wherein dimensions of the all-zero square matrix and the unit matrix are equal;

a coding and decoding module 34 coupled to the determination module 32 and configured for performing LDPC coding on an information sequence to be coded according to the basis matrix used for LDPC coding, and/or performing LDPC decoding on a data sequence to be decoded according to the basis matrix used for LDPC coding.

By the above steps, the determination module is configured for determining a basic matrix used for LDPC coding from a mother basic matrix set, wherein the basic matrix used for LDPC coding includes a first-type element corresponding to an all-zero square matrix and a second-type element corresponding to a matrix obtained by means of a cyclic shift of a unit matrix according to a value of the second-type element, and wherein dimensions of the all-zero square matrix and the unit matrix are equal; performing LDPC coding on an information sequence to be coded according to the basis matrix used for LDPC coding, and/or performing LDPC decoding on a data sequence to be decoded according to the basis matrix used for LDPC coding, it can be seen that the basic matrix used for LDPC coding is determined from the mother basic matrix set by using the above scheme, wherein an element of the basic matrix used for LDPC coding is divided into a first-type element and a second-type element, and the first-type element and the second-type element respectively has a corresponding matrix. Then, the coding and decoding is performed according to the basic matrix used for LDPC coding, so that LDPC coding and decoding may support a flexible code length and code rate to improve the flexibility of the LDPC coding and decoding process, thereby solving the problem in the related art that LDPC coding and decoding processes lack flexibility.

Alternatively, the determination module 32 is configured for: determining the basic matrix used for LDPC coding according to a preset parameter. The preset parameter includes at least one of the followings: a transport block size TBS, an application scenario, a user UE type, a frequency band, a code rate R, a combination of the transport block size TBS and the code rate R, channel type, a data transmission direction, a combination of a TBS index number and the number of resource units NRB, a combination of a modulation and coding scheme MCS index number and the number of resource units NRB, a combination of the code rate R and the number of resource units NRB, a bandwidth size.

In the present embodiment, the transport block size TBS is an integer that is greater than 0. The application scenario includes an eMBB, a URLLC and an mMTC. The frequency band includes a system-configured frequency range. The code rate R is a real number which is greater than 0 and less than 1. The channel type includes a control channel and a data channel. The data transmission direction includes an uplink data and a downlink data. The TBS index number is used to indicate a corresponding transport block size TBS in combination with the number of resource units, and the TBS index number is an integer that is greater than or equal to 0. The MCS index number is used to indicate an MCS scheme or a combination of a modulation order and a TBS index, and the MCS index number is an integer that is greater than or equal to 0. The number of resource units NRB is the number of system-configured resource blocks. The bandwidth size is a real number which is greater than 0.

Alternatively, the transport block size TBS is an element in a TBS set TBSSet. The TBS set includes A1 TBS subsets TBSsubset$_i$, while the mother basic matrix set includes A1 basic matrix subsets Hb$_i$. Each of TBS subsets corresponds to one basic matrix subset, and A1 is an integer that is greater than 1. There is no intersection between each two subsets of the A1 TBS subsets, and all of A1 TBS subsets constitute a complete TBS set, where i is an integer between 0 and A1−1. the determination module 32 is configured for determining the TBS subset TBSsubset$_i$ to which the transport block size TBS belongs, and then determining a basic matrix subset Hb$_i$ corresponding to the TBS subset TBSsubset$_i$.

Alternatively, the code rate R is an element in a code rate set CoderateSet, which includes A2 code rates Coderate$_i$, where i is an integer between 0 and A2−1. Also, the mother basic matrix set includes A2 basic matrix subsets Hb$_i$, and each code rate corresponds to one basic matrix subset. All of A2 code rates constitute the whole code rate set CoderateSet, where A2 is an integer that is greater than 1. The determination module 32 is configured for determining the code rate Coderate$_i$ which is equal to the code rate R, and then determining the basic matrix subset Hb$_i$ corresponding to the code rate Coderate$_i$.

Alternatively, the frequency band is an element in a frequency band set FBSet which includes A3 frequency bands. Also, the mother basic matrix set includes A3 basic matrix subsets Hb$_i$, and each frequency band corresponds to one basic matrix subset. There is no intersection between each two of A3 frequency bands, and all of A3 frequency bands constitute the whole frequency band set FBSet, where A3 is an integer that is greater than 1 and i is an integer between 0 and A3−1. The determination module 32 is configured for determining an index which belongs to the frequency band set FBSet with frequency bands, and then determining the basic matrix subset Hb$_i$ corresponding to the frequency band.

Alternatively, a corresponding basic matrix is selected from the basic matrix subset Hb$_i$ corresponding to the TBS subset TBSsubset$_i$ according to the actual code rate or a combination of the transport block size TBS and a LDPC codeword size.

Alternatively, the mother basic matrix set includes a basic matrix subset used for data coding and a basic matrix subset used for signaling coding. The determination module 32 is configured for: determining the channel type, and then determining the basic matrix subset corresponding to the channel type.

Alternatively, the mother basic matrix set includes: a basic matrix subset used for uplink data transmission and a basic matrix subset used for downlink data transmission. The determination module 32 is configured for: determining data transmission direction, and then determining the basic matrix subset corresponding to the data transmission direction.

Alternatively, for A2 code rates supported by the mother basic matrix set, each code rate corresponds to one basic matrix subset, and the code rate includes: R0, R1, . . . , R(A2−1) corresponding to the basic matrix subset Hb0, Hb 1, . . . , Hb (A2−1), respectively, where 0<R0<R1< . . . <R(A2−1)<1. The determination module 32 is configured for: selecting, from [R0, . . . , R(A2−1)], the basic matrix subset corresponding to a code rate greater than or equal to R' and having the smallest difference from R', where R' is the actual code rate and is a real number greater than 0 and less than 1, and A2 is an integer greater than 1.

Alternatively, for A2 code rates supported by the mother basic matrix set, each code rate corresponds to one basic matrix subset, and the code rate includes: R0, R1, . . . , R(A2−1) corresponding to the basic matrix subset Hb0, Hb 1, . . . , Hb (A2−1), respectively, where 0<R0<R1< . . . <R(A2−1)<1. The determination module 32 is configured for: selecting, from [R0, . . . , R(A2−1)], the basic matrix subset corresponding to a code rate less than or equal to R' and having the smallest difference from R', where R' is the actual code rate and is a real number greater than 0 and less than 1, and A2 is an integer greater than 1.

Alternatively, the mother basic matrix set includes A4 basic matrix subsets, and a dimension of the $i^{th}$ basic matrix subset of the A4 basic matrix subsets respectively presents a matrix column number of NBi, a matrix row number of MBi, and a matrix system column number of KBi, where i=0, 1, ..., (A4−1), and wherein MBi is an integer greater than 0, NBi is an integer greater than MBi, where KBi=NBi−MBi, and A4 is an integer greater than 1.

Alternatively, matrix column numbers NBi of A4 basic matrix subsets are equal; and/or matrix row numbers MBi of A4 basic matrix subsets are equal; and/or matrix system column numbers KBi of A4 basic matrix subsets are equal, where i=0, 1, ..., (A4−1).

Alternatively, a column index set Colset composed of all column indices in all the basic matrix subsets includes a first column index set ColsetX and a second column index set ColsetY between which there is no intersection, and two subsets are not empty, wherein both the first column index set and the second column index set are subsets of Colset. When a column index j belongs to the first column index set, the second-type element in the $j^{th}$ column of each basic matrix subset belongs to the same set EleSetj, in which the number of second-type elements of EleSetj is less than or equal to a maximum value of a column weight of the $j^{th}$ column of all basic matrix subsets. When the column index j belongs to the second column index set, the number of second-type elements in an intersection of the $j^{th}$ column of the first basic matrix subset and the $j^{th}$ column of the second basic matrix subset in any two basic matrix subsets is less than or equal to 2, and the number of second-type elements of the $j^{th}$ columns of the first basic matrix subset and the second basic matrix subset is greater than or equal to 3, in which the column weight is the number of second-type elements in the column.

Alternatively, as A4=1, a row index set Rowset composed of all row indices of the basic matrix subset includes a first row index set RowsetX and a second row index set RowsetY, where j and k are any two elements in the first row index set, and the $j^{th}$ row and the $k^{th}$ row of the basic matrix subset are orthogonal. There is no intersection between the first row index set RowsetX and the second row index set RowsetY, two subsets are not empty, and both the first row index set RowsetX and the second row index set RowsetY are subsets of Rowset; and the $j^{th}$ row and the $k^{th}$ row are orthogonal, so that there is at most one second-type element in any two elements on any column index in the $j^{th}$ row and the $k^{th}$ row.

Alternatively, the mother basic matrix set comprises A4 basic matrix subsets, an extension factor set supported by each basic matrix subset is Zseti, where i=0, 1, ..., (A4−1), and numbers of elements supported by at least 2 extension factor sets are different in the A4 extension factor sets.

Alternatively, in the extension factor set Zseti, the Zseti is a subset of Zset (i+1), where i=0, 1, ..., (A4−2).

Alternatively, in any one of basic matrix subsets of the A4 basic matrices, the number of matrix columns having a column weight greater than 1 is a positive integer that is greater than $2^5-10$ and less than $2^5$.

Alternatively, all of second-type element values in any check column of any one of basic matrix subsets of the mother basic matrix set are equal to 0.

Alternatively, any continuous L1 lines from a $L0^{th}$ row to the last line in any one of basic matrix subsets of the mother basic matrix set are orthogonal, orthogonality of the L1 lines is that there is at most one second-type element value in L1 element values of any column index in L1 lines, where L0 is an integer that is greater than or equal to 0 and less than 5, and L1 is an integer that is greater than 0 and less than 5.

Alternatively, the bipartite graph corresponding to the parity check matrix of any one of basic matrix subsets in the mother basic matrix set at least has a short circle with a girth of 4. A code length corresponding to $i^{th}$ basic matrix of the basic matrix subset is N1, the number of variable nodes with a girth of 4 corresponding to the code length of Ni is Bi, and the number of variable nodes with a girth of 6 corresponding to the code length of Ni is Ci, where i=0, 1, ..., (s−1). The code length has the following relationship of N0<= N1<= ... <=N(s−1), then B0>=B1>= ... >=B(s−1) and C0<=C1<= ... <=C(s−1). B0, B1, ..., B(s−1), C0, C1, ..., C(s−1) and N0, N1, ..., N(s−1) are integers that are greater than 1, and s is an integer that is greater than or equal to 3.

Alternatively, in any one of basic matrix subset of the mother basic matrix set, a column weight of the basic matrix subset corresponding to the variable node with a girth of 6 is less than or equal to a column weight of the basic matrix subset corresponding to the variable node with a girth of 4.

Alternatively, the number of variable nodes of different code length with a girth of 6 are C0=K0*Z0, C1=K1*Z1, ..., C(s−1)=K(s−1)*Z(s−1), respectively, wherein there is a relationship of Z0<=Z1<= ... <=Z(s−1), then K0<=K1<= ... <=K(s−1). Z0, Z1, ..., and Z(s−1) respectively correspond to extension factors of LDPC codes with code lengths of N0, N1, ..., and N(s−1), and K0, K1 ..., and K(s−1) is an integer that is greater than or equal to 1.

Alternatively, the bipartite graph of the parity check matrix of any one of basic matrix subsets in the mother basic matrix set has at least a short circle with a girth of 6 and does not have a short circle with a girth of 4. A code length corresponding to $i'h$ basic matrix of the basic matrix subset is N1, the number of variable nodes with a girth of 6 corresponding to the code length of Ni is Ci, and the number of variable nodes with a girth of 8 corresponding to the code length of Ni is Di, where i=0, 1, ..., (s−1). There is a relationship of N0<=N1<= ... <=N(s−1), then C0>= C1>= ... >=C(s−1), and D0<=D1<= ... <=D(s−1). C0, C1, ..., C(s−1), D0, D1, ..., D(s−1) and N0, N1, ..., N(s−1) are integers that are greater than 1, and s is an integer that is greater than or equal to 3.

Alternatively, in any one of basic matrix subset of the mother basic matrix set, a column weight of the basic matrix subset corresponding to the variable node with a girth of 8 is less than or equal to a column weight of the basic matrix subset corresponding to the variable node with a girth of 6.

Alternatively, the number of variable nodes of different code length with a girth of 8 are D1=K0*Z0, D1=K1*Z1, ..., D(s−1)=K(s−1)*Z(s−1), respectively. There is a relationship of Z0<=Z1<= ... <=Z(s−1), then K1<= K2<= ... <=Ks. Z0, Z1, ..., and Z(s−1) respectively correspond to extension factors of LDPC codes with code lengths of N0, N1, ..., N(s−1), and K0, K1 ... K(s−1) is an integer that is greater than or equal to 1.

Alternatively, positions of second-type elements of all of the base matrices in any one of the basic matrix subsets of the mother basic matrix set are the same.

Alternatively, code rates supported by all basic matrices in any one of basic matrix subset of the mother basic matrix set are the same.

Alternatively, all basic matrices in any one of basic matrix subset of the mother basic matrix set support different code lengths, the second-type elements in the basic matrices supporting different code lengths are obtained by calculating according to an extension factor and a determined extension factor.

Alternatively, the determined extension factor is an extension factor corresponding to a maximum code length supported by all of the base matrices in any one of the basic matrix subsets of the mother basic matrix set.

Alternatively, any one of the basic matrix subsets of the mother basic matrix set supports various code rates, each of which corresponds to one basic matrix, and two basic matrices corresponding to any two of code rates comprises x first-type elements with different positions. Or, any one of the basic matrix subsets of the mother basic matrix set supports various code lengths, each of which corresponds to one basic matrix, and two basic matrices corresponding to any two of code lengths comprises x first-type elements with different positions, where x is an integer that is greater than 0 or less than 10.

Alternatively, the mother basic matrix set comprises a plurality of basic matrix subsets. Any one of basic matrix subsets {Hbi} comprises s basic matrices. All column indices of any one of basic matrices Hbi constitutes a column index set ColSet. The column index set is divided into two subsets Colsubset1 and Colsubset2 which are complementary to each other, wherein Colsubset1 comprises Ci elements, and Colsubset2 comprises Di elements, where i is used to indicate one basic matrix Hbi corresponding to one specific code length. An extension factor corresponding to Hbi is Zi, where i=0, 1, . . . , (s−1), s is an integer that is greater than or equal to 2, and Ci and Di are integers that are greater than or equal to 1.

Alternatively, a basic sub-matrix jointly indicated by all row indices of any one of the basic matrices Hbi and all column indices of Colsubset1 is Hbi(:,Colsubset1). A parity check matrix HL1i is obtained by matrix-extending in combination with the basic sub-matrix Hbi(:,Colsubset1) and an extension factor Zi, which parity check matrix HL1i has a girth of g; a basic sub-matrix jointly indicated by all row indices of the basic matrix Hbi and all column indices of Colsubset2 is Hbi(:,Colsubset2), a parity check matrix HL2i is obtained by matrix-extending in combination with the Hbi(:,Colsubset2) and a lift size Zi, which parity check matrix HL2i has a girth of g−2, all extension factors supported by the basic matrix subset present a relationship of Z1<=Z2<= . . . <=Zs, then D1>=D2>= . . . >=Ds, and C1<=C2<= . . . <=Cs; where g is equal to 6 or 8.

Alternatively, the column index set ColSet may also be divided into a third subset Colsubset3 and a fourth subset Colsubset4 which are complementary to each other. The Colsubset1 contains the Colsubset3, the Colsubset4 contains the Colsubset2, the Colsubset3 has Ei elements, and the Colsubset4 has Fi elements, where Ei and Fi are integers than are greater than or equal to 1. Any element k of the Colsubset2 and the Colsubset3 constitute a set Colsubset5. A basic sub-matrix jointly indicated by all row indices and all column indices of Colsubset5 is Hbi(:,Colsubset5), a parity check matrix HL3i is obtained by matrix-extending in combination with Hbi(:,Colsubset5) and the extension factor Zi, which parity check matrix HL3i has a girth of 6, where i=0, 1, . . . , (s−1). All extension factors supported by the basic matrix subset present a relationship of Z1<=Z2<= . . . <=Zs, then F1>=2>= . . . >=Fs, and E1<=E2<= . . . <=Es.

It should be noted that each of the above modules may be implemented by software or hardware. For the latter, it may be implemented in such a way that the foregoing modules are all located in the same processor, which is not limited thereto; or, the modules are respectively located in a plurality of processors.

Third Embodiment

Figure 4:
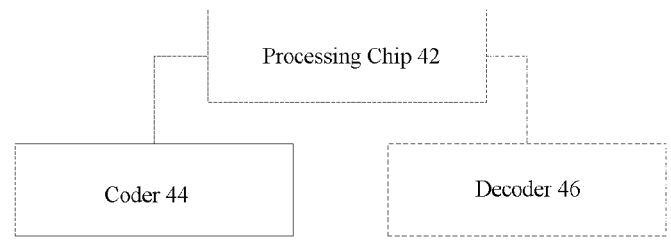
FIG. 4 is a second structural block diagram of a LDPC coding and decoding apparatus according to an embodiment of the present disclosure.

The present embodiment further provides a quasi-cyclic LDPC coder and decoder, and FIG. 4 is a structural block diagram of a LDPC coder and decoder according to an embodiment of the present disclosure. As shown in FIG. 4, the LDPC coder and decoder includes:

a processing chip 42 configured for determining a basic matrix used for low density parity check LDPC coding from a mother basic matrix set, wherein the basic matrix used for LDPC coding comprises a first-type element corresponding to an all-zero square matrix and a second-type element corresponding to a matrix obtained by means of a cyclic shift of a unit matrix according to a value of the second-type element, wherein dimensions of the all-zero square matrix and the unit matrix are equal, wherein the mother basic matrix set at least includes one basic matrix;

a coder 44 coupled to the processing chip 42 and configured for performing LDPC coding on an information sequence to be coded according to the basis matrix used for LDPC coding; and/or a decoder 46 coupled to the processing chip 42 and configured for performing LDPC decoding on a data sequence to be decoded according to the basis matrix used for LDPC coding.

Alternatively, the processing chip 42 is configured for: determining the basic matrix used for LDPC coding according to a preset parameter, wherein the preset parameter comprises at least one of the followings: a transport block size TBS, an application scenario, a user UE type, a frequency band, a code rate R, a combination of the transport block size TBS and the code rate R, a channel type, a data transmission direction, a combination of a TBS index number and a number of resource units NRB, a combination of a modulation and coding scheme MCS index number and the number of resource units NRB, a combination of the code rate R and the number of resource units NRB, a bandwidth size.

In the present embodiment, the transport block size TBS is an integer that is greater than 0; wherein the application scenario comprises an eMBB, a URLLC and a mMTC; wherein the frequency band comprises a system-configured frequency range; wherein the code rate R is a real number which is greater than 0 and less than 1; wherein the channel type comprises a control channel and a data channel; wherein the data transmission direction comprises an uplink data and a downlink data; wherein the TBS index number is used to indicate a corresponding transport block size TBS in combination with a number of resource units, and the TBS index number is an integer that is greater than or equal to 0; wherein the MCS index number is used to indicate an MCS scheme or a combination of a modulation order and a TBS index, and the MCS index number is an integer that is greater than or equal to 0; wherein the number of resource units NRB is a number of system-configured resource blocks; and wherein the bandwidth size is a real number which is greater than 0.

Alternatively, the transport block size TBS is an element in a TBS set TBSSet, wherein the TBS set comprises A1 TBS subsets TBSsubset$_j$, while the mother basic matrix set comprises A1 basic matrix subsets Hb$_j$, each of TBS subsets corresponding to one basic matrix subset; wherein A1 is an integer that is greater than 1, there is no intersection between each two subsets of the A1 TBS subsets, and all of A1 TBS subsets constitute a complete TBS set, where i is an integer between 0 and A1−1; the processing chip is configure for: determining the TBS subset TBSsubset$_i$ to which the transport block size TBS belongs, and then determining a basic matrix subset Hb$_i$ corresponding to the TBS subset TBS-subset$_i$.

Alternatively, a corresponding basic matrix is selected from the basic matrix subset Hb$_i$ corresponding to the TBS subset TBS subset$_i$ according to the actual code rate or a combination of the transport block size TBS and a LDPC codeword size.

Alternatively, the code rate R is an element in a code rate set CoderateSet, which comprises A2 code rates Coderate$_i$, where i is an integer between 0 and A2−1, while the mother basic matrix set comprises A2 basic matrix subsets Hb$_i$, each code rate corresponding to one basic matrix subset; wherein all of A2 code rates constitute the whole code rate set CoderateSet, where A2 is an integer that is greater than 1; the processing chip is configured for: determining the code rate Coderate$_i$ which is equal to the code rate R, and then determining the basic matrix subset Hb$_i$ corresponding to the code rate Coderate$_i$.

Alternatively, the frequency band is an element in a frequency band set FBSet which comprises A3 frequency bands, while the mother basic matrix set comprises A3 basic matrix subsets Hb$_i$, each frequency band corresponding to one basic matrix subset; wherein there is no intersection between each two of A3 frequency bands, and all of A3 frequency bands constitute the whole frequency band set FBSet, where A3 is an integer that is greater than 1 and i is an integer between 0 and A3−1; the processing chip is configured for: determining an index which belongs to the frequency band set FBSet with frequency bands, and then determining the basic matrix subset Hb$_i$ corresponding to the frequency band.

Alternatively, the mother basic matrix set comprises a basic matrix subset used for data coding and a basic matrix subset used for signaling coding, and wherein determining the basic matrix used for LDPC coding from the mother basic matrix set comprises: determining the channel type, and then determining the basic matrix subset corresponding to the channel type.

Alternatively, the mother basic matrix set comprises a basic matrix subset used for uplink data transmission and a basic matrix subset used for downlink data transmission, and wherein determining the basic matrix used for LDPC coding from the mother basic matrix set comprises: determining the data transmission direction, and then determining the basic matrix subset corresponding to the data transmission direction.

Alternatively, for A2 code rates supported by the mother basic matrix set, each code rate corresponds to one basic matrix subset, and the code rate comprises: R0, R1, . . . , R(A2−1) corresponding to the basic matrix subset Hb0, Hb 1, . . . , Hb (A2−1), respectively, where 0<R0<R1< . . . <R(A2−1)<1; and wherein determining the basic matrix used for LDPC coding comprises: selecting, from [R0, . . . , R(A2−1)], the basic matrix subset corresponding to a code rate greater than or equal to R' and having the smallest difference from R', where R' is the actual code rate and is a real number greater than 0 and less than 1, and A2 is an integer greater than 1.

Alternatively, for A2 code rates supported by the mother basic matrix set, each code rate corresponds to one basic matrix subset, and the code rate comprises: R0, R1, . . . , R(A2−1) corresponding to the basic matrix subset Hb0, Hb 1, . . . , Hb (A2−1), respectively, where 0<R0<R1< . . . <R(A2−1)<1; and wherein determining the basic matrix used for LDPC coding comprises: selecting, from [R0, . . . , R(A2−1)], the basic matrix subset corresponding to a code rate less than or equal to R' and having the smallest difference from R', where R' is the actual code rate and is a real number greater than 0 and less than 1, and A2 is an integer greater than 1.

Alternatively, the mother basic matrix set comprises A4 basic matrix subsets, and a dimension of the $i^{th}$ basic matrix subset of the A4 basic matrix subsets respectively presents a matrix column number of NBi, a matrix row number of MBi, and a matrix system column number of KBi, where i=0, 1, . . . , (A4−1), and wherein MBi is an integer greater than 0, NBi is an integer greater than MBi, where KBi=NBi−MBi, and A4 is an integer greater than 1.

Alternatively, matrix column numbers NBi of A4 basic matrix subsets are equal; and/or matrix row numbers MBi of A4 basic matrix subsets are equal; and/or matrix system column numbers KBi of A4 basic matrix subsets are equal; where i=0, 1, . . . , (A4−1).

Alternatively, a column index set Colset composed of all column indices in all the basic matrix subsets comprises a first column index set ColsetX and a second column index set ColsetY between which there is no intersection, and two subsets are not empty, wherein both the first column index set and the second column index set are subsets of Colset, wherein, when a column index j belongs to the first column index set, the second-type element in the $j^{th}$ column of each basic matrix subset belongs to the same set EleSetj, in which a number of second-type elements of EleSetj is less than or equal to a maximum value of a column weight of the $j^{th}$ column of all basic matrix subsets; and when the column index j belongs to the second column index set, a number of second-type elements in an intersection of the $j^{th}$ column of the first basic matrix subset and the $j^{th}$ column of the second basic matrix subset in any two basic matrix subsets is less than or equal to 2, and the number of second-type elements of the $j^{th}$ columns of the first basic matrix subset and the second basic matrix subset is greater than or equal to 3, in which the column weight is the number of second-type elements in the column.

Alternatively, as A4=1, a row index set Rowset composed of all row indices of the basic matrix subset comprises a first row index set RowsetX and a second row index set RowsetY, where j and k are any two elements in the first row index set, and the $j^{th}$ row and the $k^{th}$ row of the basic matrix subset are orthogonal; wherein there is no intersection between the first row index set RowsetX and the second row index set RowsetY, two subsets are not empty, and both the first row index set RowsetX and the second row index set RowsetY are subsets of Rowset; and wherein the $j^{th}$ row and the $k^{th}$ row are orthogonal, so that there is at most one second-type element in any two elements on any column index in the $j^{th}$ row and the $k^{th}$ row.

Alternatively, the mother basic matrix set comprises A4 basic matrix subsets, an extension factor set supported by each basic matrix subset is Zseti, where i=0, 1, . . . , (A4−1), and numbers of elements supported by at least 2 extension factor sets are different in the A4 extension factor sets.

Alternatively, in the extension factor set Zseti, the Zseti is a subset of Zset (i+1), where i=0, 1, . . . , (A4−2).

Alternatively, in any one of basic matrix subsets of the A4 basic matrices, a number of matrix columns having a column weight greater than 1 is a positive integer that is greater than $2^5-10$ and less than $2^5$.

Alternatively, values of all second-type elements in any check column of any one of basic matrix subsets of the mother basic matrix set is equal to 0.

Alternatively, any continuous L1 lines from a L0$^{th}$ row to the last line in any one of basic matrix subsets of the mother basic matrix set are orthogonal, orthogonality of the L1 lines is that there is at most one second-type element value in L1 element values of any column index in L1 lines, where L0 is an integer that is greater than or equal to 0 and less than 5, and L1 is an integer that is greater than 0 and less than 5.

Alternatively, the bipartite graph corresponding to the parity check matrix of any one of basic matrix subsets in the mother basic matrix set at least has a short circle with a girth of 4; a code length corresponding to i$^{th}$ basic matrix of the basic matrix subset is N1, the number of variable nodes with a girth of 4 corresponding to the code length of Ni is Bi, and the number of variable nodes with a girth of 6 corresponding to the code length of Ni is Ci, where i=0, 1, . . . , (s−1), wherein the code length has the following relationship of N0<=N1<= . . . <=N(s−1), then B0>=B1>= . . . >=B(s−1) and C0<=C1<= . . . <=C(s−1); wherein B0, B1, . . . , B(s−1), C0, C1, . . . , C(s−1) and N0, N1, . . . , N(s−1) are integers that are greater than 1, and s is an integer that is greater than or equal to 3.

Alternatively, in any one of basic matrix subset of the mother basic matrix set, a column weight of the basic matrix subset corresponding to the variable node with a girth of 6 is less than or equal to a column weight of the basic matrix subset corresponding to the variable node with a girth of 4.

Alternatively, the number of variable nodes of different code length with a girth of 6 are C0=K0*Z0, C1=K1*Z1, . . . , C(s−1)=K(s−1)*Z(s−1), respectively, wherein there is a relationship of Z0<=Z1<= . . . <=Z(s−1), then K0<=K1<= . . . <=K(s−1); wherein Z0, Z1, . . . , and Z(s−1) respectively correspond to extension factors of LDPC codes with code lengths of N0, N1, . . . , and N(s−1), and K0, K1 . . . , and K(s−1) is an integer that is greater than or equal to 1.

Alternatively, the bipartite graph of the parity check matrix of any one of basic matrix subsets in the mother basic matrix set has at least a short circle with a girth of 6 and does not have a short circle with a girth of 4, a code length corresponding to i$^{th}$ basic matrix of the basic matrix subset is N1, the number of variable nodes with a girth of 6 corresponding to the code length of Ni is Ci, and the number of variable nodes with a girth of 8 corresponding to the code length of Ni is Di, where i=0, 1, . . . , (s−1), wherein there is a relationship of N0<=N1<= . . . <=N(s−1), then C0>=C1>= . . . >=C(s−1), and D0<=D1<= . . . <=D(s−1), and wherein C0, C1, . . . , C(s−1), D0, D1, . . . , D(s−1) and N0, N1, . . . , N(s−1) are integers that are greater than 1, and s is an integer that is greater than or equal to 3.

Alternatively, in any one of basic matrix subset of the mother basic matrix set, a column weight of the basic matrix subset corresponding to the variable node with a girth of 8 is less than or equal to a column weight of the basic matrix subset corresponding to the variable node with a girth of 6.

Alternatively, the number of variable nodes of different code length with a girth of 8 are D1=K0*Z0, D1=K1*Z1, . . . , D(s−1)=K(s−1)*Z(s−1), respectively, wherein there is a relationship of Z0<=Z1<= . . . <=Z(s−1), then K1<=K2<= . . . <=Ks; wherein Z0, Z1, . . . , and Z(s−1) respectively correspond to extension factors of LDPC codes with code lengths of N0, N1, . . . , N(s−1), and K0, K1 . . . K(s−1) is an integer that is greater than or equal to 1.

Alternatively, positions of second-type elements of all of the base matrices in any one of the basic matrix subsets of the mother basic matrix set are the same.

Alternatively, code rates supported by all basic matrices in any one of basic matrix subset of the mother basic matrix set are the same.

Alternatively, all basic matrices in any one of basic matrix subset of the mother basic matrix set support different code lengths, the second-type elements in the basic matrices supporting different code lengths are obtained by calculating according to an extension factor and a determined extension factor.

Alternatively, the determined extension factor is an extension factor corresponding to a maximum code length supported by all of the base matrices in any one of the basic matrix subsets of the mother basic matrix set.

Alternatively, any one of the basic matrix subsets of the mother basic matrix set supports various code rates, each of which corresponds to one basic matrix, and two basic matrices corresponding to any two of code rates comprises x first-type elements with different positions; or, any one of the basic matrix subsets of the mother basic matrix set supports various code lengths, each of which corresponds to one basic matrix, and two basic matrices corresponding to any two of code lengths comprises x first-type elements with different positions, where x is an integer that is greater than 0 or less than 10.

Alternatively, the mother basic matrix set comprises a plurality of basic matrix subsets, any one of basic matrix subsets {Hbi} comprises s basic matrices, and all column indices of any one of basic matrices Hbi constitutes a column index set ColSet, wherein the column index set is divided into two subsets Colsubset1 and Colsubset2 which are complementary to each other, Colsubset1 comprises Ci elements, Colsubset2 comprises Di elements, where i is used to indicate one basic matrix Hbi corresponding to one specific code length, and an extension factor corresponding to Hbi is Zi, where i=0, 1, . . . , (s−1), s is an integer that is greater than or equal to 2, and Ci and Di are integers that are greater than or equal to 1.

Alternatively, a basic sub-matrix jointly indicated by all row indices of any one of the basic matrices Hbi and all column indices of Colsubset1 is Hbi(:,Colsubset1), a parity check matrix HL1i is obtained by matrix-extending in combination with the basic sub-matrix Hbi(:,Colsubset1) and an extension factor Zi, which parity check matrix HL1i has a girth of g; a basic sub-matrix jointly indicated by all row indices of the basic matrix Hbi and all column indices of Colsubset2 is Hbi(:,Colsubset2), a parity check matrix HL2i is obtained by matrix-extending in combination with the Hbi(:,Colsubset2) and a lift size Zi, which parity check matrix HL2i has a girth of g−2, all extension factors supported by the basic matrix subset present a relationship of Z1<=Z2<= . . . <=Zs, then D1>=D2>= . . . >=Ds, and C1<=C2<= . . . <=Cs; where g is equal to 6 or 8.

Alternatively, the column index set ColSet may also be divided into a third subset Colsubset3 and a fourth subset Colsubset4 which are complementary to each other, in which the Colsubset1 contains the Colsubset3, the Colsubset4 contains the Colsubset2, the Colsubset3 has Ei elements, and the Colsubset4 has Fi elements, where Ei and Fi are integers than are greater than or equal to 1, wherein any element k of the Colsubset2 and the Colsubset3 constitute a set Colsubset5, wherein a basic sub-matrix jointly indicated by all row indices and all column indices of Colsubset5 is Hbi(:,Colsubset5), a parity check matrix HL3i is obtained by matrix-extending in combination with Hbi(:,Colsubset5) and the extension factor Zi, which parity check matrix HL3i has a girth of 6, where i=0, 1, . . . , (s−1), and wherein all extension factors supported by the basic matrix subset present a relationship of $Z1<=Z2<= \ldots <=Zs$, then $F1>=F2>= \ldots >=Fs$, and $E1<=E2<= \ldots <=Es$.

A detailed description is provided in combination with alternative embodiments of the present disclosure.

First Alternative Embodiment

The method proposed in this alternative embodiment may be used in a LTE mobile communication system or a future fifth generation mobile communication system or other wireless wired communication system, and the data transmission direction is a direction that the base station sends data to the mobile user (downlink transmission service data), or is a direction that the mobile user sends data to the base station (uplink transmission service data). The mobile user includes: a mobile device, an access terminal, a user terminal, a user station, a user unit, a mobile station, a remote station, a remote terminal, a user agent, a user device, a user equipment, or some other terminologies. The base station includes an access point (AP), or may be referred to as a node B, a Radio Network Controller (RNC), an Evolved Node B (eNB), a base station controller (BSC), and a base transceiver station (BTS), a base station (BS), a transceiver function (TF), a radio router, a radio transceiver, a basic service unit (BSS), an extended service unit (ESS), a radio base station (RBS), or some other terminologies.

According to an aspect of this alternative embodiment, the alternative embodiment provides a structured LDPC code construction method, which is applied to an enhanced Mobile Broadband(eMBB) in New Radio Access Technology (referred to as new RAT) scenario, an Ultra-Reliable and Low Latency Communications (URLLC) scenario or a massive Machine Type Communications (mMTC) scenario. The maximum downlink throughput in the eMBB scenario may reach 20 Gbps, and the maximum throughput of the uplink data may reach 10 Gbps. The URLLC may support a BLER (Block Error Rate) with a minimum reliability of 10e−5 and the shortest delay of uplink and downlink may reach 0.5 milliseconds; and mMTC enables the device battery to be used for years without power off.

The transmitting end needs to send the data sequence to be transmitted with a transmission length of 8192 bits to the receiving end. The transmitting end and the receiving end are not limited to the above types, the channel coding code rate is ⅔, and the channel coding adopts the structured LDPC code. The basic matrix set of the structured LDPC code provided by the system includes D (=8) basic matrices, and the system column number of the basic matrix are respectively shown as follows:

$$HB0 = \begin{matrix} 314 & 228 & 308 & 142 & 331 & 243 & 382 & 161 & 508 & -1 & -1 & -1 \\ 199 & 407 & 399 & 362 & 245 & 265 & 163 & 214 & 350 & 10 & -1 & -1 \\ 363 & 281 & 382 & 241 & 117 & 498 & 492 & 125 & 455 & 307 & 333 & -1 \\ 61 & 413 & 22 & 102 & 80 & 406 & 145 & 507 & 76 & 452 & 234 & 463 \end{matrix}$$

$$HB1 = \begin{matrix} 280 & 22 & 342 & 417 & 35 & 32 & 377 & 76 & 191 & -1 & -1 & -1 & -1 & -1 & -1 \\ 5 & 3 & 115 & 200 & 429 & 269 & 352 & 434 & 240 & 149 & -1 & -1 & -1 & -1 & -1 \\ 236 & 8 & 302 & 90 & 358 & 287 & 354 & 395 & 276 & 277 & 241 & -1 & -1 & -1 & -1 \\ 222 & 14 & 185 & 229 & 102 & 275 & 275 & 199 & 361 & 169 & 416 & 131 & -1 & -1 & -1 \\ 419 & 480 & 406 & 501 & 269 & 320 & 402 & 126 & 166 & 113 & 25 & 2 & 265 & -1 & -1 \\ 490 & 308 & 357 & 467 & 180 & 397 & 288 & 133 & 400 & 395 & 369 & 3 & 259 & 411 & -1 \\ 154 & 9 & 276 & 192 & 111 & 136 & 427 & 288 & 498 & 399 & 126 & 134 & 162 & 498 & 384 & -1 \\ 484 & 189 & 146 & 476 & 435 & 145 & 18 & 22 & 144 & 23 & 389 & 425 & 58 & 57 & 289 & 344 \end{matrix}$$

$$HB2 = \begin{matrix} 123 & 218 & 7 & 181 & 180 & 225 & 139 & 73 & 186 & -1 & -1 & -1 \\ 139 & 11 & 111 & 255 & 9 & 204 & 247 & 117 & 81 & 164 & -1 & -1 \\ 209 & 64 & 98 & 179 & 104 & 225 & 24 & 17 & 194 & 106 & 7 & -1 \\ 112 & 13 & 190 & 27 & 202 & 151 & 205 & 233 & 245 & 20 & 249 & 187 \end{matrix}$$

$$HB3 = \begin{matrix} 146 & 56 & 30 & 16 & 77 & 247 & 193 & 84 & 56 & -1 & -1 & -1 & -1 & -1 & -1 \\ 224 & 17 & 3 & 176 & 150 & 223 & 78 & 106 & 36 & 17 & -1 & -1 & -1 & -1 & -1 \\ 232 & 203 & 188 & 251 & 154 & 223 & 51 & 58 & 20 & 36 & 103 & -1 & -1 & -1 & -1 \\ 161 & 77 & 49 & 242 & 26 & 50 & 218 & 45 & 96 & 71 & 206 & 131 & -1 & -1 & -1 \\ 206 & 60 & 120 & 63 & 6 & 126 & 184 & 20 & 241 & 10 & 226 & 16 & 216 & -1 & -1 \\ 243 & 246 & 98 & 45 & 227 & 241 & 202 & 166 & 213 & 232 & 252 & 161 & 52 & 129 & -1 \\ 247 & 244 & 115 & 219 & 114 & 92 & 179 & 6 & 0 & 20 & 64 & 46 & 182 & 130 & 195 & -1 \\ 221 & 144 & 96 & 84 & 162 & 166 & 5 & 164 & 222 & 64 & 144 & 14 & 147 & 35 & 75 & 218 \end{matrix}$$

$$HB4 = \begin{matrix} 10 & 78 & 31 & 10 & 67 & 103 & 19 & 105 & 68 & -1 & -1 & -1 \\ 100 & 31 & 126 & 94 & 50 & 61 & 37 & 105 & 18 & 25 & -1 & -1 \\ 111 & 21 & 71 & 92 & 80 & 0 & 106 & 113 & -1 & 35 & 96 & -1 \\ 44 & -1 & 11 & 13 & 31 & 75 & 2 & 121 & 47 & 83 & 15 & 66 \end{matrix}$$

$$HB5 = \begin{matrix} 107 & 1 & 103 & 68 & 112 & 50 & 35 & 98 & 104 & -1 & -1 & -1 & -1 & -1 & -1 & -1 \\ 21 & 107 & 9 & 21 & 72 & 57 & 92 & 72 & 36 & 32 & -1 & -1 & -1 & -1 & -1 & -1 \\ 28 & 91 & 114 & 90 & 23 & 101 & 14 & 23 & 5 & 71 & 58 & -1 & -1 & -1 & -1 & -1 \\ 19 & 111 & 54 & 12 & 88 & 106 & 6 & 44 & 95 & 110 & 30 & 33 & -1 & -1 & -1 & -1 \\ 81 & 32 & 70 & 113 & 126 & 102 & 19 & 84 & 76 & 113 & 25 & 83 & 69 & -1 & -1 & -1 \\ 81 & 42 & 124 & 121 & 35 & 14 & 45 & 75 & 96 & 29 & 32 & 37 & 56 & 73 & -1 & -1 \\ 120 & 86 & 107 & 52 & 2 & 124 & 92 & 20 & 36 & 62 & 35 & 101 & 68 & 98 & 9 & -1 \\ 35 & 125 & 70 & 72 & 119 & 49 & 123 & 31 & 35 & 1 & 105 & 31 & 16 & 75 & 30 & 116 \end{matrix}$$

$$HB6 = \begin{matrix} 3 & 25 & 40 & 45 & 24 & 17 & 19 & 6 & 11 & -1 & -1 & -1 \\ 7 & 12 & 38 & 43 & 19 & 47 & 26 & 29 & 22 & 58 & -1 & -1 \\ 58 & 30 & 60 & 49 & 63 & 1 & 43 & 49 & 61 & 49 & 42 & -1 \\ 26 & 56 & 9 & 57 & 41 & 23 & 19 & 21 & 62 & 62 & 31 & 49 \end{matrix}$$

$$HB7 = \begin{matrix} 3 & 14 & 45 & 43 & 0 & 53 & 45 & 61 & 63 & -1 & -1 & -1 & -1 & -1 & -1 & -1 \\ 53 & 24 & 14 & 16 & 39 & 36 & 56 & 11 & 25 & 40 & -1 & -1 & -1 & -1 & -1 & -1 \\ 60 & 3 & 55 & 36 & 41 & 5 & 4 & 47 & 11 & 38 & 24 & -1 & -1 & -1 & -1 & -1 \\ 41 & 5 & 0 & 54 & 23 & 31 & 23 & 34 & 33 & 37 & 36 & 26 & -1 & -1 & -1 & -1 \\ 40 & 34 & 22 & 48 & 13 & 51 & 11 & 39 & 41 & 38 & 51 & 58 & 16 & -1 & -1 & -1 \\ 29 & 37 & 43 & 8 & 22 & 13 & 60 & 51 & 9 & 2 & 51 & 55 & 30 & 21 & -1 & -1 \\ 40 & 32 & 16 & 48 & 39 & 55 & 30 & 33 & 0 & 8 & 17 & 7 & 44 & 17 & 30 & -1 \\ 52 & 56 & 58 & 14 & 11 & 34 & 7 & 8 & 2 & 39 & 22 & 23 & 48 & 21 & 58 & -1 \end{matrix}$$

8 basic matrices constitute 4 basic matrix subsets, for example, HB0 and HB1 constitute a basic matrix subset 0, HB2 and HB3 constitute a basic matrix subset 1, HB4 and HB5 constitute a basic matrix subset 2, and HB6 and HB7 constitute a basic matrix subset 3. The extension factors corresponding to the four basic matrix subsets are: [512 256 128 64], respectively. The dimension of the $i^{th}$ basic matrix of D(=8) basic matrices is: the matrix column number is NBi, the matrix row number is MBi, and matrix system column number is KBi, where i=0, 1, . . . , (D−1). The element values in the matrix are all smaller than the extension factor, wherein the matrix column number NBi, the matrix row number MBi, the matrix system column number KBi, the code rate Ri, and the extension factor Zi are as shown in Table 1.

TABLE 1 parameters of the basic matrix

| parameter | HB0 | HB1 | HB2 | HB3 | HB4 | HB5 | HB6 | HB7 |
|---|---|---|---|---|---|---|---|---|
| NBi | 12 | 16 | 12 | 16 | 12 | 16 | 12 | 16 |
| MBi | 4 | 8 | 4 | 8 | 4 | 8 | 4 | 8 |
| KBi | 8 | 8 | 8 | 8 | 8 | 8 | 8 | 8 |
| Ri | ⅔ | ½ | ⅔ | ½ | ⅔ | ½ | ⅔ | ½ |
| Zi | 512 | 512 | 256 | 256 | 128 | 128 | 64 | 64 |

As can be seen from the LDPC code parameters provided above, the supported maximum code length is KB*Zmax=8*512=4096. The above basic matrix includes a first-type element and a second-type element, wherein the first-type element value is represented by '−1', and the second-type element value is represented by an integer value between 0 to Z−1. The first-type element corresponds to an all-zero square matrix, and the second-type element corresponds to a matrix obtained by means of a cyclic shift of the unit matrix corresponding to the value of the second-type element, and the dimensions of the all-zero square matrix and the unit matrix are equal. The parity check matrix of the LDPC code can be obtained by replacing the first-type element and the second-type element with a corresponding all-zero square matrix or a unit matrix shift matrix.

Figure 5:
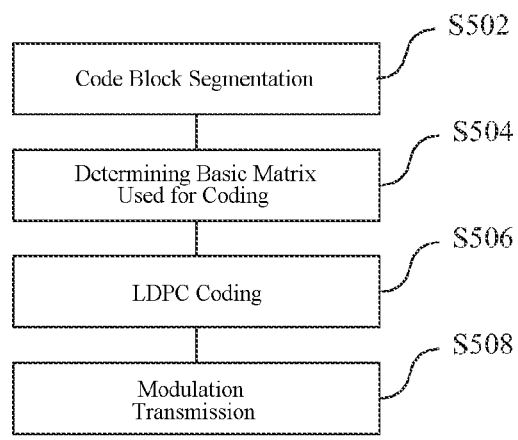
FIG. 5 is a flow chart of a coding method of a LDPC code of a transmitting end according to an alternative embodiment of the present disclosure.
Figure 9:
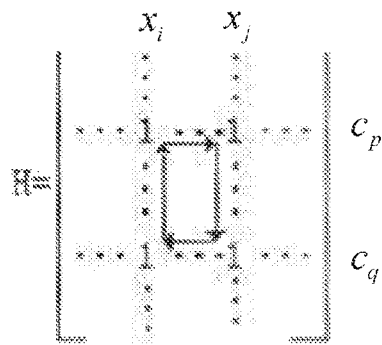
FIG. 9 is a third schematic diagram of a segment of a bipartite graph of a check matrix according to an alternative embodiment of the present disclosure.
Figure 10:
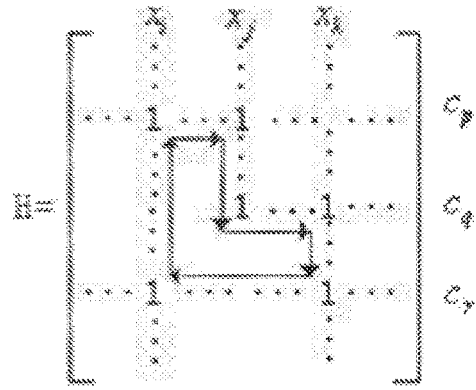
FIG. 10 is a fourth schematic diagram of a segment of a bipartite graph of a check matrix according to an alternative embodiment of the present disclosure.
Figure 11:
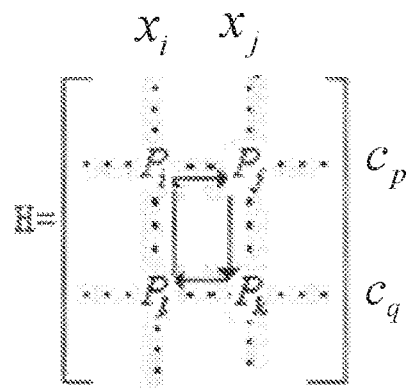
FIG. 11 is a schematic diagram of a cyclic shift matrix having four unit matrices to constitute a short circle with a length of 4 in H according to an alternative embodiment of the present disclosure.

FIG. 5 is a flowchart of a coding method of a LDPC code of a transmitting end according to an alternative embodiment of the present disclosure. As shown in FIG. 5, the process includes the following steps:

Step S502: code block segmentation, i.e., performing code block segmentation on the data sequence to be transmitted having a length of 8192 bits, so as to obtain 2 pieces of information sequence to be coded respectively having a length of 4096 bits.

Step S504: determining a basic matrix used for coding, i.e., determining the basic matrix used for the LDPC coding from a mother basic matrix; according to the sequence to be coded having a length of 4096, the basic matrix in the $0^{th}$ basic matrix subset is determined for coding, and according to the code rate R=⅔, the $0^{th}$ basic matrix HB0 of the $0^{th}$ basic matrix subset is determined for coding, i.e., the basic matrix used for decoding is determined according to the transport block size TBS (or described as the coding block size) and the code rate R.

Step S506: LDPC coding, i.e., performing LDPC coding on the information sequence to be coded according to the basic matrix used for coding, so as to obtain a LDPC codeword with a code rate of R=⅔, and a length of 4096/(⅔)=6144 bits; there are 2 pieces of to-be-coded information to be coded, 2 pieces of coding codeword are obtained by coding in total, and their total length is 6144*2=12288 bits.

Step S508: modulation transmission, i.e., constellation modulating 12288 codeword bits obtained after LDPC coding, for example, they are modulated into constellation symbols by QPSK (Quadrature Phase Shift Keying), mapped to corresponding resource blocks allocated by the system, and then transmitted.

The receiving and decoding process of the flexible structured LDPC code at the receiving end includes the following steps: S0: receiving and demodulating the received data, receiving the data sent to the receiving end on the resource block configured by the system, and then demodulating the data into LLR (Log Likelihood Ratio) information, with a total of 12288 LLR information; S1: LDPC coding, i.e., dividing 12288 LLR information decode blocks into obtain 2 pieces of data sequences to be decoded of the LDPC code blocks with a LLR information length of 6144, and then LDPC decoding these 2 pieces of data sequences to be decoded to obtain two pieces of decoding sequences with a length of 4096 bits, wherein a method of the basic matrix used for selecting the decoding code from the mother code basic matrix set is the same as the above method, and the basic matrix used for decoding is determined according to a combination of the transport block size TBS (or described as the code block size) and the code rate R; S2: decode block segmentation, i.e., combining the two pieces of decoding sequences with a length of 4096 bits after decoded and output in step S1 into one decode data block, i.e., obtaining the received data.

In addition to the above-mentioned transport block having a transport block size of 8192 bits length, other transport blocks of any length may be used, for example, a length of 400 bits. The basic matrix of the third basic matrix set is used for coding, so that the number of bits in the system is equal to KB*Z=64*8=512 bits at this time, and thus shortening coding is required. The shortening means that some dummy bits are filled in the data to be coded, which dummy bit may be any known bits such as 0 or 1 (both receiving and sending ends of the filled bit and the filled position are transparent, i.e., both are known). In this case, 512−400=112 bits is required to be filled, and then coded. The filled bits are not transmitted after coding, so the mother basic matrix set is used to support the coding block length of any bit length, which can effectively solve the flexibility problem. Meanwhile, when the code rate is not equal to ½ and ⅔ shown in the above Table 1, if the code rate is higher than ⅔, the basic matrix with a reference code rate of ⅔ is used for coding, and some bits are punched out. Punching off some bits means removing some bits (which may be system bits or check bits) in the LDPC code block, thereby supporting any codeword with a code rate greater than ⅔. When the code rate is between ½ and ⅔, the basic matrix with a reference code rate of ½ may be used for coding, and obtained by punching out some bits; as for the code rate lower than ½, the basis matrix with a reference code rate of ½ can be used for coding, and subjected to repeated multi-transmission of some bits to obtain a code with a corresponding code rate lower than ½. Therefore, the flexible structured LDPC coding method can support flexible design of the code length and the code rate, and is very suitable for channel coding schemes for communication systems.

During selection of the reference code rate, the basic matrix with a reference code rate larger than the actual code rate R may be selected for coding, and in this case, the coding method adopts shortening coding. A coding codeword that is lower than the reference code rate may also be obtained. As the coding codeword is lower than the reference code rate of ½, a basic matrix with the reference code rate of ½ may be used. Part of the filled bits is added in the sequence to be coded to perform coding, and then the filled bit is removed. It can be seen that the actual code rate will be lower than the reference code rate of ½. The implementation method for presenting different code rates is not limited to the above.

For determining the basic matrix used for LDPC coding from the mother basic matrix set, the basic matrix used for LDPC coding is determined according to at least one of the following parameters: a transport block size TBS, an application scenario, a user UE type, a frequency band, and a combination of the transport block size TBS and a code rate R, a channel type, a data transmission direction, a combination of a TBS index number and the number resources NRB, a combination of a MCS index number and the number of resources NRB, a combination of the code rate R and the number of resources NRB, a bandwidth size; wherein the transport block size TBS is an integer that is greater than 0; wherein the application scenario includes eMBB, URLLC and mMTC; the user UE type includes at least two of the following: high-speed UE, low-speed UE, UE supporting IR-HARQ, UE without supporting IR-HARQ, low delayed UE and large throughput UE; the frequency band includes a system-configured frequency range; the code rate R is a real number greater than 0 and less than 1; the channel type includes a control channel and a data channel; the data transmission direction includes an uplink data and a downlink data; the TBS index number is used to index the transport block size TBS of various numbers of resources, in which the TBS index number is an integer greater than or equal to 0; the MCS index number is used to index the MCS scheme, and the MCS index number is an integer greater than or equal to 0; the number of resources NRB is the system-configured number of resource blocks; the bandwidth size is a real number greater than 0.

Alternatively, the transport block size TBS is an integer value in the TBS set, wherein the TBS set includes A subsets, and the subset index number is obtained in the TBS set according to the transport block size TBS, and the basic matrix subset used for LDPC coding is determined according to the obtained subset index number; wherein A is an integer greater than 0, the basic matrix subset includes at least one basic matrix, and the transport block size TBS is pre-configured by the system and is an integer greater than 0. One basic matrix used for LDPC coding is selected from the basic matrix subset according to the code rate R.

Alternatively, the frequency band is at least divided into B frequency bands: from 0 to C1 GHz, from C1 GHz to C2 GHz, . . . , from C(B−2) GHz to C(B−1) GHz, greater than C (B−1)) GHz, where B is an integer greater than 0, and C1, C2, . . . , C(B−1) are real numbers greater than 0, where C1<C2<C3< . . . <C(B−1).

Second Alternative Embodiment

The method proposed in this alternative embodiment may be used in an LTE mobile communication system or a future fifth generation mobile communication system or other wireless wired communication system, and the data transmission direction is that the base station sends data to the mobile user (downlink transmission service data), or The data transmission direction is that the mobile user transmits data to the base station (uplink transmission service data). The above communication system may also be a new radio access technology (NR) system. The NR system includes the following application scenarios: enhanced mobile broadband (eMBB) scenario, ultra-reliable low latency. The Ultra-Reliable and Low Latency Communications (URLLC) scenario and the Massive Machine Type Communications (MMTC) scenario.

The system is configured to configure three basic matrix sub-sets in the scenario of the above three, that is, the parent basic matrix set includes the above three basic matrix sub-sets, for example, the basic matrix sub-set 0 for the eMBB scenario, and the URL LC scenario for the URLLC scenario. The basic matrix sub-set 1 is used as the basic matrix sub-set 2 for the mMTC scene. The data volume of the eMBB scenario is very large and needs to support large-throughput data transmission. The data in the URLLC scenario needs to support ultra-high reliability and ultra-low latency communication. The data volume is small and can communicate in the first time. The real-time requirement is very high; mMTC needs Large coverage, small amount of data, no real-time communication. The system is configured to provide the basic matrix set in the three application scenarios as follows. A total of three basic matrix sub-sets are included, and each sub-set includes one basic matrix, which is described as follows:

The basic matrix HB0 of the eMBB scenario, with a maximum extension factor of 1280:

| 0 | 0 | 0 | 0 | 0 | 0 | 0 | 0 | 0 | −1 | −1 | −1 | −1 | −1 | −1 | −1 | −1 | −1 | −1 | −1 | −1 | −1 | −1 | −1 | −1 | −1 |
|---|---|---|---|---|---|---|---|---|---|---|---|---|---|---|---|---|---|---|---|---|---|---|---|---|---|
| 567 | −1 | 82 | 962 | 1207 | 731 | 342 | 1 | 851 | 0 | −1 | −1 | −1 | −1 | −1 | −1 | −1 | −1 | −1 | −1 | −1 | −1 | −1 | −1 | −1 | −1 |
| 739 | 147 | 523 | 871 | 686 | 427 | 1235 | 2 | −1 | 383 | 0 | −1 | −1 | −1 | −1 | −1 | −1 | −1 | −1 | −1 | −1 | −1 | −1 | −1 | −1 | −1 |
| −1 | 1039 | 594 | 681 | 226 | 1135 | 508 | 2 | −1 | −1 | 443 | 0 | −1 | −1 | −1 | −1 | −1 | −1 | −1 | −1 | −1 | −1 | −1 | −1 | −1 | −1 |
| 1168 | −1 | −1 | 1241 | 383 | −1 | 1 | −1 | −1 | −1 | −1 | 729 | 0 | −1 | −1 | −1 | −1 | −1 | −1 | −1 | −1 | −1 | −1 | −1 | −1 | −1 |
| −1 | 1064 | 18 | −1 | 762 | −1 | −1 | −1 | −1 | −1 | −1 | −1 | −1 | 0 | −1 | −1 | −1 | −1 | −1 | −1 | −1 | −1 | −1 | −1 | −1 | −1 |
| 2 | 977 | 1049 | −1 | −1 | 775 | −1 | −1 | −1 | −1 | −1 | −1 | −1 | −1 | 0 | −1 | −1 | −1 | −1 | −1 | −1 | −1 | −1 | −1 | −1 | −1 |
| 728 | 69 | −1 | 1081 | −1 | 1 | 320 | −1 | −1 | −1 | −1 | −1 | −1 | −1 | −1 | 0 | −1 | −1 | −1 | −1 | −1 | −1 | −1 | −1 | −1 | −1 |
| 788 | 1192 | 328 | −1 | −1 | −1 | −1 | −1 | 69 | −1 | −1 | −1 | −1 | −1 | −1 | −1 | 0 | −1 | −1 | −1 | −1 | −1 | −1 | −1 | −1 | −1 |
| 220 | 2 | −1 | −1 | −1 | −1 | −1 | −1 | 713 | −1 | −1 | −1 | −1 | −1 | −1 | −1 | −1 | 0 | −1 | −1 | −1 | −1 | −1 | −1 | −1 | −1 |
| 941 | 183 | −1 | −1 | −1 | −1 | −1 | −1 | −1 | 560 | −1 | −1 | −1 | −1 | −1 | −1 | −1 | −1 | 0 | −1 | −1 | −1 | −1 | −1 | −1 | −1 |
| 343 | 317 | −1 | −1 | −1 | 1265 | −1 | −1 | −1 | −1 | −1 | −1 | −1 | −1 | −1 | −1 | −1 | −1 | −1 | 0 | −1 | −1 | −1 | −1 | −1 | −1 |
| 80 | 372 | −1 | 319 | −1 | −1 | 1225 | −1 | −1 | −1 | −1 | 86 | −1 | −1 | −1 | −1 | −1 | −1 | −1 | −1 | 0 | −1 | −1 | −1 | −1 | −1 |
| −1 | 607 | 378 | −1 | −1 | −1 | −1 | 671 | −1 | −1 | −1 | −1 | −1 | −1 | −1 | −1 | −1 | −1 | −1 | −1 | −1 | 0 | −1 | −1 | −1 | −1 |
| 965 | −1 | −1 | 475 | −1 | −1 | −1 | −1 | −1 | −1 | −1 | −1 | −1 | −1 | −1 | −1 | −1 | −1 | −1 | −1 | −1 | −1 | 0 | −1 | −1 | −1 |
| 353 | 471 | −1 | −1 | −1 | −1 | 1031 | −1 | −1 | −1 | −1 | −1 | −1 | −1 | −1 | −1 | −1 | −1 | −1 | −1 | −1 | −1 | −1 | 0 | −1 | −1 |
| 2 | −1 | −1 | −1 | −1 | −1 | −1 | 171 | −1 | −1 | −1 | −1 | −1 | −1 | −1 | −1 | −1 | −1 | −1 | −1 | −1 | −1 | −1 | −1 | 0 | −1 |
| −1 | 619 | −1 | −1 | −1 | −1 | −1 | −1 | 410 | −1 | −1 | −1 | −1 | −1 | −1 | −1 | −1 | −1 | −1 | −1 | −1 | −1 | −1 | −1 | −1 | 0 |

The basic matrix HB1 of the URLLC scenario, with a maximum extension factor of 128:

| 0 | 0 | 0 | 0 | 0 | 0 | 0 | 0 | 0 | −1 | −1 | −1 | −1 | −1 | −1 | −1 | −1 | −1 | −1 | −1 | −1 | −1 | −1 | −1 | −1 | −1 |
|---|---|---|---|---|---|---|---|---|---|---|---|---|---|---|---|---|---|---|---|---|---|---|---|---|---|
| 121 | −1 | 78 | 34 | 24 | 124 | 40 | 114 | 80 | 0 | −1 | −1 | −1 | −1 | −1 | −1 | −1 | −1 | −1 | −1 | −1 | −1 | −1 | −1 | −1 | −1 |
| 44 | 10 | 122 | 8 | 88 | 107 | 79 | 88 | −1 | 113 | 0 | −1 | −1 | −1 | −1 | −1 | −1 | −1 | −1 | −1 | −1 | −1 | −1 | −1 | −1 | −1 |
| −1 | 23 | 18 | 14 | 90 | 43 | 12 | 74 | −1 | −1 | 73 | 0 | −1 | −1 | −1 | −1 | −1 | −1 | −1 | −1 | −1 | −1 | −1 | −1 | −1 | −1 |
| 16 | −1 | −1 | 88 | 100 | −1 | 28 | −1 | −1 | −1 | −1 | 111 | 0 | −1 | −1 | −1 | −1 | −1 | −1 | −1 | −1 | −1 | −1 | −1 | −1 | −1 |
| −1 | 16 | 38 | −1 | 122 | −1 | −1 | −1 | −1 | −1 | −1 | −1 | −1 | 0 | −1 | −1 | −1 | −1 | −1 | −1 | −1 | −1 | −1 | −1 | −1 | −1 |
| 28 | 16 | 80 | −1 | −1 | 84 | −1 | −1 | −1 | −1 | −1 | −1 | −1 | −1 | 0 | −1 | −1 | −1 | −1 | −1 | −1 | −1 | −1 | −1 | −1 | −1 |
| 16 | 1 | −1 | 73 | −1 | 91 | 64 | −1 | −1 | −1 | −1 | −1 | −1 | −1 | −1 | 0 | −1 | −1 | −1 | −1 | −1 | −1 | −1 | −1 | −1 | −1 |
| 0 | 40 | 8 | −1 | −1 | −1 | −1 | −1 | 29 | −1 | −1 | −1 | −1 | −1 | −1 | −1 | 0 | −1 | −1 | −1 | −1 | −1 | −1 | −1 | −1 | −1 |
| 112 | 22 | −1 | −1 | −1 | −1 | −1 | −1 | 107 | −1 | −1 | −1 | −1 | −1 | −1 | −1 | −1 | 0 | −1 | −1 | −1 | −1 | −1 | −1 | −1 | −1 |
| 28 | 43 | −1 | −1 | 2 | −1 | −1 | −1 | −1 | 98 | −1 | −1 | −1 | −1 | −1 | −1 | −1 | −1 | 0 | −1 | −1 | −1 | −1 | −1 | −1 | −1 |
| 97 | 96 | −1 | −1 | −1 | 104 | −1 | −1 | −1 | −1 | −1 | −1 | −1 | −1 | −1 | −1 | −1 | −1 | −1 | 0 | −1 | −1 | −1 | −1 | −1 | −1 |
| 0 | 36 | −1 | 92 | −1 | −1 | 58 | −1 | −1 | −1 | −1 | 12 | −1 | −1 | −1 | −1 | −1 | −1 | −1 | −1 | 0 | −1 | −1 | −1 | −1 | −1 |
| −1 | 44 | 14 | −1 | −1 | −1 | −1 | 13 | −1 | −1 | −1 | −1 | −1 | −1 | −1 | −1 | −1 | −1 | −1 | −1 | −1 | 0 | −1 | −1 | −1 | −1 |
| 122 | −1 | −1 | 115 | −1 | −1 | −1 | −1 | −1 | −1 | −1 | −1 | −1 | −1 | −1 | −1 | −1 | −1 | −1 | −1 | −1 | −1 | 0 | −1 | −1 | −1 |
| 105 | 123 | −1 | −1 | −1 | −1 | 56 | −1 | −1 | −1 | −1 | −1 | −1 | −1 | −1 | −1 | −1 | −1 | −1 | −1 | −1 | −1 | −1 | 0 | −1 | −1 |

-continued

```
28 -1 -1 -1 -1 -1 -1 -1 26 -1 -1 -1 -1 -1 -1 -1 -1 -1 -1 -1 -1 -1 -1  0 -1
-1 21 -1 -1 -1 -1 -1 -1 -1 26 -1 -1 -1 -1 -1 -1 -1 -1 -1 -1 -1 -1 -1 -1  0
```

The basic matrix HB1 of the mMTC scenario, with a maximum extension factor of 128:

```
 0   0   0   0   0   0   0   0   0  -1  -1  -1  -1  -1  -1  -1  -1  -1  -1  -1  -1  -1  -1  -1
62  -1  86  62  16  87  32  46  56   0  -1  -1  -1  -1  -1  -1  -1  -1  -1  -1  -1  -1  -1  -1
52  33   2 104 124  81  26   8  -1  89   0  -1  -1  -1  -1  -1  -1  -1  -1  -1  -1  -1  -1  -1
-1 127 104  22  32  97  16  16  -1  -1  41   0  -1  -1  -1  -1  -1  -1  -1  -1  -1  -1  -1  -1
80  -1  -1  33  18  -1  89  -1  -1  -1  -1  33   0  -1  -1  -1  -1  -1  -1  -1  -1  -1  -1  -1
-1  24  36  -1  58  -1  -1  -1  -1  -1  -1  -1   0  -1  -1  -1  -1  -1  -1  -1  -1  -1  -1  -1
48 124  89  -1  -1   6  -1  -1  -1  -1  -1  -1  -1   0  -1  -1  -1  -1  -1  -1  -1  -1  -1  -1
48  25  -1 124  -1  13  64  -1  -1  -1  -1  -1  -1  -1   0  -1  -1  -1  -1  -1  -1  -1  -1  -1
52   8  88  -1  -1  -1  -1  -1   2  -1  -1  -1  -1  -1  -1   0  -1  -1  -1  -1  -1  -1  -1  -1
24  46  -1  -1  -1  -1  -1  -1  -1 108  -1  -1  -1  -1  -1  -1   0  -1  -1  -1  -1  -1  -1  -1
90  33  -1  -1 113  -1  -1  -1  -1  -1  32  -1  -1  -1  -1  -1  -1   0  -1  -1  -1  -1  -1  -1
 4 104  -1  -1  -1  53  -1  -1  -1  -1  -1  -1  -1  -1  -1  -1  -1  -1   0  -1  -1  -1  -1  -1
16  16  -1   0  -1  -1  68  -1  -1  -1  -1 126  -1  -1  -1  -1  -1  -1  -1   0  -1  -1  -1  -1
-1 107  92  -1  -1  -1  24  -1  -1  -1  -1  -1  -1  -1  -1  -1  -1  -1  -1  -1   0  -1  -1  -1
90  -1  -1 108  -1  -1  -1  -1  -1  -1  -1  -1  -1  -1  -1  -1  -1  -1  -1  -1  -1   0  -1  -1
111  0  -1  -1  -1  -1 114  -1  -1  -1  -1  -1  -1  -1  -1  -1  -1  -1  -1  -1  -1  -1   0  -1
26  -1  -1  -1  -1  -1  -1  34  -1  -1  -1  -1  -1  -1  -1  -1  -1  -1  -1  -1  -1  -1   0  -1
-1  27  -1  -1  -1  -1  -1  -1  80  -1  -1  -1  -1  -1  -1  -1  -1  -1  -1  -1  -1  -1  -1   0
```

The above basic matrix is not limited to the above-described basic matrix, and can also be described as a basic matrix of other arbitrary dimensions and data sizes. The transmitting end needs to support one of the above scenarios, and the receiving end also needs to support one of the above scenarios. Assume that the above-mentioned transmitting end is a base station side, and supports the above three scenarios. When the receiving end (terminal) supports only one of the application scenarios, if the transmitting end is to communicate with the receiving end (terminal), then it is necessary to use the same communication mode of the receiving end (terminal), i.e., the structured LDPC encoding is performed using the basic matrix in the same application scenario. For example, if the terminal A only supports the eMBB application scenario, the terminal sends a corresponding instruction to the base station, which instruction includes at least 2 bits for indicating at least the application scenario of the terminal. For example, '00' indicates an eMBB application scenario, '01' indicates a URLLC application scenarios, and '10' indicates an mMTC application scenario. At this time, the terminal sends an instruction '00' to the base station, and then communicates with the base station, using the basic matrix HB0 (the $0^{th}$ basic matrix subset) as described above. If data needs to be transmitted, the data is subjected to code block segmentation, determination of a basic matrix with a structured LDPC encoding, LDPC encoding, modulation, and transmission. The explanation of the above signaling for the base station side is consistent with that for the terminal side. The above signaling is not limited to the above form.

If the terminal supports the above three scenarios, during performing the communication process, the application scenario may be arbitrarily changed as needed. At this time, the application scenario changes, and the base station side needs to be notified, i.e., to send the instruction and then the communication is performed. It can be seen from the basic matrices in the above three application scenarios that positions of the non-1 elements (the second-type element) in these three basic matrices are the same, and there is a positive integer multiple relationship between maximum extension factors, which has advantage in that the structured LDPC code may use a unified decoder, and thus may be mutually compatible, so that apparatuses of the above three application scenarios can share the same set of apparatuses and simplify hardware resources.

The base station side determines the basic LDPC coding basic matrix subset according to the data type of the application scenario that the terminal user (UE) needs to transmit (there is only one basic matrix in the subset in this embodiment), and then selects the corresponding basic matrix or modifies the basic matrix according to the transport block size to be transmitted. The modified basic matrix refers to modifying the second-type element in the basic matrix to fit the current LDPC coding and the corresponding extension factor.

The application scenario in this embodiment is not limited to the above three types, and may also include other high-speed mobile scenarios, real-time communication application scenarios, large-throughput data transmission scenarios, and the like, and is not limited to these scenarios. Each scenario may correspond to a different structured LDPC code basic matrix parameter and extension factor.

Third Alternative Embodiment

The method proposed in this alternative embodiment may be used in a LTE mobile communication system or a future fifth generation mobile communication system or other wireless wired communication system, and the data transmission direction is a direction that the base station sends data to the mobile user (downlink transmission service data), or is a direction that the mobile user sends data to the base station (uplink transmission service data). Which type of LDPC code coding basic matrix subset needs to be used is determined according to the user UE type. The user UE type include: high-speed UE, low-speed UE, UE supporting IR-HARQ, UE without supporting IR-HARQ, low delayed UE and large throughput UE. The user UE type may be at least 2 of all types, and is not limited to the user UE type described above.

The system is configured to provide one basic matrix subset for each user UE type, for example, the following two types: a UE supporting IR-HARQ and a UE without supporting IR-HARQ. The basic matrix sub-set adopted by the UE supporting IR-HARQ is HB0, which includes 4 basic matrices; the basic matrix sub-set adopted by the UE without supporting IR-HARQ is HB1, which includes 4 basic matrices.

The receiving end sends an instruction to notify the transmitting end that the data supporting the IR-HARQ may be sent, and the data sent by the transmitting end to the receiving end supports IR-HARQ, i.e., the data is coded by using the basic matrix supporting IR-HARQ. That is to say, when determining the basic matrix used by the LDPC coding, the transmitting end selects an appropriate basic matrix from the basic matrix subset supporting IR-HARQ for coding; and if the receiving end indicates that IR-HARQ is not supported, the transmitting end selects an appropriate basic matrix from the basix matrix subset without supporting IR-HARQ for coding when determining the basic matrix used by the LDPC coding. The beneficial effect of such operation is that the communication system can support different UE types, some UEs do not need to improve the performance of retransmitted data or are relatively low-end, then they may not support IR-HARQ data, and if some UEs may be relatively high-end or has more advanced technology, IR-HARQ data could be supported, thereby making the system more flexible and diverse.

With respect to the basic matrix subset HB0 of the UE supporting the IR-HARQ and the basic matrix subset HB1 of the UE without supporting the IR-HARQ, the basic matrix subset HB1 of the UE without supporting the IR-HARQ exists in the basic matrix subset HB0 of the UE supporting the IR-HARQ, for example, the $i^{th}$ basic matrix in HB1 is consist of the $i^{th}$ partial row of the basic matrix in HB1, where i=0, 1, 2, 3. It may be described as . . . Therefore, the UE supporting the IR-HARQ and the UE without supporting the IR-HARQ may still share a set of apparatuses, i.e., the first transmitted data is identical, but the transmitted data is different. Also, the retransmitted data supporting the IR-HARQ contains relatively more check bit data, and retransmitted data and the first transmitted data that does not support IR-HARQ are the same.

Fourth Embodiment

This embodiment provides a LDPC coding and decoding method, which can be used in an NR (New Radio Access Technology) communication system, and includes the following steps:

1. determining a basic matrix used for low density parity check LDPC coding from a mother basic matrix set, wherein the basic matrix used for LDPC coding comprises a first-type element corresponding to an all-zero square matrix and a second-type element corresponding to a matrix obtained by means of a cyclic shift of a unit matrix according to a value of the second-type element, and wherein dimensions of the all-zero square matrix and the unit matrix are equal;

2. performing LDPC coding on an information sequence to be coded according to the basis matrix used for LDPC coding, and/or performing LDPC decoding on a data sequence to be decoded according to the basis matrix used for LDPC coding.

Alternatively, in the step 1, the mother basic matrix set comprises a plurality of basic matrix subsets, any one of basic matrix subsets {Hbi} comprises s basic matrices, and all column indices of any one of basic matrices Hbi constitutes a column index set ColSet, wherein the column index set is divided into two subsets Colsubset1 and Colsubset2 which are complementary to each other, Colsubset1 comprises Ci elements, Colsubset2 comprises Di elements, where i is used to indicate one basic matrix Hbi corresponding to one specific code length, and an extension factor corresponding to Hbi is Zi, where i=0, 1, . . . , (s−1), s is an integer that is greater than or equal to 2, and Ci and Di are integers that are greater than or equal to 1.

At the same time, a basic sub-matrix jointly indicated by all row indices of any one of the basic matrices Hbi and all column indices of Colsubset1 is Hbi(:,Colsubset1), a parity check matrix HL1i is obtained by matrix-extending in combination with the basic sub-matrix Hbi(:,Colsubset1) and an extension factor Zi, which parity check matrix HL1i has a girth of g; a basic sub-matrix jointly indicated by all row indices of the basic matrix Hbi and all column indices of Colsubset2 is Hbi(:,Colsubset2), a parity check matrix HL2i is obtained by matrix-extending in combination with the Hbi(:,Colsubset2) and a lift size Zi, which parity check matrix HL2i has a girth of g−2, all extension factors supported by the basic matrix subset present a relationship of Z1<=Z2<= . . . <=Zs, then D1>=D2>= . . . >=Ds, and C1<=C2<= . . . <=Cs; where g is equal to 6 or 8.

Alternatively, the column index set ColSet may also be divided into a third subset Colsubset3 and a fourth subset Colsubset4 which are complementary to each other, in which the Colsubset1 contains the Colsubset3, the Colsubset4 contains the Colsubset2, the Colsubset3 has Ei elements, and the Colsubset4 has Fi elements, where Ei and Fi are integers than are greater than or equal to 1, wherein any element k of the Colsubset2 and the Colsubset3 constitute a set Colsubset5, wherein a basic sub-matrix jointly indicated by all row indices and all column indices of Colsubset5 is Hbi(:,Colsubset5), a parity check matrix HL3i is obtained by matrix-extending in combination with Hbi(:,Colsubset5) and the extension factor Zi, which parity check matrix HL3i has a girth of 6, where i=0, 1, . . . , (s−1), and wherein all extension factors supported by the basic matrix subset present a relationship of Z1<=Z2<= . . . <=Zs, then F1>=F2>= . . . >=Fs, and E1<=E2<= . . . <=Es.

According to a LDPC coding and decoding method described above, an example of a basic matrix is provided, and a set of extension factors is Zset=[2 4 6 8 10 12 16 20 24 32 40 48 64 80 96 128 160 192 256 320 384 512 640 768 1024 1280].

HL2i is obtained by matrix-extending in combination with the Hbi(:,Colsubset2) and a lift size Zi, which parity check matrix HL2i has a girth of g−2, all extension factors sup-

```
  0    0    0   0    0   0    0   0   0  -1  -1  -1  -1  -1  -1  -1  -1  -1  -1  -1  -1  -1  -1  -1  -1  -1
 224  -1 1132 592 642 334 1000  1 864   0  -1  -1  -1  -1  -1  -1  -1  -1  -1  -1  -1  -1  -1  -1  -1  -1
1167 1023 926 542 780 642 291   6  -1 267   0  -1  -1  -1  -1  -1  -1  -1  -1  -1  -1  -1  -1  -1  -1  -1
 -1 1187 339 663 450 630 878   2  -1  -1 429   0  -1  -1  -1  -1  -1  -1  -1  -1  -1  -1  -1  -1  -1  -1
 847  -1  -1  -1 385 213   4  -1  -1  -1  -1 668   0  -1  -1  -1  -1  -1  -1  -1  -1  -1  -1  -1  -1  -1
 -1  248  -1   4  -1 310  -1  -1  -1  -1  -1  -1  -1   0  -1  -1  -1  -1  -1  -1  -1  -1  -1  -1  -1  -1
 458  91 171   2  -1  -1  -1  -1  -1  -1  -1  -1  -1  -1   0  -1  -1  -1  -1  -1  -1  -1  -1  -1  -1  -1
1244 747   2  -1 350  -1 954  -1  -1  -1  -1  -1  -1  -1  -1   0  -1  -1  -1  -1  -1  -1  -1  -1  -1  -1
 303 815  -1   6  -1  -1  -1  -1  -1  -1  -1  -1  -1  -1  -1  -1   0  -1  -1  -1  -1  -1  -1  -1  -1  -1
 695   4  -1  -1  -1  -1  -1  -1 224  -1  -1  -1  -1  -1  -1  -1  -1   0  -1  -1  -1  -1  -1  -1  -1  -1
 272 941  -1  -1  -1   4  -1  -1  -1  -1 854  -1  -1  -1  -1  -1  -1  -1   0  -1  -1  -1  -1  -1  -1  -1
 126  90 886  -1  -1  -1  -1  -1  -1  -1  -1  -1  -1  -1  -1  -1  -1  -1  -1   0  -1  -1  -1  -1  -1  -1
 601  72  -1  -1 287  -1 487  -1  -1  -1  -1  62  -1  -1  -1  -1  -1  -1  -1  -1   0  -1  -1  -1  -1  -1
 -1 1147  -1   2  -1  -1  -1 1000  -1  -1  -1  -1  -1  -1  -1  -1  -1  -1  -1  -1  -1   0  -1  -1  -1  -1
1074  -1  -1  -1 507  -1  -1  -1  -1  -1  -1  -1  -1  -1  -1  -1  -1  -1  -1  -1  -1  -1   0  -1  -1  -1
1208   2  -1  -1  -1  -1 905  -1  -1  -1  -1  -1  -1  -1  -1  -1  -1  -1  -1  -1  -1  -1  -1   0  -1  -1
 467  -1  -1  -1  -1  -1  -1 673  -1  -1  -1  -1  -1  -1  -1  -1  -1  -1  -1  -1  -1  -1  -1  -1   0  -1
 -1  -1  -1  -1  -1  -1  -1  -1  -1 772  -1  -1  -1  -1  -1  -1  -1  -1  -1  -1  -1  -1  -1  -1  -1   0
```

The set of extension factors is Zset=[2 4 6 8 10 12 16 20 24 32 40 48 64 80 96 128 160 192 256 320 384 512 640 768 1024 1280]. Each extension factor is taken from the set of extension factors Zset. The method for obtaining each basic matrix adopts the following equation:

$$(h_{ij}^b)_{modified} = \begin{cases} -1 & \text{if } (h_{ij}^b)_{uniform} == -1 \\ \lfloor (h_{ij}^b)_{uniform} \times Z / Z_{max} \rfloor & \text{else} \end{cases}$$

The mother basic matrix set includes 1 basic matrix subset, wherein any one of the basic matrix subsets {Hbi} includes s=26 base matrices, and all column indices of any one of basic matrices Hbi constitutes a column index set ColSet, wherein the column index set is divided into two subsets Colsubset1 and Colsubset2 which are complementary to each other, Colsubset1 comprises Ci elements, Colsubset2 comprises Di elements, where i is used to indicate one basic matrix Hbi corresponding to one specific code length, and an extension factor corresponding to Hbi is Zi, where i=0, 1, ..., (s−1), s is an integer that is greater than or equal to 2, and Ci and Di are integers that are greater than or equal to 1.

At the same time, a basic sub-matrix jointly indicated by all row indices of any one of the basic matrices Hbi and all column indices of Colsubset1 is Hbi(:,Colsubset1), a parity check matrix HL1i is obtained by matrix-extending in combination with the basic sub-matrix Hbi(:,Colsubset1) and an extension factor Zi, which parity check matrix HL1i has a girth of g; a basic sub-matrix jointly indicated by all row indices of the basic matrix Hbi and all column indices of Colsubset2 is Hbi(:,Colsubset2), a parity check matrix HL2i is obtained by matrix-extending in combination with the Hbi(:,Colsubset2) and a lift size Zi, which parity check matrix HL2i has a girth of g−2, all extension factors supported by the basic matrix subset present a relationship of $Z1 \leq Z2 \leq \ldots \leq Zs$, then $D1 \geq D2 \geq \ldots \geq Ds$, and $C1 \leq C2 \leq \ldots \leq Cs$; where g is equal to 6 or 8.

Alternatively, the column index set ColSet may also be divided into a third subset Colsubset3 and a fourth subset Colsubset4 which are complementary to each other, in which the Colsubset1 contains the Colsubset3, the Colsubset4 contains the Colsubset2, the Colsubset3 has Ei elements, and the Colsubset4 has Fi elements, where Ei and Fi are integers than are greater than or equal to 1, wherein any element k of the Colsubset2 and the Colsubset3 constitute a set Colsubset5, wherein a basic sub-matrix jointly indicated by all row indices and all column indices of Colsubset5 is Hbi(:,Colsubset5), a parity check matrix HL3i is obtained by matrix-extending in combination with Hbi(:,Colsubset5) and the extension factor Zi, which parity check matrix HL3i has a girth of 6, where i=0, 1, ..., (s−1), and wherein all extension factors supported by the basic matrix subset present a relationship of $Z1 \leq Z2 \leq \ldots \leq Zs$, then $F1 \geq F2 \geq \ldots \geq Fs$, and $E1 \leq E2 \leq \ldots \leq Es$.

The basic matrix described above has the following relationship: Z=[z1, z2, z3, z4, z5]=[4, 6, 8, 12, 16, 20], F=[F1, F2, F3, F4, F5]=[12*z1, 10*z2, 8*z3, 8*z4, 4*z5].

Fifth Embodiment

This embodiment provides a LDPC coding and decoding method, which can be used in an NR (New Radio Access Technology) communication system, and includes the following steps:

1. determining a basic matrix used for low density parity check LDPC coding from a mother basic matrix set, wherein the basic matrix used for LDPC coding comprises a first-type element corresponding to an all-zero square matrix and a second-type element corresponding to a matrix obtained by means of a cyclic shift of a unit matrix according to a value of the second-type element, and wherein dimensions of the all-zero square matrix and the unit matrix are equal;

2. performing LDPC coding on an information sequence to be coded according to the basis matrix used for LDPC coding, and/or performing LDPC decoding on a data sequence to be decoded according to the basis matrix used for LDPC coding.

Alternatively, in the step 1, the bipartite graph corresponding to the parity check matrix of any one of basic matrix subsets in the mother basic matrix set at least has a short circle with a girth of 4; a code length corresponding to $i^{th}$ basic matrix of the basic matrix subset is N1, the number of variable nodes with a girth of 4 corresponding to the code length of Ni is Bi, and the number of variable nodes with a girth of 6 corresponding to the code length of Ni is Ci, where i=0, 1, . . . , (s−1), wherein the code length has the following relationship of N0<=N1<= . . . <=N(s−1), then B0>=B1>= . . . >=B(s−1) and C0<=C1<= . . . <=C(s−1); wherein B0, B1, . . . , B(s−1), C0, C1, . . . , C(s−1) and N0, N1, . . . , N(s−1) are integers that are greater than 1, and s is an integer that is greater than or equal to 3.

Alternatively, in any one of basic matrix subset of the mother basic matrix set, a column weight of the basic matrix subset corresponding to the variable node with a girth of 6 is less than or equal to a column weight of the basic matrix subset corresponding to the variable node with a girth of 4.

Alternatively, the number of variable nodes of different code length with a girth of 6 are C0=K0*Z0, C1=K1*Z1, . . . , C(s−1)=K(s−1)*Z(s−1), respectively, wherein there is a relationship of Z0<=Z1<= . . . <=Z(s−1), then K0<=K1<= . . . <=K(s−1); wherein Z0, Z1, . . . , and Z(s−1) respectively correspond to extension factors of LDPC codes with code lengths of N0, N1, . . . , and N(s−1), and K0, K1 . . . , and K(s−1) is an integer that is greater than or equal to 1.

Alternatively, the bipartite graph of the parity check matrix of any one of basic matrix subsets in the mother basic matrix set has at least a short circle with a girth of 6 and does not have a short circle with a girth of 4, a code length corresponding to $i^{th}$ basic matrix of the basic matrix subset is N1, the number of variable nodes with a girth of 6 corresponding to the code length of Ni is Ci, and the number of variable nodes with a girth of 8 corresponding to the code length of Ni is Di, where i=0, 1, . . . , (s−1), wherein there is a relationship of N0<=N1<= . . . <=N(s−1), then C0>=C1>= . . . >=C(s−1), and D0<=D1<= . . . <=D(s−1), and wherein C0, C1, . . . , C(s−1), D0, D1, . . . , D(s−1) and N0, N1, . . . , N(s−1) are integers that are greater than 1, and s is an integer that is greater than or equal to 3.

Alternatively, in any one of basic matrix subset of the mother basic matrix set, a column weight of the basic matrix subset corresponding to the variable node with a girth of 8 is less than or equal to a column weight of the basic matrix subset corresponding to the variable node with a girth of 6.

Alternatively, the number of variable nodes of different code length with a girth of 8 are D1=K0*Z0, D1=K1*Z1, . . . , D(s−1)=K(s−1)*Z(s−1), respectively, wherein there is a relationship of Z0<=Z1<= . . . <=Z(s−1), then K1<=K2<= . . . <=Ks; wherein Z0, Z1, . . . , and Z(s−1) respectively correspond to extension factors of LDPC codes with code lengths of N0, N1, . . . , N(s−1), and K0, K1 . . . K(s−1) is an integer that is greater than or equal to 1.

According to the above, there is provided a mother basic matrix set, including one basic matrix subset having parameters of the matrix column number nb=26, the matrix row number mb=18, and the system column number kb=nb−mb=8. The basic matrix subset includes a basic matrix of 26 different extension factors. The basic matrix corresponding to the maximum extension factor of 1280 is as follows:

| 0 | 0 | 0 | 0 | 0 | 0 | 0 | 0 | 0 | −1 | −1 | −1 | −1 | −1 | −1 | −1 | −1 | −1 | −1 | −1 | −1 | −1 | −1 | −1 | −1 | −1 |
|---|---|---|---|---|---|---|---|---|---|---|---|---|---|---|---|---|---|---|---|---|---|---|---|---|---|
| 224 | −1 | 1132 | 592 | 642 | 334 | 1000 | 1 | 864 | 0 | −1 | −1 | −1 | −1 | −1 | −1 | −1 | −1 | −1 | −1 | −1 | −1 | −1 | −1 | −1 | −1 |
| 1167 | 1023 | 926 | 542 | 780 | 642 | 291 | 6 | −1 | 267 | 0 | −1 | −1 | −1 | −1 | −1 | −1 | −1 | −1 | −1 | −1 | −1 | −1 | −1 | −1 | −1 |
| −1 | 1187 | 339 | 663 | 450 | 630 | 878 | 2 | −1 | −1 | 429 | 0 | −1 | −1 | −1 | −1 | −1 | −1 | −1 | −1 | −1 | −1 | −1 | −1 | −1 | −1 |
| 847 | −1 | −1 | −1 | 385 | 213 | 4 | −1 | −1 | −1 | −1 | 668 | 0 | −1 | −1 | −1 | −1 | −1 | −1 | −1 | −1 | −1 | −1 | −1 | −1 | −1 |
| −1 | 248 | −1 | 4 | −1 | 310 | −1 | −1 | −1 | −1 | −1 | −1 | 0 | −1 | −1 | −1 | −1 | −1 | −1 | −1 | −1 | −1 | −1 | −1 | −1 | −1 |
| 458 | 91 | 171 | 2 | −1 | −1 | −1 | −1 | −1 | −1 | −1 | −1 | −1 | 0 | −1 | −1 | −1 | −1 | −1 | −1 | −1 | −1 | −1 | −1 | −1 | −1 |
| 1244 | 747 | 2 | −1 | 350 | −1 | 954 | −1 | −1 | −1 | −1 | −1 | −1 | −1 | 0 | −1 | −1 | −1 | −1 | −1 | −1 | −1 | −1 | −1 | −1 | −1 |
| 303 | 815 | −1 | 6 | −1 | −1 | −1 | −1 | −1 | −1 | −1 | −1 | −1 | −1 | −1 | 0 | −1 | −1 | −1 | −1 | −1 | −1 | −1 | −1 | −1 | −1 |
| 695 | 4 | −1 | −1 | −1 | −1 | −1 | −1 | 224 | −1 | −1 | −1 | −1 | −1 | −1 | −1 | 0 | −1 | −1 | −1 | −1 | −1 | −1 | −1 | −1 | −1 |
| 272 | 941 | −1 | −1 | −1 | 4 | −1 | −1 | −1 | −1 | 854 | −1 | −1 | −1 | −1 | −1 | −1 | 0 | −1 | −1 | −1 | −1 | −1 | −1 | −1 | −1 |
| 126 | 90 | 886 | −1 | −1 | −1 | −1 | −1 | −1 | −1 | −1 | −1 | −1 | −1 | −1 | −1 | −1 | −1 | 0 | −1 | −1 | −1 | −1 | −1 | −1 | −1 |
| 601 | 72 | −1 | −1 | 287 | −1 | 487 | −1 | −1 | −1 | −1 | 62 | −1 | −1 | −1 | −1 | −1 | −1 | −1 | 0 | −1 | −1 | −1 | −1 | −1 | −1 |
| −1 | 1147 | −1 | 2 | −1 | −1 | −1 | 1000 | −1 | −1 | −1 | −1 | −1 | −1 | −1 | −1 | −1 | −1 | −1 | −1 | 0 | −1 | −1 | −1 | −1 | −1 |
| 1074 | −1 | −1 | −1 | 507 | −1 | −1 | −1 | −1 | −1 | −1 | −1 | −1 | −1 | −1 | −1 | −1 | −1 | −1 | −1 | −1 | 0 | −1 | −1 | −1 | −1 |
| 1208 | 2 | −1 | −1 | −1 | −1 | 905 | −1 | −1 | −1 | −1 | −1 | −1 | −1 | −1 | −1 | −1 | −1 | −1 | −1 | −1 | −1 | 0 | −1 | −1 | −1 |
| 467 | −1 | −1 | −1 | −1 | −1 | −1 | 673 | −1 | −1 | −1 | −1 | −1 | −1 | −1 | −1 | −1 | −1 | −1 | −1 | −1 | −1 | −1 | 0 | −1 | −1 |
| −1 | −1 | −1 | −1 | −1 | −1 | −1 | −1 | 772 | −1 | −1 | −1 | −1 | −1 | −1 | −1 | −1 | −1 | −1 | −1 | −1 | −1 | −1 | −1 | −1 | 0 |

The set of extension factors is Zset=[2 4 6 8 10 12 16 20 24 32 40 48 64 80 96 128 160 192 256 320 384 512 640 768 1024 1280]. Each extension factor is taken from the extension factor set Zset. The method for obtaining each basic matrix adopts the following equation:

$$(h_{ij}^b)_{modified} = \begin{cases} -1 & \text{if } (h_{ij}^b)_{uniform} == -1 \\ \lfloor (h_{ij}^b)_{uniform} \times Z / Z_{max} \rfloor & \text{else} \end{cases}$$

Figure 15:
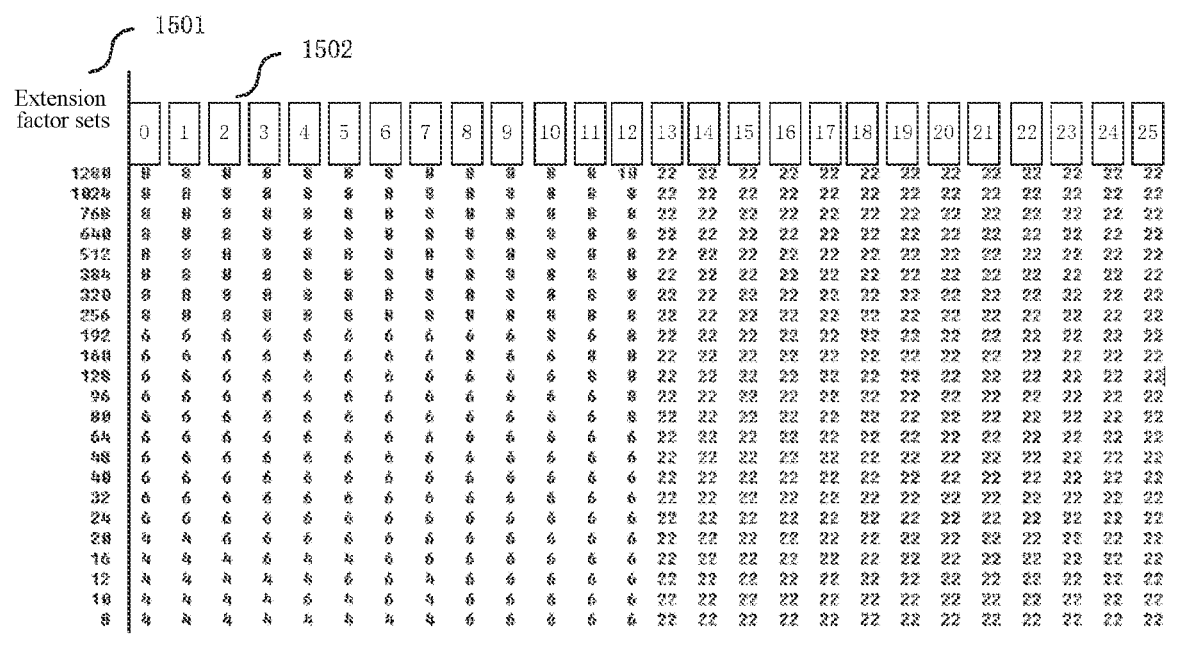

As shown in FIG. 15, a code length corresponding to the different extension factors indicated by the left column 1501 is a product of the extension factor and the system column number kb=8; the portion 1502 starting from the second column in FIG. 15 corresponds to different column index in the basic matrix, which is from 0 to 25. For example, if the last row corresponds to an extension factor of 8, the basic matrix with a girth of 4 corresponding to the extension factor of 8 has a column number of 8, and the basic matrix with a girth of 6 has a column number of 5, and the basic matrix with other girths has a column number of 22; as the extension factor is increased (or the corresponding code length is increased), the number of columns with a girth of 4 is gradually reduced, and the number of columns with girth of 6 is gradually increased. The number of girths may also be described as the number of extension factors, and it can be found that the girth of each column in the basic matrix satisfies the relationship described above.

Sixth Embodiment

This embodiment provides a LDPC coding and decoding method, which can be used in an NR (New Radio Access) Technology) communication system, and includes the following steps:

1. determining a basic matrix used for low density parity check LDPC coding from a mother basic matrix set, wherein the basic matrix used for LDPC coding comprises a first-type element corresponding to an all-zero square matrix and a second-type element corresponding to a matrix obtained by means of a cyclic shift of a unit matrix according to a value of the second-type element, and wherein dimensions of the all-zero square matrix and the unit matrix are equal;

2. performing LDPC coding on an information sequence to be coded according to the basis matrix used for LDPC coding, and/or performing LDPC decoding on a data sequence to be decoded according to the basis matrix used for LDPC coding.

Determining the basic matrix used for LDPC coding from the mother basic matrix set includes: determining the basic matrix used for the LDPC coding according to a transport block size TBS. The transport block size TBS is an element in a TBS set TBSSet, wherein the TBS set comprises A1 TBS subsets TBSsubset$_i$, while the mother basic matrix set comprises A1 basic matrix subsets Hb$_i$, each of TBS subsets corresponding to one basic matrix subset; wherein A1 is an integer that is greater than 1, there is no intersection between each two subsets of the A1 TBS subsets, and all of A1 TBS subsets constitute a complete TBS set, where i is an integer between 0 and A1−1; and determining the basic matrix used for LDPC coding from the mother basic matrix set comprises: determining the TBS subset TBSsubset$_i$ to which the transport block size TBS belongs, and then determining a basic matrix subset Hb$_i$ corresponding to the TBS subset TBSsubset$_i$.

Seventh Embodiment

This embodiment provides a LDPC coding and decoding method, which can be used in an NR (New Radio Access) Technology) communication system, and includes the following steps:

1. determining a basic matrix used for low density parity check LDPC coding from a mother basic matrix set, wherein the basic matrix used for LDPC coding comprises a first-type element corresponding to an all-zero square matrix and a second-type element corresponding to a matrix obtained by means of a cyclic shift of a unit matrix according to a value of the second-type element, and wherein dimensions of the all-zero square matrix and the unit matrix are equal;

2. performing LDPC coding on an information sequence to be coded according to the basis matrix used for LDPC coding, and/or performing LDPC decoding on a data sequence to be decoded according to the basis matrix used for LDPC coding.

Determining the basic matrix used for LDPC coding from the mother basic matrix set includes: determining the base matrix used for the LDPC coding according to a code rate R. The code rate R is an element in a code rate set CoderateSet, which comprises A2 code rates Coderate$_i$, where i is an integer between 0 and A2−1, while the mother basic matrix set comprises A2 basic matrix subsets Hb$_i$, each code rate corresponding to one basic matrix subset; wherein all of A2 code rates constitute the whole code rate set CoderateSet, where A2 is an integer that is greater than 1;

Determining the basic matrix used for LDPC coding from the mother basic matrix set comprises: determining the code rate Coderate$_i$ which is equal to the code rate R, and then determining the basic matrix subset Hb$_i$ corresponding to the code rate Coderate$_i$.

Eighth Embodiment

This embodiment provides a LDPC coding and decoding method, which can be used in an NR (New Radio Access) Technology) communication system, and includes the following steps:

1. determining a basic matrix used for low density parity check LDPC coding from a mother basic matrix set, wherein the basic matrix used for LDPC coding comprises a first-type element corresponding to an all-zero square matrix and a second-type element corresponding to a matrix obtained by means of a cyclic shift of a unit matrix according to a value of the second-type element, and wherein dimensions of the all-zero square matrix and the unit matrix are equal;

2. performing LDPC coding on an information sequence to be coded according to the basis matrix used for LDPC coding, and/or performing LDPC decoding on a data sequence to be decoded according to the basis matrix used for LDPC coding.

Determining the basic matrix used for LDPC coding from the mother basic matrix set includes: determining the basic matrix used for LDPC coding according to a frequency band. The frequency band is an element in a frequency band set FBSet which comprises A3 frequency bands, while the mother basic matrix set comprises A3 basic matrix subsets Hb$_i$, each frequency band corresponding to one basic matrix subset; wherein there is no intersection between each two of A3 frequency bands, and all of A3 frequency bands constitute the whole frequency band set FBSet, where A3 is an integer that is greater than 1 and i is an integer between 0 and A3−1; in the frequency band, if the carrier frequency of the signal is within the corresponding frequency range, then the basic matrix subset of the corresponding frequency band is considered to be employed. For example, there are A3=2 frequency bands, 4.8 GHz-5.0 GHz is the basic matrix Hb1 corresponding to frequency band 1, and 42 GHz-46 GHz is the basic matrix Hb2 corresponding to frequency band 2. If the carrier frequency of the transmitted signal is 4.9 GHz, then it corresponds to the frequency band 1, and the base matrix Hb1 is used.

Determining the basic matrix used for LDPC coding from the mother basic matrix set comprising: determining an index which belongs to the frequency band set FBSet with frequency bands, and then determining the basic matrix subset $Hb_i$ corresponding to the frequency band.

Ninth Embodiment

This embodiment provides a LDPC coding and decoding method, which can be used in an NR (New Radio Access Technology) communication system, and includes the following steps:

1. determining a basic matrix used for low density parity check LDPC coding from a mother basic matrix set, wherein the basic matrix used for LDPC coding comprises a first-type element corresponding to an all-zero square matrix and a second-type element corresponding to a matrix obtained by means of a cyclic shift of a unit matrix according to a value of the second-type element, and wherein dimensions of the all-zero square matrix and the unit matrix are equal;

2. performing LDPC coding on an information sequence to be coded according to the basis matrix used for LDPC coding, and/or performing LDPC decoding on a data sequence to be decoded according to the basis matrix used for LDPC coding.

Determining the basic matrix used for LDPC coding from the mother basic matrix set includes: determining the basic matrix used for LDPC coding according to a channel type. The channel type includes: a data channel and a signaling channel. The mother basic matrix set comprises a basic matrix subset used for data coding and a basic matrix subset used for signaling coding, and wherein determining the basic matrix used for LDPC coding from the mother basic matrix set comprises: determining the channel type, and then determining the basic matrix subset corresponding to the channel type.

Tenth Embodiment

This embodiment provides a LDPC coding and decoding method, which can be used in an NR (New Radio Access Technology) communication system, and includes the following steps:

1. determining a basic matrix used for low density parity check LDPC coding from a mother basic matrix set, wherein the basic matrix used for LDPC coding comprises a first-type element corresponding to an all-zero square matrix and a second-type element corresponding to a matrix obtained by means of a cyclic shift of a unit matrix according to a value of the second-type element, and wherein dimensions of the all-zero square matrix and the unit matrix are equal;

2. performing LDPC coding on an information sequence to be coded according to the basis matrix used for LDPC coding, and/or performing LDPC decoding on a data sequence to be decoded according to the basis matrix used for LDPC coding.

Determining the basic matrix used for LDPC coding from the mother basic matrix set includes: determining the basic matrix used for LDPC coding according to a data transmission direction. The mother basic matrix set includes: a basic matrix subset used for uplink data transmission and a basic matrix subset used for downlink data transmission, determining the basic matrix used for LDPC coding from the mother basic matrix set includes: determining the data transmission direction, and then determining the basic matrix subset corresponding to the data transmission direction.

Eleventh Embodiment

This embodiment provides a LDPC coding and decoding method, which can be used in an NR (New Radio Access Technology) communication system, and includes the following steps:

1. determining a basic matrix used for low density parity check LDPC coding from a mother basic matrix set, wherein the basic matrix used for LDPC coding comprises a first-type element corresponding to an all-zero square matrix and a second-type element corresponding to a matrix obtained by means of a cyclic shift of a unit matrix according to a value of the second-type element, and wherein dimensions of the all-zero square matrix and the unit matrix are equal;

2. performing LDPC coding on an information sequence to be coded according to the basis matrix used for LDPC coding, and/or performing LDPC decoding on a data sequence to be decoded according to the basis matrix used for LDPC coding.

The transport block size TBS is an element in a TBS set TBSSet, wherein the TBS set comprises A1 TBS subsets $TBSsubset_i$, while the mother basic matrix set comprises A1 basic matrix subsets $Hb_i$, each of TBS subsets corresponding to one basic matrix subset; wherein A1 is an integer that is greater than 1, there is no intersection between each two subsets of the A1 TBS subsets, and all of A1 TBS subsets constitute a complete TBS set, where i is an integer between 0 and A1-1;

Determining the basic matrix used for LDPC coding from the mother basic matrix set comprises: determining the TBS subset $TBSsubset_i$ to which the transport block size TBS belongs, and then determining a basic matrix subset $Hb_i$ corresponding to the TBS subset $TBSsubset_i$.

And, a corresponding basic matrix is selected from the basic matrix subset $Hb_i$ corresponding to the TBS subset TBS subset$_i$ according to the actual code rate or a combination of the transport block size TBS and a LDPC codeword size. The actual code rate is indicated by the MCS index of the system, or indicated by CQI, or indicated by the system signaling; the block size TBS is a value jointly indicated by the TBS index and the number of resource units NRB, and the LDPC codeword size is calculated according to resource particles and modulation orders in the number of resource units NRB, which resource particle may be a subcarrier or other data carrying one constellation symbol, and which modulation order is an integer. For example, QPSK (Quadrature Phase Shift Keying) modulation is 2, 16QAM (Quadrature Amplitude Modulation) modulation is 4, 32QAM modulation is 5, 64QAM modulation is 6, 128QAM modulation is 7, 256QAM modulation is 8, 512QAM modulation is 9, and 1024QAM Modulation is 10.

The above embodiments are only used to illustrate the technical solutions of the present disclosure, and these solutions of the present disclosure is not limited thereto. Those skilled in the art can modify or replace technical solutions of the present disclosure without departing from the spirit and scope of the present disclosure, which should be as stated in the claims.

With description of the above embodiments, those skilled in the art can clearly understand that the method according to the above embodiments can be implemented by means of software plus a necessary general hardware platform, and of course, can be implemented by hardware. However, in many cases, the former is a better implementation. Based on such understanding, the technical solution of the present disclosure essentially (or the portion that contributes to the related art) may be embodied in the form of a software product stored in a storage medium (such as ROM/RAM, disk, CD-ROM), including several instructions for enabling a terminal device (which may be a cell phone, a computer, a server, or a network device, etc.) to perform the methods described in various embodiments of the present disclosure.

An embodiments of the present disclosure also provides a storage medium. Alternatively, in the embodiment, the storage medium may be configured to store program codes for performing the following steps:

S1, determining a basic matrix used for low density parity check LDPC coding from a mother basic matrix set, wherein the basic matrix used for LDPC coding comprises a first-type element corresponding to an all-zero square matrix and a second-type element corresponding to a matrix obtained by means of a cyclic shift of a unit matrix according to a value of the second-type element, and wherein dimensions of the all-zero square matrix and the unit matrix are equal;

S2: performing LDPC encoding on the coded information sequence according to the basic matrix used in the LDPC encoding, and/or perform LDPC decoding on the data sequence to be decoded according to the basic matrix used in the LDPC encoding.

Alternatively, in this embodiment, the storage medium may include, but not limited to, a USB flash drive, a Read-Only Memory (ROM), a Random Access Memory (RAM), a mobile hard disk, a diskette, a CD or various medium that can store program codes.

Alternatively, in this embodiment, the processor executes the method steps described in the foregoing embodiments according to the stored program code in the storage medium.

Alternatively, the specific examples in this embodiment may refer to the examples described in the foregoing embodiments and the alternative embodiments, details thereof will not be repeated.

It will be apparent to those skilled in the art that the various modules or steps of the present disclosure described above can be implemented by a general-purpose computing device. These modules or steps may be centralized on a single computing device or distributed across a network composed of multiple computing devices. Alternatively, they may be implemented by program codes executable by the computing device such that they may be stored in the storage device to execute by the computing device and, in some cases, may be different from the steps shown or described herein that are orderly performed, or they are separately fabricated into individual integrated circuit modules, or a plurality of modules or steps thereof are fabricated as a single integrated circuit module. As such, the present disclosure is not limited to any specific combination of hardware and software.

The present disclosure is not limited thereto, and those skilled in the art can easily conceive of changes or substitutions within the technical scope of the present disclosure. Those changes or substitutions should be covered within the scope of protection of the present disclosure. Therefore, the scope of protection of the present disclosure should be determined by the scope of the claims.

INDUSTRIAL APPLICABILITY

By the present disclosure: determining a basic matrix used for LDPC coding from a mother basic matrix set, wherein the basic matrix used for LDPC coding includes a first-type element corresponding to an all-zero square matrix and a second-type element corresponding to a matrix obtained by means of a cyclic shift of a unit matrix according to a value of the second-type element, and wherein dimensions of the all-zero square matrix and the unit matrix are equal; performing LDPC coding on an information sequence to be coded according to the basis matrix used for LDPC coding, and/or performing LDPC decoding on a data sequence to be decoded according to the basis matrix used for LDPC coding, so that LDPC coding and decoding may support a flexible code length and code rate to improve the flexibility of the LDPC coding and decoding process, thereby solving the problem in the related art that LDPC coding and decoding processes lack flexibility.

What is claimed is:

1. A quasi-cyclic LDPC coding and decoding method comprising:
    determining a basic matrix used for low density parity check LDPC coding from a mother basic matrix set, wherein the mother basic matrix set comprises a plurality of basic matrix subsets, wherein the basic matrix used for LDPC coding comprises a first-type element corresponding to an all-zero square matrix and a second-type element corresponding to a matrix obtained by means of a cyclic shift of a unit matrix according to a value of the second-type element, wherein dimensions of the all-zero square matrix and the unit matrix are equal, wherein the determining is based on a combination of a transport block size TBS and a code rate R, and wherein the transport block size is an integer that is greater than 0 and the code rate is a real number that is greater than 0 and less than 1; and
    performing LDPC coding on an information sequence to be coded according to the basic matrix used for LDPC coding, and/or performing LDPC decoding on a data sequence to be decoded according to the basic matrix used for LDPC coding.

2. The method according to claim 1, wherein determining the basic matrix used for LDPC coding from the mother basic matrix set comprises:
    determining the basic matrix used for LDPC coding according to a preset parameter, wherein the preset parameter comprises at least one of the followings: the transport block size TBS, an application scenario, a user UE type, a frequency band, the code rate R, a channel type, a data transmission direction, a combination of a TBS index number and a number of resource units NRB, a combination of a modulation and coding scheme MCS index number and the number of resource units NRB, a combination of the code rate R and the number of resource units NRB, a bandwidth size;
    wherein the application scenario comprises an enhanced mobile broadband eMBB, an ultra-high reliability and low latency communication URLLC and a massive machine type communication mMTC; the frequency band comprises a system-configured frequency range; the channel type comprises a control channel and a data channel; the data transmission direction comprises an uplink data and a downlink data; the TBS index number is used to indicate a corresponding transport block size TBS in combination with the number of resource units, and the TBS index number is an integer that is greater than or equal to 0; the MCS index number is used to indicate an MCS scheme or a combination of a modulation order and a TBS index, and the MCS index number is an integer that is greater than or equal to 0; the number of resource units NRB is the number of system-configured resource blocks; and the bandwidth size is a real number which is greater than 0.

3. The method according to claim 1, wherein the plurality of basic matrix subsets comprises A4 basic matrix subsets, and a dimension of the $i^{th}$ basic matrix subset of the A4 basic matrix subsets respectively presents a matrix column number of NBi, a matrix row number of MBi, and a matrix system column number of KBi, where i=0, 1, ..., (A4−1), and wherein MBi is an integer greater than 0, NBi is an integer greater than MBi, KBi=NBi−MBi, and A4 is an integer greater than 1.

4. The method according to claim 3, wherein as A4=1, a row index set Rowset composed of all row indices of the basic matrix subset comprises a first row index set RowsetX and a second row index set RowsetY, where j and k are any two elements in the first row index set, and the $j^{th}$ row and the $k^{th}$ row of the basic matrix subset are orthogonal; there is no intersection between the first row index set RowsetX and the second row index set RowsetY, two subsets are not empty, and both the first row index set RowsetX and the second row index set RowsetY are subsets of Rowset; and the $j^{th}$ row and the $k^{th}$ row are orthogonal, so that there is at most one second-type element in any two elements on any column index in the $j^{th}$ row and the $k^{th}$ row.

5. The method according to claim 3, wherein, in any one of basic matrix subsets of the A4 basic matrices, the number of matrix columns having a column weight greater than 1 is a positive integer that is greater than $2^5-10$ and less than $2^5$.

6. The method according to claim 2, wherein any continuous L1 lines from a $L0^{th}$ row to the last line in any one of basic matrix subsets of the mother basic matrix set are orthogonal, orthogonality of the L1 lines is that there is at most one second-type element value in L1 element values of any column index in L1 lines, where L0 is an integer that is greater than or equal to 0 and less than 5, and L1 is an integer that is greater than 0 and less than 5.

7. The method according to claim 1, wherein a bipartite graph corresponding to the parity check matrix of any one of basic matrix subsets in the mother basic matrix set at least has a short circle with a girth of 4; a code length corresponding to $i^{th}$ basic matrix of the basic matrix subset is Ni, the number of variable nodes with a girth of 4 corresponding to the code length of Ni is Bi, and the number of variable nodes with a girth of 6 corresponding to the code length of Ni is Ci, where i=0,1, ..., (s−1), wherein the code length has the following relationship of N0<=N1<= ... <=N(s−1), then B0>=B1>= ... >=B(s−1) and C0<=C1<= ... <=C(s−1); wherein B0, B1, ..., B(s−1), C0, C1, ..., C(s−1) and N0, N1, ..., N(s−1) are integers that are greater than 1, and s is an integer that is greater than or equal to 3.

8. The method according to claim 1, wherein a bipartite graph of the parity check matrix of any one of basic matrix subsets in the mother basic matrix set has at least a short circle with a girth of 6 and does not have a short circle with a girth of 4, a code length corresponding to $i^{th}$ basic matrix of the basic matrix subset is Ni, the number of variable nodes with a girth of 6 corresponding to the code length of Ni is Ci, and the number of variable nodes with a girth of 8 corresponding to the code length of Ni is Di, where i=0,1, ..., (s−1), wherein there is a relationship of N0<=N1<= ... <=N(s−1), then C0>=C1>= ... >=C(s−1), and D0<=D1<= ... <=D(s−1), and wherein C0, C1, ..., C(s−1), D0, D1, ..., D(s−1) and N0, N1, ..., N(s−1) are integers that are greater than 1, and s is an integer that is greater than or equal to 3.

9. The method according to claim 1, wherein any one basic matrix subset {Hbi} of the plurality of basic matrix subsets comprises s basic matrices, and all column indices of any one of basic matrices Hbi constitutes a column index set ColSet, wherein the column index set is divided into two subsets Colsubset1 and Colsubset2 which are complementary to each other, Colsubset1 comprises Ci elements, Colsubset2 comprises Di elements, where i is used to indicate one basic matrix Hbi corresponding to one specific code length, and an extension factor corresponding to Hbi is Zi, where i=0,1, ..., (s−1), s is an integer that is greater than or equal to 2, and Ci and Di are integers that are greater than or equal to 1.

10. The method according to claim 9, wherein a basic sub-matrix jointly indicated by all row indices of any one of the basic matrices Hbi and all column indices of Colsubset1 is Hbi(:,Colsubset1), a parity check matrix HL1i is obtained by matrix-extending in combination with the basic sub-matrix Hbi(:,Colsubset1) and an extension factor Zi, which parity check matrix HL1i has a girth of g; a basic sub-matrix jointly indicated by all row indices of the basic matrix Hbi and all column indices of Colsubset2 is Hbi(:,Colsubset2), a parity check matrix HL2i is obtained by matrix-extending in combination with the Hbi(:,Colsubset2) and a lift size Zi, which parity check matrix HL2i has a girth of g−2, all extension factors supported by the basic matrix subset present a relationship of Z1<=Z2<= ... <=Zs, then D1>=D2>= ... >=Ds, and C1<=C2<= ... <=Cs; where g is equal to 6 or 8.

11. A quasi-cyclic LDPC coding and decoding apparatus comprising:
a determination module configured for determining a basic matrix used for low density parity check LDPC coding from a mother basic matrix set, wherein the mother basic matrix set comprises a plurality of basic matrix subsets, wherein the basic matrix used for LDPC coding comprises a first-type element corresponding to an all-zero square matrix and a second-type element corresponding to a matrix obtained by means of a cyclic shift of a unit matrix according to a value of the second-type element, wherein dimensions of the all-zero square matrix and the unit matrix are equal, wherein the determining is based on a combination of a transport block size TBS and a code rate R, and wherein the transport block size is an integer that is greater than zero and the code rate is a real number that is greater than zero and less than one; and
a coding and decoding module configured for performing LDPC coding on an information sequence to be coded according to the basic matrix used for LDPC coding, and/or performing LDPC decoding on a data sequence to be decoded according to the basic matrix used for LDPC coding.

12. The apparatus according to claim 11, wherein the determination module is configured for:
determining the basic matrix used for LDPC coding according to a preset parameter, wherein the preset parameter comprises at least one of the followings: the transport block size TBS, an application scenario, a user UE type, a frequency band, the code rate R, a channel type, a data transmission direction, a combination of a TBS index number and a number of resource units NRB, a combination of a modulation and coding scheme MCS index number and the number of resource units NRB, a combination of the code rate R and the number of resource units NRB, a bandwidth size;

wherein the application scenario comprises an enhanced mobile broadband eMBB, an ultra-high reliability and low latency communication URLLC and a massive machine type communication mMTC; the frequency band comprises a system-configured frequency range; the channel type comprises a control channel and a data channel; the data transmission direction comprises an uplink data and a downlink data; the TBS index number is used to indicate a corresponding transport block size TBS in combination with the number of resource units, and the TBS index number is an integer that is greater than or equal to 0; the MCS index number is used to indicate an MCS scheme or a combination of a modulation order and a TBS index, and the MCS index number is an integer that is greater than or equal to 0; the number of resource units NRB is the number of system-configured resource blocks; and the bandwidth size is a real number which is greater than 0.

13. The apparatus according to claim 11, wherein the plurality of basic matrix subsets comprises A4 basic matrix subsets, and a dimension of the $i^{th}$ basic matrix subset of the A4 basic matrix subsets respectively presents a matrix column number of NBi, a matrix row number of MBi, and a matrix system column number of KBi, where i=0, 1, . . . , (A4−1), and wherein MBi is an integer greater than 0, NBi is an integer greater than MBi, where KBi=NBi−MBi, and A4 is an integer greater than 1.

14. The apparatus according to claim 13, wherein, in any one of basic matrix subsets of the A4 basic matrices, the number of matrix columns having a column weight greater than 1 is a positive integer that is greater than $2^5-10$ and less than $2^5$.

15. The apparatus according to claim 11, wherein a bipartite graph corresponding to the parity check matrix of any one of basic matrix subsets in the mother basic matrix set at least has a short circle with a girth of 4; a code length corresponding to $i^{th}$ basic matrix of the basic matrix subset is Ni, the number of variable nodes with a girth of 4 corresponding to the code length of Ni is Bi, and the number of variable nodes with a girth of 6 corresponding to the code length of Ni is Ci, where i=0,1, . . . , (s−1), wherein the code length has the following relationship of N0<=N1<= . . . <=N(s−1), then B0>=B1>= . . . >=B(s−1) and C0<= C1<= . . . <=C(s−1); wherein B0, B1, . . . , B(s−1), C0, C1, . . . , C(s−1) and N0, N1, . . . , N(s−1) are integers that are greater than 1, and s is an integer that is greater than or equal to 3.

16. The apparatus according to claim 11, wherein a bipartite graph of the parity check matrix of any one of basic matrix subsets in the mother basic matrix set has at least a short circle with a girth of 6 and does not have a short circle with a girth of 4, a code length corresponding to $i^{th}$ basic matrix of the basic matrix subset is Ni, the number of variable nodes with a girth of 6 corresponding to the code length of Ni is Ci, and the number of variable nodes with a girth of 8 corresponding to the code length of Ni is Di, where i=0,1, . . . , (s−1), wherein there is a relationship of N0<=N1<= . . . <=N(s−1), then C0>=C1>= . . . >=C(s−1), and D0<=D1<= . . . <=D(s−1), and wherein C0, C1, . . . , C(s−1), D0, D1, . . . , D(s−1) and N0, N1, . . . , N(s−1) are integers that are greater than 1, and s is an integer that is greater than or equal to 3.

17. The apparatus according to claim 16, wherein, in any one of basic matrix subset of the mother basic matrix set, a column weight of the basic matrix subset corresponding to the variable node with a girth of 8 is less than or equal to a column weight of the basic matrix subset corresponding to the variable node with a girth of 6.

18. The apparatus according to claim 11, wherein any one basic matrix subset {Hbi} of the plurality of basic matrix subsets comprises s basic matrices, and all column indices of any one of basic matrices Hbi constitutes a column index set ColSet, wherein the column index set is divided into two subsets Colsubset1 and Colsubset2 which are complementary to each other, Colsubset1 comprises Ci elements, Colsubset2 comprises Di elements, where i is used to indicate one basic matrix Hbi corresponding to one specific code length, and an extension factor corresponding to Hbi is Zi, where i=0,1, . . . , (s−1), s is an integer that is greater than or equal to 2, and Ci and Di are integers that are greater than or equal to 1.

19. The apparatus according to claim 18, wherein a basic sub-matrix jointly indicated by all row indices of any one of the basic matrices Hbi and all column indices of Colsubset1 is Hbi(:,Colsubset1), a parity check matrix HL1i is obtained by matrix-extending in combination with the basic sub-matrix Hbi(:,Colsubset1) and an extension factor Zi, which parity check matrix HL1i has a girth of g; a basic sub-matrix jointly indicated by all row indices of the basic matrix Hbi and all column indices of Colsubset2 is Hbi(:,Colsubset2), a parity check matrix HL2i is obtained by matrix-extending in combination with the Hbi(:,Colsubset2) and a lift size Zi, which parity check matrix HL2i has a girth of g−2, all extension factors supported by the basic matrix subset present a relationship of Z1<=Z2<= . . . <=Zs, then D1>=D2>= . . . >=Ds, and C1<=C2<= . . . <=Cs; where g is equal to 6 or 8.

20. The apparatus according to claim 18, wherein the column index set ColSet may also be divided into a third subset Colsubset3 and a fourth subset Colsubset4 which are complementary to each other, in which the Colsubset1 contains the Colsubset3, the Colsubset4 contains the Colsubset2, the Colsubset3 has Ei elements, and the Colsubset4 has Fi elements, where Ei and Fi are integers than are greater than or equal to 1, wherein any element k of the Colsubset2 and the Colsubset3 constitute a set Colsubset5, a basic sub-matrix jointly indicated by all row indices and all column indices of Colsubset5 is Hbi(:,Colsubset5), a parity check matrix HL3i is obtained by matrix-extending in combination with Hbi(:,Colsubset5) and the extension factor Zi, which parity check matrix HL3i has a girth of 6, where i=0,1, . . . , (s−1), and wherein all extension factors supported by the basic matrix subset present a relationship of Z1<=Z2<= . . . <=Zs, then F1>=F2>= . . . >=Fs, and E1<=E2<= . . . <=Es.

* * * * *